United States Patent
Jin et al.

(10) Patent No.: US 11,783,753 B2
(45) Date of Patent: Oct. 10, 2023

(54) SHIFT REGISTER CIRCUIT, DISPLAY PANEL AND DISPLAY DEVICE

(71) Applicant: Shanghai AVIC Optoelectronics Co., Ltd., Shanghai (CN)

(72) Inventors: Huijun Jin, Shanghai (CN); Wantong Shao, Shanghai (CN)

(73) Assignee: Shanghai AVIC Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 17/697,093

(22) Filed: Mar. 17, 2022

(65) Prior Publication Data
US 2022/0208072 A1    Jun. 30, 2022

(30) Foreign Application Priority Data

Dec. 9, 2021 (CN) .......................... 202111500865.0

(51) Int. Cl.
G09G 3/20 (2006.01)
G11C 19/28 (2006.01)
(52) U.S. Cl.
CPC ... G09G 3/2092 (2013.01); *G09G 2310/0267* (2013.01); *G09G 2310/0286* (2013.01); *G09G 2310/08* (2013.01); *G11C 19/28* (2013.01)
(58) Field of Classification Search
CPC ......... G09G 3/2092; G09G 2310/0267; G09G 2310/0286; G09G 2310/08; G09G 2300/026; G09G 2300/0413; G09G 2310/0221; G09G 2310/0232; G09G 2370/08; G09G 3/20; G11C 19/28
See application file for complete search history.

(56) References Cited

U.S. PATENT DOCUMENTS

| | | | | |
|---|---|---|---|---|
| 10,056,041 | B1* | 8/2018 | Ma ....................... | G09G 3/3266 |
| 2017/0154602 | A1* | 6/2017 | Sun ........................ | G09G 3/20 |
| 2018/0233209 | A1* | 8/2018 | Ma ....................... | H01L 27/1214 |
| 2019/0066597 | A1* | 2/2019 | Lan ...................... | G09G 3/3266 |
| 2019/0180834 | A1* | 6/2019 | Yuan .................... | G09G 3/3677 |
| 2020/0013473 | A1* | 1/2020 | Xuan ...................... | G09G 3/20 |
| 2020/0020291 | A1* | 1/2020 | Huang ................. | G09G 3/3266 |
| 2021/0201774 | A1* | 7/2021 | Feng .................... | G09G 3/3225 |
| 2021/0201807 | A1* | 7/2021 | Feng .................... | G09G 3/3266 |

(Continued)

FOREIGN PATENT DOCUMENTS

| | | |
|---|---|---|
| CN | 103680458 A | 3/2014 |
| CN | 104299583 A | 1/2015 |

(Continued)

*Primary Examiner* — Jose R Soto Lopez
(74) *Attorney, Agent, or Firm* — KDW Firm PLLC

(57) ABSTRACT

Provided are a shift register circuit, a display panel and a display device. The shift register circuit includes a plurality of cascaded shift register unit groups; each shift register unit group includes at least two shift register units; in each shift register unit group, the signal output terminal of each shift register unit in the shift register unit group of a previous stage is electrically connected with the scan control terminal of each shift register unit in the shift register unit group of a next stage; in the same shift register unit group, the pull-down control module of one shift register unit also serves as the pull-down control module of each of other shift register units, and the signal output terminal of each shift register unit sequentially outputs an enable level of the scan signal.

22 Claims, 42 Drawing Sheets

(56) References Cited

U.S. PATENT DOCUMENTS

| | | | | |
|---|---|---|---|---|
| 2022/0246101 A1* | 8/2022 | Long | .................... | G09G 3/3225 |
| 2022/0310021 A1* | 9/2022 | Feng | ...................... | G11C 19/28 |
| 2022/0319374 A1* | 10/2022 | Xu | ........................... | G09G 3/20 |
| 2022/0319434 A1* | 10/2022 | Yu | ........................... | G11C 19/28 |
| 2022/0343828 A1* | 10/2022 | Huang | ................ | G09G 3/2092 |
| 2022/0375395 A1* | 11/2022 | Zhao | .................... | G09G 3/3233 |
| 2022/0383822 A1* | 12/2022 | Shang | .................. | G09G 3/3677 |

FOREIGN PATENT DOCUMENTS

| | | | |
|---|---|---|---|
| CN | 108062938 A | 5/2018 |
| CN | 111462672 A | 7/2020 |
| CN | 112560647 A | 3/2021 |

* cited by examiner

SHIFT REGISTER CIRCUIT, DISPLAY PANEL AND DISPLAY DEVICE

CROSS-REFERENCE TO RELATED APPLICATION

This application claims priority to Chinese Patent Application No. 202111500865.0 filed Dec. 9, 2021, the disclosure of which is incorporated herein by reference in its entirety.

TECHNICAL FIELD

Embodiments of the present disclosure relate to display technologies, in particular, a shift register circuit, a display panel and a display device.

BACKGROUND

At present, the display panel is provided with a gate driving circuit in the non-display area, and the gate driving circuit can perform progressive scanning on display units in the display area of the display panel. However, the gate driving circuit in the related art has a complex structure and a large size, which is not beneficial to the implementation of the narrow bezel of the display panel.

SUMMARY

The present disclosure provides a shift register circuit, a display panel and a display device.

In a first aspect, an embodiment of the present disclosure provides a shift register circuit that includes multiple cascaded shift register units.

Each shift register unit group includes at least two shift register units, and each shift register unit includes a signal input terminal, a scan control terminal, a first level terminal, a clock signal terminal, a signal output terminal, an input module, an output module, a pull-down module and a pull-down control module.

In the same shift register unit, the input module is electrically connected with the signal input terminal, the scan control terminal and the output module respectively, and the input module and the output module are electrically connected with a first node. The output module is further electrically connected with the signal output terminal and the clock signal terminal respectively. The pull-down module is electrically connected with the first node, the first level terminal, the signal output terminal and the pull-down control module respectively, and the pull-down module and the pull-down control module are electrically connected with a second node. The pull-down control module is used for controlling the potential of the second node according to an input signal from the signal input terminal. The pull-down module is used for controlling a first level signal from the first level terminal to be transmitted to the first node and the signal output terminal according to the potential of the second node. The input module is used for controlling the input signal from the signal input terminal to be transmitted to the first node according to a scan control signal from the scan control terminal. The output module is used for controlling a clock signal from the clock signal terminal to be transmitted to the signal output terminal according to the potential of the first node.

In each shift register unit group, a signal output terminal of each shift register unit in a shift register unit group of a previous stage is electrically connected with a scan control terminal of each shift register unit in a shift register unit group of a next stage, and an enable level of a scan signal outputted from each shift register unit in the shift register unit group of the next stage is located after an enable level of a scan signal outputted from each shift register unit in the shift register unit group of the previous stage.

In the same shift register unit group, a pull-down control module of one shift register unit also serves as a pull-down control module of each of other shift register units, and a signal output terminal of each shift register unit sequentially outputs an enable level of a scan signal.

In a second aspect, an embodiment of the present disclosure further provides a display panel that includes the shift register circuit described above.

In a third aspect, an embodiment of the present disclosure further provides a display device that includes the display panel described above.

DETAILED DESCRIPTION

Figure 1:
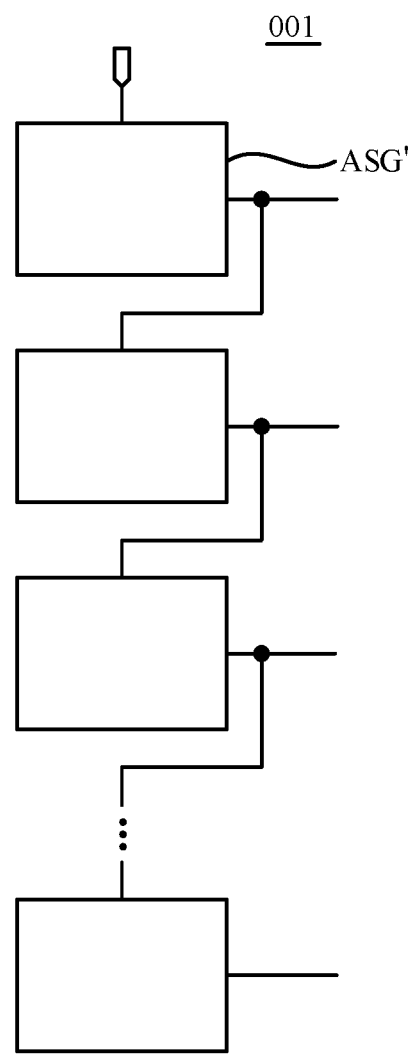
FIG. 1 is a structural schematic diagram of a shift register circuit in the related art.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

As described in BACKGROUND, in the related art, the shift register circuit generally includes cascaded shift register units, and each shift register unit is composed of an equal number of transistors and signal terminals. For example, FIG. 1 is a structural schematic diagram of a shift register circuit in the related art. As shown in FIG. 1, in the related art, the shift register circuit 001 includes N cascaded shift register units ASG', and each shift register unit ASG' may be composed of transistors, capacitors and other components. When each shift register unit ASG' includes p transistors and q capacitors, the shift register circuit includes p*N transistors and q*N capacitors. The more transistors and capacitors are included in the shift register circuit, the larger the size of the shift register circuit is, and thus the area that the shift register circuit occupies is larger. Generally, as a drive circuit in the display panel, the shift register circuit is arranged in the non-display area of the display panel, and at this point, the larger the size of the shift register circuit is, the larger the area of the non-display area of the display panel occupied by the shift register circuit, which is not beneficial to the implementation of the narrow bezel of the display panel and thus is not beneficial to the development requirements of the display panel with high screen-to-body ratio.

In order to solve the above-mentioned problems, an embodiment of the present disclosure provides a shift register circuit that includes multiple cascaded shift register unit groups. Each shift register unit group includes at least two shift register units, and each shift register unit includes a signal input terminal, a scan control terminal, a first level terminal, a clock signal terminal, a signal output terminal, an input module, an output module, a pull-down module and a pull-down control module. In the same shift register unit, the input module is electrically connected with the signal input terminal, the scan control terminal and the output module respectively, and the input module and the output module are electrically connected with a first node. The output module is further electrically connected with the signal output terminal and the clock signal terminal respectively. The pull-down module is electrically connected with the first node, the first level terminal, the signal output terminal and the pull-down control module respectively, and the pull-down module and the pull-down control module are electrically connected with a second node. The pull-down control module is used for controlling the potential of the second node according to an input signal from the signal input terminal. The pull-down module is used for controlling a first level signal from the first level terminal to be transmitted to the first node and the signal output terminal according to the potential of the second node. The input module is used for controlling the input signal from the signal input terminal to be transmitted to the first node according to a scan control signal from the scan control terminal. The output module is used for controlling a clock signal from the clock signal terminal to be transmitted to the signal output terminal according to the potential of the first node. In each shift register unit group, a signal output terminal of each shift register unit in a shift register unit group of a previous stage is electrically connected with a scan control terminal of each shift register unit in a shift register unit group of a next stage, and an enable level of a scan signal outputted from each shift register unit in the shift register unit group of the next stage is located after an enable level of a scan signal outputted from each shift register unit in the shift register unit group of the previous stage. In the same shift register unit group, a pull-down control module of one shift register unit also serves as a pull-down control module of each of other shift register units, and a signal output terminal from each shift register unit sequentially outputs an enable level of a scan signal.

Through the above-mentioned technical solution, shift register units in the shift register circuit are divided into multiple shift register unit groups, and in the same shift register unit group, a pull-down control module of one shift register unit also serves as a pull-down control module of each of other shift register units, so that each shift register unit group is required to be provided with only one pull-down control module. Compared with the case where each shift register unit is provided with a pull-down control module in the related art, in the embodiments of the present disclosure, the number of pull-down control modules provided in the shift register circuit can be reduced, thereby simplifying the structure of the shift register circuit and reducing the size of the shift register circuit. When the shift register circuit with a small size is applied to the display panel, it is beneficial to the implementation of the narrow bezel of the display panel and the improvement of the screen-to-body ratio of the display panel.

The above is the core idea of the present disclosure. Based on embodiments of the present disclosure, all other embodiments obtained by those skilled in the art without creative work are within the scope of the present disclosure. Technical solutions in embodiments of the present disclosure are described clearly and completely hereinafter in conjunction with the drawings in embodiments of the present disclosure.

Figure 2:
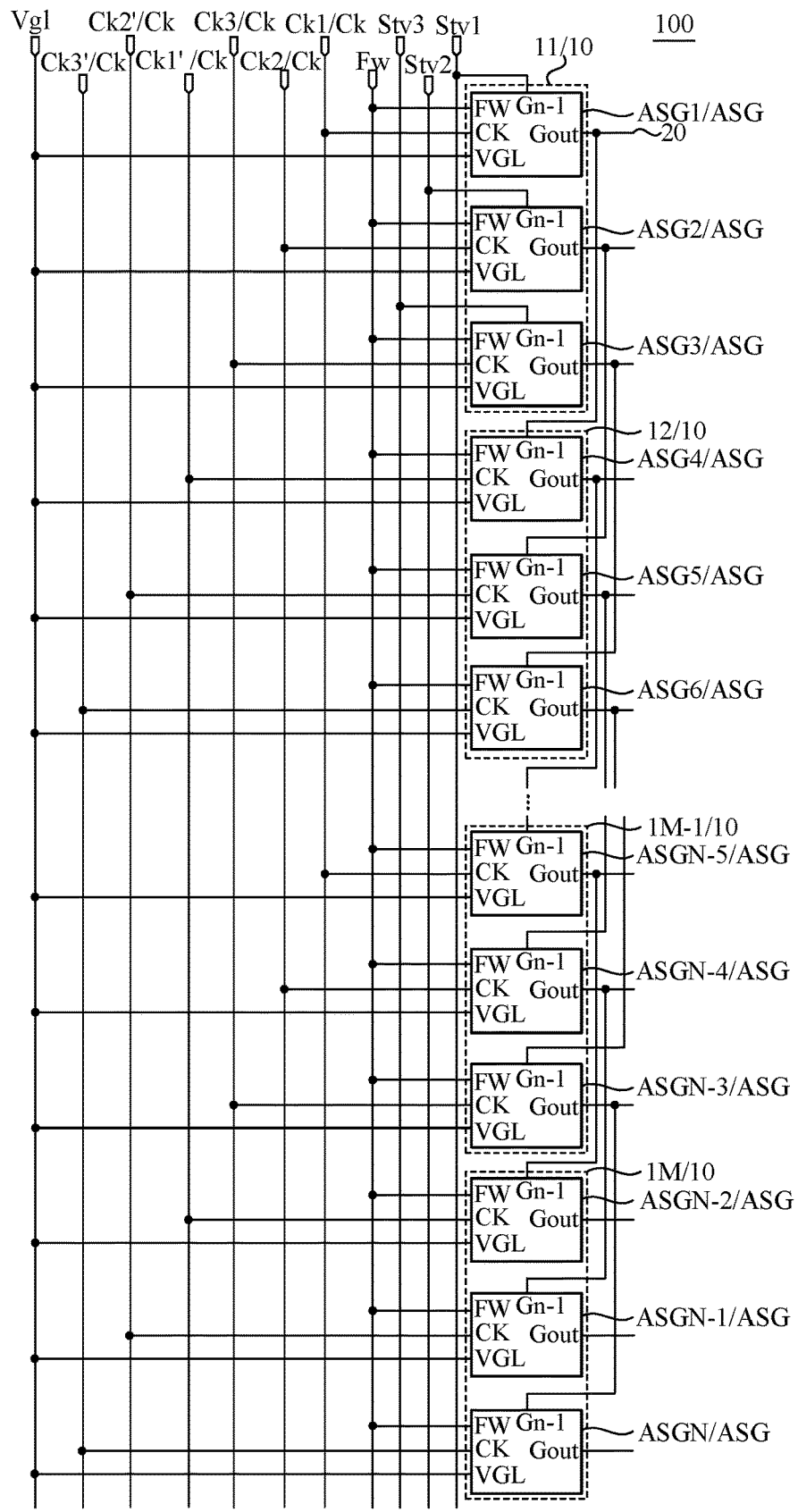
FIG. 2 is a structural schematic diagram of a shift register circuit according to an embodiment of the present disclosure.
Figure 3:
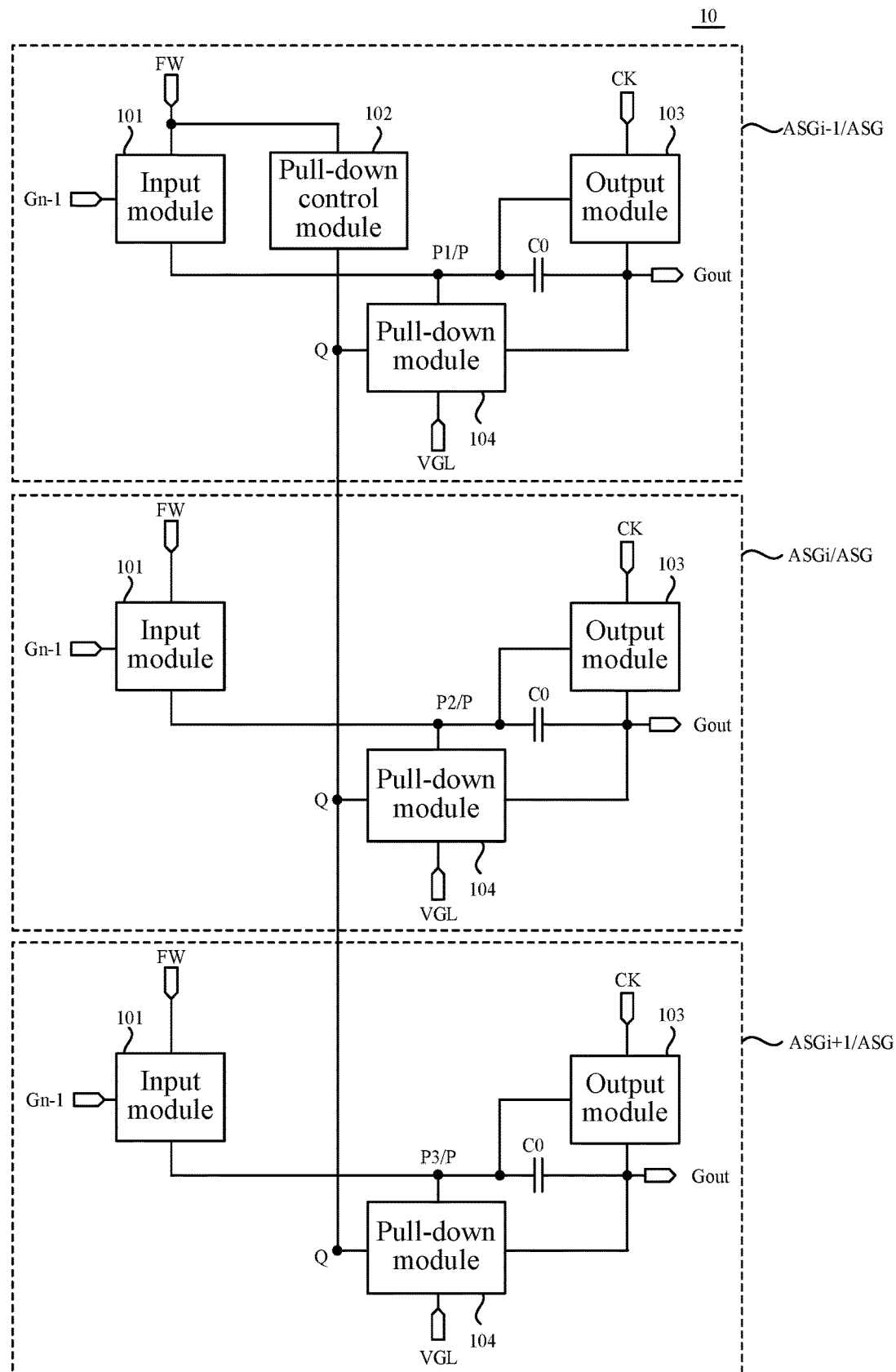
FIG. 3 is a structural schematic diagram of a shift register unit group according to an embodiment of the present disclosure.

FIG. 2 is a structural schematic diagram of a shift register circuit according to an embodiment of the present disclosure, and FIG. 3 is a structural schematic diagram of a shift register unit group according to an embodiment of the present disclosure. With reference to FIGS. 2 and 3, the shift register circuit 100 includes multiple cascaded shift register unit groups 10, each shift register unit group 10 may include at least two shift register units ASG, and a signal output terminal of each shift register unit ASG sequentially outputs an enable level of a scan signal. For example, each shift register unit group 10 may include three shift register units ASGi−1, ASGi and ASGi+1, and the shift register units ASGi−1, ASGi and ASGi+1 sequentially output the enable level of the scan signal.

Each shift register unit ASG may include a signal input terminal FW, a scan control terminal Gn−1, a first level terminal VGL, a clock signal terminal CK, a signal output terminal Gout, an input module 101, an output module 103, a pull-down module 102 and a pull-down control module 104. In the same shift register unit ASG, the input module 101 is electrically connected with the signal input terminal FW, the scan control terminal Gn−1 and the output module 103 respectively, and the input module 101 and the output module 103 are electrically connected with a first node P. The output module 103 is further electrically connected with the signal output terminal Gout and the clock signal terminal CK respectively. The pull-down module 104 is electrically connected with the first node P, the first level terminal VGL, the signal output terminal Gout and the pull-down control module 102 respectively, and the pull-down module 104 and the pull-down control module 102 are electrically connected with a second node Q. The pull-down control module 102 is used for controlling the potential of the second node Q according to an input signal Fw from the signal input terminal FW. The pull-down module 104 is used for controlling a first level signal Vgl from the first level terminal VGL to be transmitted to the first node P and the signal output terminal Gout according to the potential of the second node Q. The input module 101 is used for controlling the input signal Fw from the signal input terminal FW to be transmitted to the first node P according to a scan control signal Goutn−1 from the scan control terminal Gn−1. The output module 103 is used for controlling a clock signal Ck from the clock signal terminal CK to be transmitted to the signal output terminal Gout according to a potential of the first node P.

In an embodiment, when the pull-down control module 102 transmits the input signal Fw from the signal input terminal FW to the second node Q, the potential of the second node Q controls the pull-down module 104 to transmit the first level signal Vgl from the first level terminal VGL to the first node P and the signal output terminal GOUT. At this point, the potential of the first node P cannot control the output module 103 to be turned on, and the clock signal Ck from the clock signal terminal CK is incapable of being transmitted to the signal output terminal Gout, so that the shift register unit ASG is capable of using the first level signal Vgl as an output signal. When the scan control signal Goutn−1 from the scan control terminal Gn−1 controls the input module 101 to be turned on, the input signal Fw from the signal input terminal FW can be transmitted to the first node P through the input module 101, so that the potential of the first node P can control the output module 103 to be turned on, and the clock signal Ck from the clock signal terminal CK can be transmitted to the signal output terminal Gout through the output module 103, so that the shift register unit ASG can take the clock signal Ck as an output signal. In this manner, the output signal of the shift register unit ASG is related to the first level signal Vgl and the clock signal Ck.

When the shift register circuit 100 is applied to the display panel, the signal output terminals Gout of shift register units ASG of the shift register circuit are electrically connected with scan signal lines 20 of the display panel in one-to-one correspondence, and the signal output terminal Gout of each shift register unit ASG sequentially outputs the enable level of the scan signal Goutn to the respective one of the scan signal lines 20 to control the transistors in the display units in the display panel to be progressively turned on.

When the transistors in the display unit are all an N-type transistor, the enable level of the scan signal Goutn outputted from the signal output terminal Gout of the shift register unit ASG is a high level, and when the transistor in the display unit is a P-type transistor, the enable level of the scan signal Goutn outputted from the signal output terminal Gout of the shift register unit ASG is a low level. For ease of description, the embodiments of the present disclosure are all illustrated by using an example in which the enable level of the scan signal is a high level to illustratively describe the technical solutions of the embodiments of the present disclosure.

With continued reference to FIGS. 2 and 3, in each shift register unit group 10, a signal output terminal Gout of each shift register unit ASG in a shift register unit group (11) of a previous stage is electrically connected with a scan control terminal Gn−1 of each shift register unit ASG in a shift register unit group (12) of a next stage, and enable levels of scan signals (Gout4, Gout5, and Gout6) outputted from shift register units ASG in the shift register unit group (12) of the next stage are located after enable levels of scan signals (Gout1, Gout2, and Gout3) outputted from shift register units ASG in the shift register unit group (12) of the pervious stage.

Figure 4:
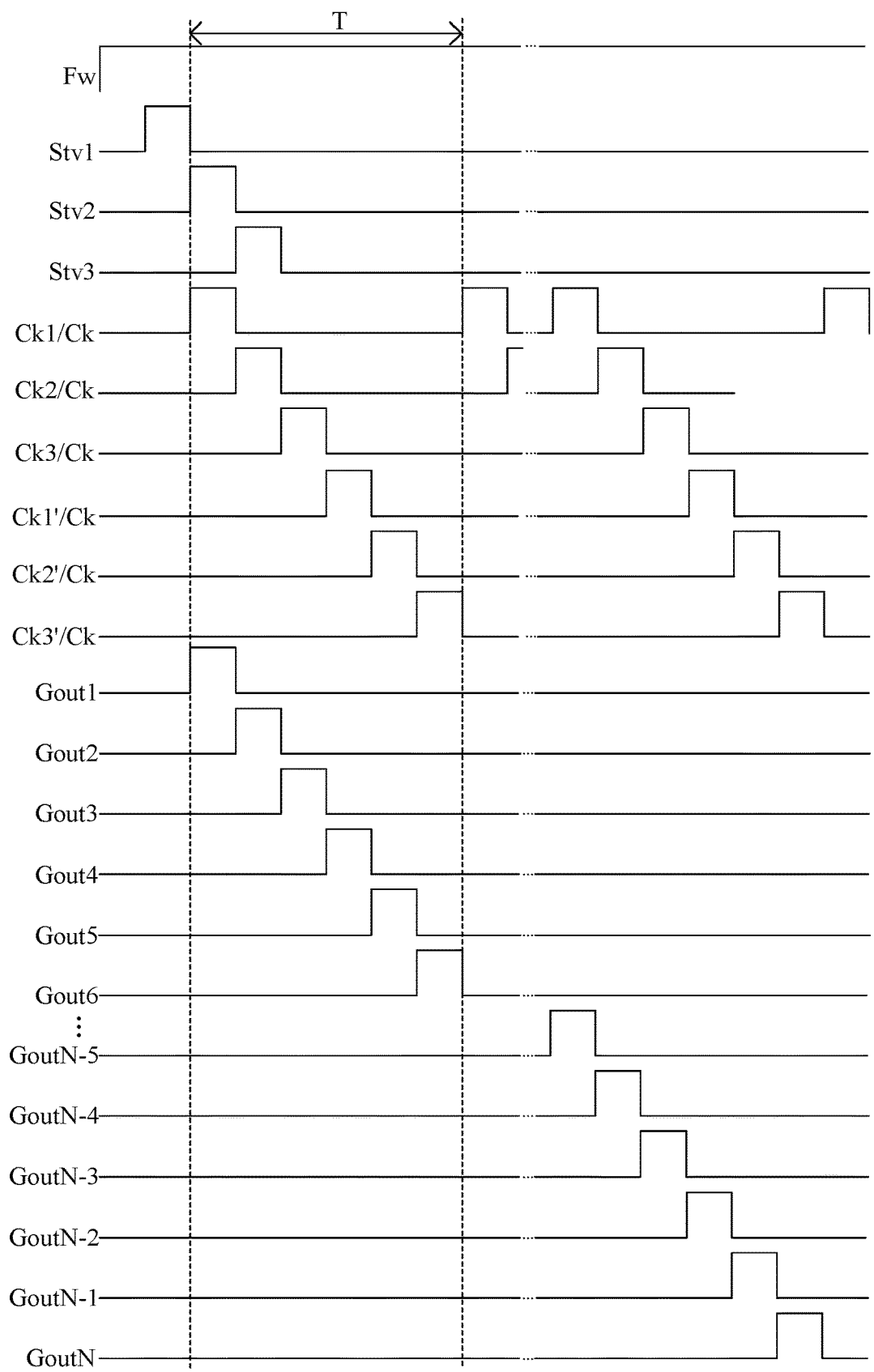
FIG. 4 is a drive timing diagram of a shift register circuit according to an embodiment of the present disclosure.

In an embodiment, FIG. 4 is a drive timing diagram of a shift register circuit according to an embodiment of the present disclosure. With reference to FIGS. 2, 3 and 4, that the shift register circuit 100 includes M shift register unit groups 10 and N shift register units, and each shift register unit group includes 3 shift register units ASG is taken as an example. The scan control terminals Gn−1 of the shift register units ASG1, ASG2 and ASG3 of the shift register unit group 11 of a first stage receive different start signals Stv1, Stv2 and Stv3, respectively. The signal output terminals Gout of shift register units ASG1, ASG2 and ASG3 of the shift register unit group 11 of the first stage are electrically connected with the scan control terminals Gn−1 of stage shift register units ASG4, ASG5 and ASG6 of the shift register unit group 12 of a second stage in one-to-one correspondence. In other words, the signal output terminal Gout of the shift register unit ASG1 is electrically connected with the scan control terminal Gn−1 of the shift register unit ASG4, the signal output terminal Gout of the shift register unit ASG2 is electrically connected with the scan control terminal Gn−1 of the shift register unit ASG5, and the signal output terminal Gout of the shift register unit ASG3 is electrically connected with the scan control terminal Gn−1 of the shift register unit ASG6. By analogy, the signal output terminals Gout of shift register units ASGN−5, ASGN−4 and ASGN−3 of the shift register unit group 1M−1 of an $(M-1)^{th}$ stage are electrically connected with the scan control terminals Gn−1 of shift register units ASGN−2, ASGN−1 and ASGN of the shift register unit group 1M of an $M^{th}$ stage in one-to-one correspondence. In other words, the signal output terminal Gout of the shift register unit ASGN−5 is electrically connected with the scan control terminal Gn−1 of the shift register unit ASGN−2, the signal output terminal Gout of the shift register unit ASGN−4 is electrically connected with the scan control terminal Gn−1 of the shift register unit ASGN−1, and the signal output terminal Gout of the shift register unit ASGN−3 is electrically connected with the scan control terminal Gn−1 of the shift register unit ASGN. At this point, under the control of start signals Stv1, Stv2 and Stv3, the signal output terminal Gout of each of shift register units ASG1, ASG2 and ASG3 of the shift register unit group 11 of the first stage sequentially outputs an enable level of a scan signal. After each of shift register units ASG1, ASG2 and ASG3 in the shift register unit group 11 of the first stage outputs the enable level of the scan signal, under the control of the scan signal outputted from the signal output terminal Gout of each of shift registers ASG1, ASG2 and ASG3 of the shift register unit group 11 of the first stage, each of shift register units ASG4, ASG5 and ASG6 of the shift register unit group 12 of the second stage is capable of outputting an enable level of a scan signal respectively. By analogy, after each of shift register units ASGN−5, ASGN−4 and ASGN−3 in the shift register unit group 1M−1 of the $(M-1)^{th}$ stage outputs an enable level of a scan signal, under the control of the scan signal outputted from the signal output terminal Gout of each of shift register units ASGN−5, ASGN−4 and ASGN−3 in the shift register unit group 1M−1 of the $(M-1)^{th}$ stage, each of shift register units ASGN−2, ASGN−1 and ASGN in the shift register unit group 1M of the $M^{th}$ stage is capable of outputting an enable level of a scan signal respectively. In this manner, each shift register unit ASG of the shift register circuit 100 is capable of sequentially outputting an enable level of a scan signal.

Accordingly, when the shift register circuit 100 is provided in the non-display area of the display panel, if the shift register circuit 100 includes 3*M shift register units ASG and each shift register unit ASG includes a signal input terminal FW, a scan control terminal Gn−1, a first level terminal VGL, a clock signal terminal CK, a signal output terminal Gout, an input module 101, an output module 103, a pull-down module 102 and a pull-down control module 104, the non-display area of the display panel is required to be provided with 3*M signal input terminals FW, 3*M scan control terminals Gn−1, 3*M first level terminals VGL, 3*M clock signal terminals CK, 3*M signal output terminals Gout, 3*M input modules 101, 3*M output modules 103, 3*M pull-down modules 102 and 3*M pull-down control modules 104. At this point, the shift register circuit 100 has a large size and occupies a large area in the non-display area of the display panel, which is not beneficial to the implementation of the narrow bezel of the display panel.

With continued reference to FIG. 3, in the shift register unit ASG, only under the control of the potential of the first node P can the output module 103 control the clock signal from the clock signal terminal CK to be transmitted to the signal output terminal Gout of the shift register unit ASG. Only when the input module 101 transmits the input signal Fw from the signal input terminal FW to the first node P or the pull-down module 104 transmits the first level signal Vgl from the first level terminal VGL to the first node P can the potential of the first node P be changed. Therefore, in the same shift register unit group 10, the pull-down control module 102 of one shift register unit ASGi−1 may also serve as the pull-down control module 102 of each of other shift register units ASG (ASGi and ASGi+1). At this point, the pull-down modules 104 in the shift register units ASGi−1, ASGi and ASGi+1 and the pull-down control module 102 of the shift register unit ASGi−1 are all electrically connected with the second node Q. In this manner, when the pull-down control module 102 of the shift register unit ASGi−1 transmits the input signal Fw from the signal input terminal FW to the second node Q of each of shift register units ASGi−1, ASGi and ASGi+1, the pull-down module 104 of each of shift register units ASGi−1, ASGi and ASGi+1 is capable of simultaneously being controlled to transmit the first level signal Vgl from the first level terminal VGL to the respective first node P of each of shift register units ASGi−1, ASGi and ASGi+1. When the pull-down control module 102 of each of shift register units ASGi−1, ASGi and ASGi+1 stops supplying the input signal Fw to the second node Q of each of shift register units ASGi−1, ASGi and ASGi+1, the second node Q of each of shift register units ASGi−1, ASGi and ASGi+1 is incapable of controlling the respective pull-down module 104 of each of shift register units ASGi−1, ASGi and ASGi+1 to transmit the first level signal Vgl to the respective first node P of each of shift register units ASGi−1, ASGi and ASGi+1. At this point, the first node P of each of shift register units ASGi−1, ASGi and ASGi+1 is maintained as the first level signal Vgl, and the potential of the first node P of each of shift register units ASGi−1, ASGi and ASGi+1 is incapable of being changed until the scan control signal Goutn−1 from the scan control terminal Gn−1 of each of shift register units ASGi−1, ASGi and ASGi+1 controls the respective input module 101 of each of shift register units ASGi−1, ASGi and ASGi+1 to transmit the input signal from the input signal terminal FW of each of shift register units ASGi−1, ASGi and ASGi+1 to the respective first node P of each of shift register units ASGi−1, ASGi and ASGi+1. Therefore, when each of shift register units ASGi−1, ASGi and ASGi+1 in the same shift register unit group 10 also serves as the same pull-down control module 102, as long as the input module 101 of each of shift register units ASGi−1, ASGi and ASGi+1 in the same shift register unit group 10 is controlled to sequentially transmit the input signal Fw from the respective input signal terminal FW of each of shift register units ASGi−1, ASGi and ASGi+1, it can be ensured that the potential of the first node P of each of shift register units ASGi−1, ASGi and ASGi+1 in the same shift register unit group 10 is capable of sequentially controlling the respective output module 103 of each of shift register units ASGi−1, ASGi and ASGi+1 to sequentially transmit the clock signal Ck from the clock signal terminal CK. In this manner, in the same shift register unit group 10, the enable level of the scan signal Gouti−1 outputted from the shift register unit ASGi−1, the enable level of the scan signal Gouti outputted from the shift register unit ASGi, and the enable level of the scan signal Gouti+1 outputted from the shift register unit ASGi+1 are sequentially shifted, where i is 2, 5, . . . , N−4, and N−2, and N and M are both positive integers.

In the embodiments of the present disclosure, on the premise that it can be ensured that each shift register unit of the shift register circuit sequentially outputs the enable level of the scan signal, each shift register unit group is only required to be provided with one pull-down control module by enabling the pull-down control module of one shift register unit in the same shift register unit group to also serve as the pull-down control module of each of other shift register units. Compared with the case where each shift register unit is provided with a pull-down control module in the related art, in the present disclosure, the number of pull-down control modules provided in the shift register circuit can be reduced, thereby simplifying the structure of the shift register circuit and reducing the size of the shift register circuit. When the shift register circuit with a small size is applied to the display panel, it is beneficial to the implementation of the narrow bezel of the display panel and the improvement of the screen-to-body ratio of the display panel.

Figure 5:
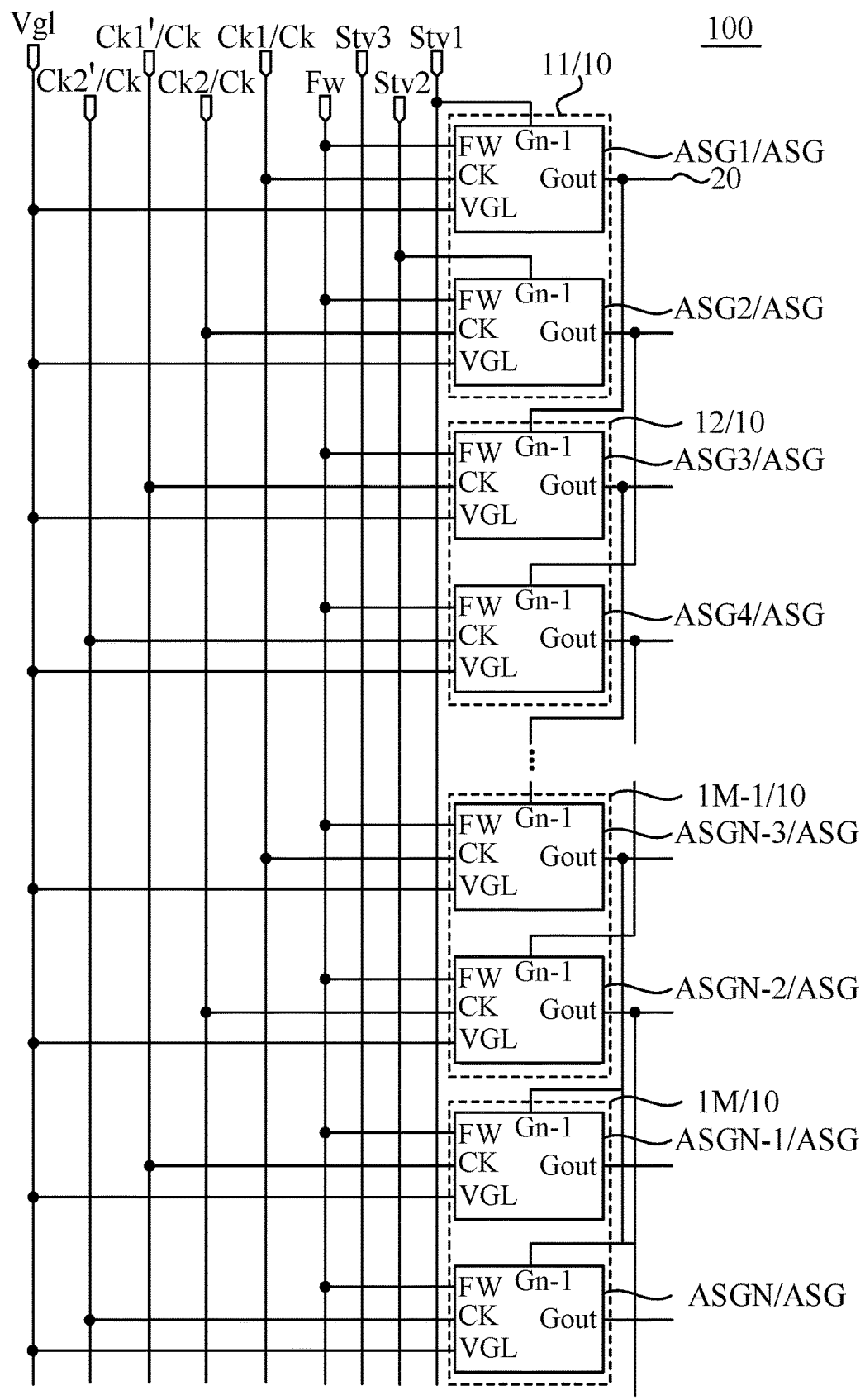
FIG. 5 is a structural schematic diagram of another shift register circuit according to an embodiment of the present disclosure.

It is to be noted that FIGS. 2 and 3 are illustrative drawings of the embodiments of the present disclosure. FIGS. 2 and 3 illustratively show that each shift register unit group 10 includes three shift register units ASG, and in the embodiments of the present disclosure, each shift register unit group 10 may include two (as shown in FIG. 5) or more shift register units ASG. On the premise that the core inventive point of the embodiments of the present disclosure can be implemented, the number of shift register units ASG provided in each shift register unit group 10 is not specifically limited to the embodiments of the present disclosure. For ease of description, the embodiments of the present disclosure are all illustrated by using an example in which each shift register unit group includes three shift register units to illustratively describe the technical solutions of the embodiments of the present disclosure.

It is to be noted that FIG. 3 illustrates that in the same shift register unit group 10, the pull-down control module 102 is located in the shift register unit ASGi−1. In an embodiment, the pull-down control module 102 may be located in any other shift register unit in the same shift register unit group 10, such as the shift register unit ASGi or the shift register unit ASGi+1. On the premise of satisfying the connection mode of each module, those skilled in the art can arbitrarily set the location of the pull-down control module 102 according to the actual requirements.

In an embodiment, with continued reference to FIGS. 2 and 4, in a clock period T, in the same shift register unit group 10, the enable level of the clock signal Ck from a clock signal terminal CK of each shift register unit ASG is sequentially shifted. At this point, the clock signal terminal of each shift register unit ASG in the same shift register unit group 10 receive different clock signals, and the clock signal received at the clock signal terminal of each shift register unit ASG of a shift register unit group 10 of an odd-numbered stage is different from the clock signal received at the clock signal terminal of each shift register unit ASG of the shift register unit group 10 of an even-numbered stage.

In an embodiment, each shift register unit group 10 includes three shift register units ASG, and the number M of shift register unit groups in the shift register circuit is even. In a shift register unit group 11 (1M−1) of an odd-numbered stage, the clock signal terminal CK of the shift register unit ASG1 (ASGN−5) receives a clock signal Ck1, the clock signal terminal CK of the shift register unit ASG2 (ASGN−4) receives a clock signal Ck2, the clock signal terminal CK of the shift register unit ASG3 (ASGN−3) receives a clock signal Ck3, and enable levels of the clock signals Ck1, Ck2 and Ck3 are sequentially shifted. In a shift register unit group 12 (1M) of an even-numbered stage, the clock signal terminal CK of the shift register unit ASG4 (ASGN−2) receives a clock signal Ck1', the clock signal terminal CK of the shift register unit ASG5 (ASGN−1) receives a clock signal Ck2', the clock signal terminal CK of the shift register unit ASG6 (ASGN) receives a clock signal Ck3', and the enable levels of the clock signals Ck1', Ck2' and Ck3' are sequentially shifted. The clock period is a time period from the start time of one pulse signal of the clock signal Ck1 to the start time of the next pulse signal of the clock signal Ck1, and the enable levels of the clock signals Ck1, Ck2, Ck3, Ck1', Ck2' and Ck3' are sequentially shifted in one clock period to ensure that the scan signal (Gout1, Gout, Gout3, Gout4, Gout5, Gout6, . . . , GoutN−5, GoutN−4, GoutN−3, GoutN−2, GoutN−1, and GoutN−1) outputted from each shift register unit ASG (ASG1, ASG2, ASG3, ASG4, ASG5, ASG6, ASGN−5, ASGN−4, ASGN−3, ASGN−2, ASGN−1, and ASGN) in the shift register circuit 100 are sequentially shifted.

With reference to FIGS. 3 and 4, with a shift register unit group 10 of an odd stage as an example, when the first level signal Vgl from the first level terminal VGL is at a disable level, the enable level of the scan signal outputted from the signal output terminal Gout of each shift register unit ASG is determined by the clock signal Ck from the clock signal terminal CK of each shift register unit ASG. Since the pull-down control module 102 of the shift register unit ASGi−1 of the same shift register unit group 10 also serves as the pull-down control module 102 of each of the other shift register units ASGi and ASGi+1, the pull-down control module 102 of the shift register unit ASGi−1 is capable of simultaneously controlling the potential of the second node Q of each of the shift register units ASGi−1, ASGi and ASGi+1 so that it can be controlled whether the pull-down module 104 of each of shift register units ASGi−1, ASGi and ASGi+1 transmits the first level signal Vgl from the first level terminal VGL to the respective first node P of each of shift register units ASGi−1, ASGi and ASGi+1. Therefore, before each of shift register units ASGi−1, ASGi and ASGi+1 of the shift register unit group 10 outputs the enable level of the scan signal, the pull-down control module 102 of the shift register unit ASGi−1 is capable of being controlled to transmit the input signal Fw from the signal input terminal FW to the second node Q of the shift register unit ASGi−1, the second node Q of the shift register unit ASGi and the second node Q of the shift register unit ASGi+1 respectively, so that the second node Q of the shift register unit ASGi−1 controls the pull-down module 104 of the shift register unit ASGi−1 to transmit the first level signal Vgl to the first node P1 of the shift register unit ASGi−1, the second node Q of the shift register unit ASGi controls the pull-down module 104 of the shift register unit ASGi to transmit the first level signal Vgl to the first node P2 of the shift register unit ASGi, and the second node Q of the shift register unit ASGi+1 controls the pull-down module 104 of the shift register unit ASGi+1 to transmit the first level signal Vgl to the first node P3 of the shift register unit ASGi+1, where the first nodes P1, P2 and P3 of each of shift register units ASGi−1, ASGi and ASGi+1 are all at a disable level. When the scan control signal received by the scan control terminal Gn−1 of the shift register unit ASGi−1 is sufficient to control the input module 101 of the shift register unit ASGi−1 to be turned on, the pull-down control module 102 of the shift register unit ASGi−1 no longer controls the input signal Fw from the signal input terminal FW to be transmitted to the second node Q so that the pull-down module 104 of each of shift register units ASGi−1, ASGi and ASGi+1 no longer transmits the first level signal Vgl to the respective first node P of each of shift register units ASGi−1, ASGi and ASGi+1; at this point, the input module 101 of the shift register unit ASGi−1 transmits the input signal Fw from the signal input terminal FW of the shift register unit ASGi−1 to the first node P1 of the shift register unit ASGi−1 to charge the first node P1 of shift register unit ASGi−1, and since the input modules 101 of other shift registers ASGi and ASGi+1 have not charged their respective first nodes P2 and P3, the first node P2 of the shift register ASGi and the first node P3 of the shift register ASGi+1 remain at a disable level. After the input module 101 of the shift register unit ASGi−1 completes the charging of the first node P1, the output module 103 of the shift register unit ASGi−1 transmits the enable level of the clock signal Ck1 from the clock signal terminal CK of the shift register unit ASGi−1 to the signal output terminal Gout of the shift register unit ASGi−1 so that the signal output terminal Gout of the shift register unit ASGi−1 outputs the enable level of the scan signal Gouti−1; at this point, the scan control signal from the scan control terminal Gn−1 of the shift register unit ASGi is capable of controlling the input module 101 of the shift register unit ASGi to be turned on so that the input module 101 of the shift register unit ASGi transmits the input signal Fw from the signal input terminal FW of the shift register unit ASGi to the first node P2 of the shift register unit ASGi to charge the first node P2 of the shift register unit ASGi and the first node P3 of the shift register unit ASGi+1 remains at a disable level. After the completion of the charging of the first node P2, the clock signal Ck1 from the clock signal terminal CK of the shift register unit ASGi−1 becomes at a disable level, and the clock signal Ck2 from the clock signal terminal CK of the shift register unit ASGi becomes at an enable level, so that the output module 103 of the shift register unit ASGi transmits the enable level of the clock signal Ck1 from the clock signal terminal CK of the shift register unit ASGi to the signal output terminal Gout of the shift register unit ASGi and the signal output terminal Gout of the shift register unit ASGi outputs the enable level of the scan signal Gouti; at this point, the scan control signal from the scan control terminal Gn−1 of the shift register unit ASGi+1 is capable of controlling the input module 101 of the shift register unit ASGi+1 to be turned on so that the input module 101 of the shift register unit ASGi+1 transmits the input signal Fw from the signal input terminal FW of the shift register unit ASGi+1 to the first node P3 of the shift register unit ASGi+1 to charge the first node P3 of the shift register unit ASGi+1. After the completion of the charging of the first node P3, the clock signal Ck1 from the clock signal terminal CK of the shift register unit ASGi−1 and the clock signal Ck2 from the clock signal terminal CK of the shift register unit ASGi are both at a disable level, and the clock signal Ck3 from the clock signal terminal CK of the shift register unit ASGi+1 becomes at an enable level, so that the output module 103 of the shift register unit ASGi+1 transmits the enable level of the clock signal Ck3 from the clock signal terminal CK of the shift register unit ASGi+1 to the signal output terminal Gout of the shift register unit ASGi+1 and the signal output terminal Gout of the shift register unit ASGi+1 outputs the enable level of the scan signal Gouti+1.

In this manner, in a clock period T, by sequentially shifting the enable level of the clock signal Ck (Ck1, Ck2, Ck3, Ck1', Ck2', and Ck3') received at the clock signal terminal CK of each shift register unit ASG in the same shift register unit group 10, when each shift register unit ASG in the same shift register unit group 10 shares the pull-down control module 102, it can be ensured that each shift register unit ASG in the same shift register unit group 10 sequentially outputs the enable level of the scan signal, thereby ensuring the accuracy of the scan signal output by each shift register unit ASG in the shift register circuit 100 on the premise of reducing the size of the shift register circuit 100.

It is to be understood that the working principle of each shift register unit in the shift register unit group of the even-numbered stage is similar to the working principle of each shift register unit in the shift register unit group of the odd-numbered stage, and for the similarities between the working principles, reference may be made to the above description of the working principle of each shift register unit in the shift register unit group of the odd-numbered stage. For ease of description, unless otherwise specifically noted, in the following description of the working principle of the shift register unit group, the shift register unit group refers to the shift register unit group of the odd-numbered stage, that is, the following is described by using an example of the working principle of the shift register unit group of the odd-numbered stage to illustratively describe the technical solutions of the embodiments of the present disclosure.

Figure 6:
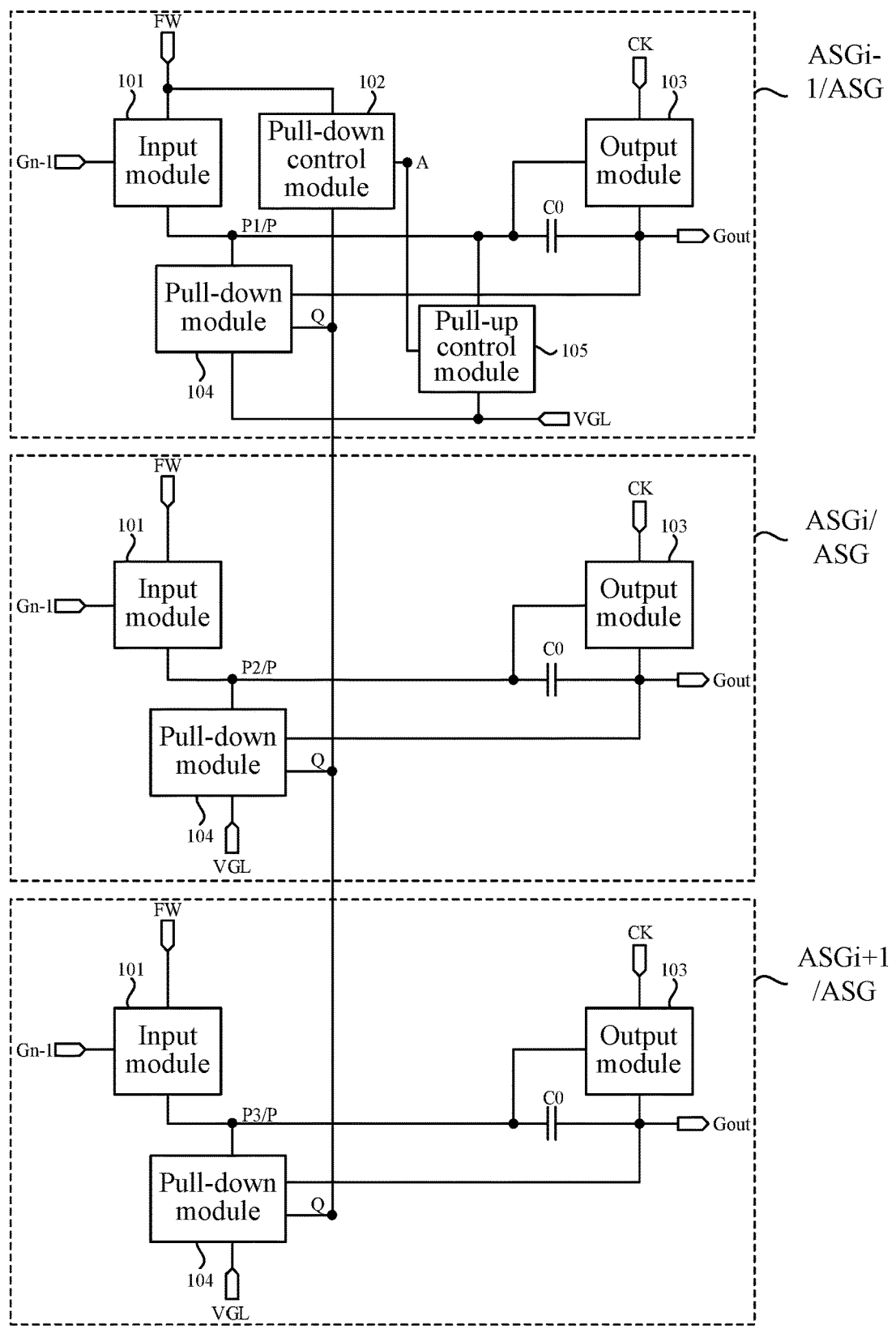
FIG. 6 is a structural schematic diagram of another shift register unit group according to an embodiment of the present disclosure.

In an embodiment, FIG. 6 is a structural schematic diagram of another shift register unit group according to an embodiment of the present disclosure. As shown in FIG. 6, in the shift register unit group 10, at least one shift register unit ASG further includes a pull-up control module 105. In this shift register unit ASG, the pull-up control module 105 is electrically connected with the first node P, the first level terminal VGL and the pull-down control module 102 respectively, and the pull-up control module 105 and the pull-down control module 102 are electrically connected with a third node A. The pull-up control module 105 is used for controlling the first level signal Vgl from the first level terminal VGL to be transmitted to the third node A according to the potential of the first node P. The pull-down control module 102 is further used for controlling a scan control signal Fw from the signal input terminal FW to be transmitted to the second node Q according to the potential of the third node A.

In an embodiment, the shift register unit ASGi−1 of the shift register unit group 10 is provided with the pull-up control module 105. When the input module 101 of the shift register unit ASGi−1 transmits the input signal Fw from the input signal terminal FW to the first node P1 of the shift register unit ASGi−1, the pull-up control module 105 is capable of being controlled to transmit the first level signal Vgl from the first level terminal VGL to the third node A to control the pull-down control module 102 to stop transmitting the input signal Fw from the signal input terminal FW to the second node Q of each of shift register units ASGi−1, ASGi and ASGi+1, so that it is ensured that the potential of the second node Q does not control the pull-down module 103 of each of shift register units ASGi−1, ASGi and ASGi+1 to transmit the first level signal Vgl from the first level terminal VGL to the respective first node P of each of shift register units ASGi−1, ASGi and ASGi+1. In this manner, it is ensured that the input module 101 of each of shift register units ASGi−1, ASGi and ASGi+1 can transmit the input signal Fw from the signal input terminal FW to the respective first node P (P1, P2, and P3) of each of shift register units ASGi−1, ASGi and ASGi+1 at the respective charging stage of each of shift register units ASGi−1, ASGi and ASGi+1, thereby ensuring the accuracy of the potential at the first node P (P1, P2, and P3) of each of shift register units ASGi−1, ASGi and ASGi+1 and further ensuring the accuracy of the scan signal outputted from the signal output terminal Gout of each of shift register units ASGi−1, ASGi and ASGi+1.

Figure 7:
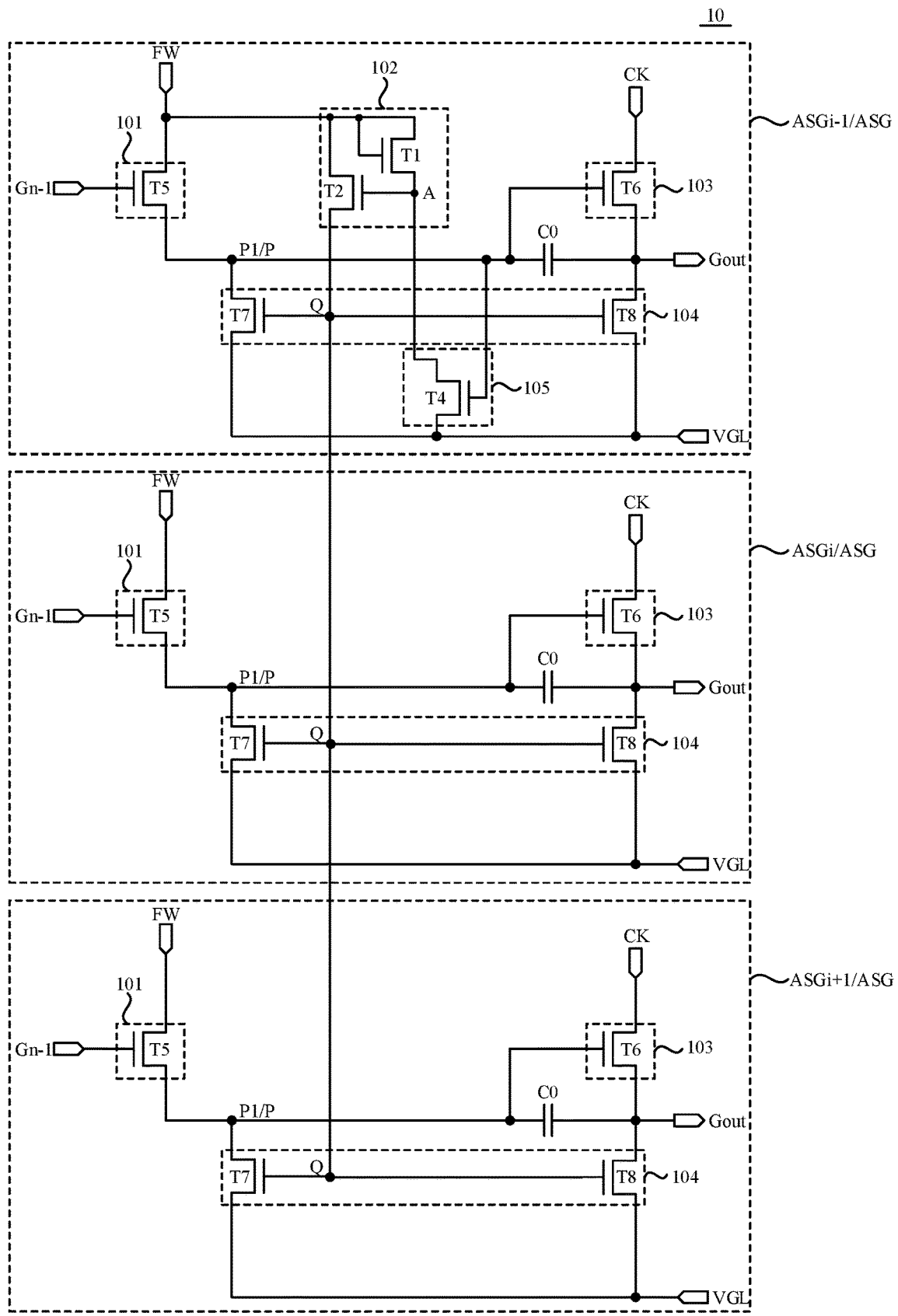
FIG. 7 is a structural schematic diagram of a circuit of a shift register unit group according to an embodiment of the present disclosure.

In an embodiment, FIG. 7 is a structural schematic diagram of a circuit of a shift register unit group according to an embodiment of the present disclosure. As shown in FIG. 7, the pull-up control module 105 may include a fourth transistor T4. In the shift register unit ASGi, the gate of the fourth transistor T4 is electrically connected with the first node P1, the first pole of the fourth transistor T4 is electrically connected with the first level terminal VGL, and the second pole of the fourth transistor T4 is electrically connected with the third node A. At this point, the potential of the first node P1 is capable of controlling the turn-on or turn-off of the fourth transistor T4. When the potential of the first node P1 controls the fourth transistor T4 to be turned on, the fourth transistor T4 is capable of transmitting the first level signal Vgl from the first level terminal VGL to the third node A so that the potential of the third node A controls the pull-down control module 102 to stop transmitting the input signal Fw from the signal input terminal FW to the second node Q. When the potential of the first node P1 controls the fourth transistor T4 to be turned off, the fourth transistor T4 is incapable of transmitting the first level signal Vgl from the first level terminal VGL to the third node A so that the pull-down control module 102 continuously transmits the input signal Fw from the signal input terminal FW to the second node Q.

It is to be understood that the fourth transistor T4 may be an N-type transistor or a P-type transistor. When the fourth transistor T4 is an N-type transistor, the fourth transistor T4 is capable of being turned on under the control of a high level at the first node P. When the fourth transistor T4 is a P-type transistor, the fourth transistor T4 is capable of being turned on under the control of a low level at the first node P. In this manner, when the fourth transistor T4 is an N-type transistor, the input signal Fw from the signal input terminal FW is at a high level so that when the input module 101 transmits the input signal Fw from the signal input terminal FW to the first node P, the fourth transistor T4 is capable of being controlled to be turned on and the fourth transistor T4 transmits the first level signal Vgl from the first level terminal VGL to the third node A. Similarly, when the fourth transistor T4 is a P-type transistor, the input signal Fw from the signal input terminal FW is at a low level so that when the input module 101 transmits the input signal Fw from the signal input terminal FW to the first node P, the fourth transistor T4 is capable of being controlled to be turned on and the fourth transistor T4 transmits the first level signal Vgl from the first level terminal VGL to the third node A.

Therefore, by providing the pull-up control module in one shift register unit in the same shift register unit group while providing no pull-up control module in other shift register units, compared with the case where each shift register unit of the shift register circuit is provided with a pull-up control module in the related art, the number of the pull-up control modules provided in the shift register circuit can be reduced, thereby reducing the size of the shift register circuit.

It is to be noted that FIGS. 6 and 7 are illustrative drawings of the embodiments of the present disclosure. FIGS. 6 and 7 illustratively show that one of the shift register units of each shift register unit group is provided with the pull-up control module while other shift register units are not provided with the pull-up control module, and in the embodiments of the present disclosure, the number of pull-up control modules in the shift register unit group may be less than or equal to the number of shift register units.

Figure 8:
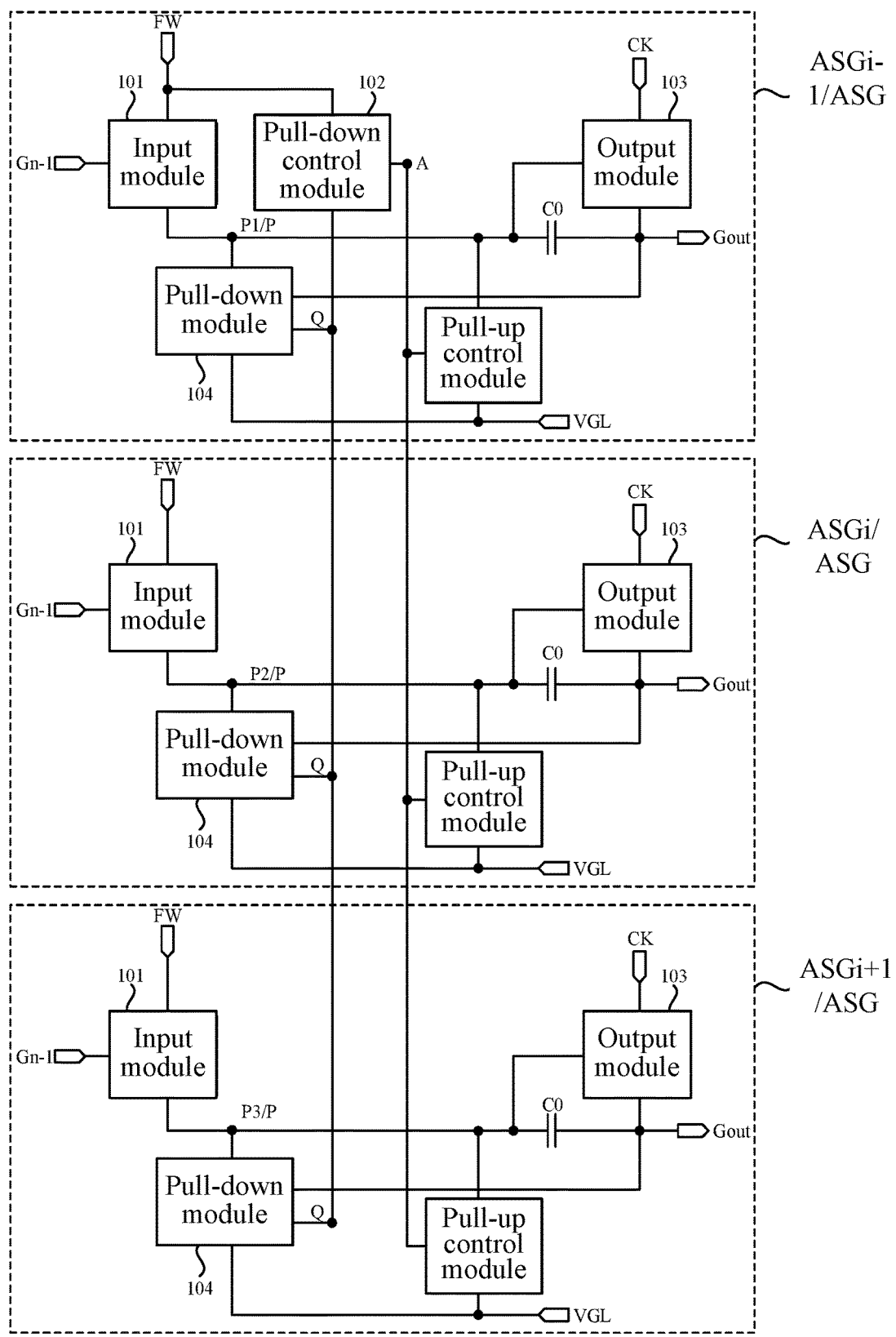
FIG. 8 is a structural schematic diagram of another shift register unit group according to an embodiment of the present disclosure.

In an embodiment, FIG. 8 is a structural schematic diagram of another shift register unit group according to an embodiment of the present disclosure. As shown in FIG. 8, all shift register units of the shift register unit group 10 include the pull-up control module 105.

In an embodiment, when the input module 101 of the shift register unit ASGi−1 transmits the input signal Fw from the input signal terminal FW to the first node P1 of the shift register unit ASGi−1, the pull-up control module 105 of the shift register unit ASGi−1 is capable of being controlled to transmit the first level signal Vgl from the first level terminal VGL of the shift register unit ASGi−1 to the third node A to control the pull-down control module 102 of the shift register unit ASGi−1 to stop transmitting the input signal Fw from the signal input terminal FW to the second node Q of each of shift register units ASGi−1, ASGi and ASGi+1. When the input module 101 of the shift register unit ASGi transmits the input signal Fw from the input signal terminal FW to the first node P2 of the shift register unit ASGi, the pull-up control module 105 of the shift register unit ASGi is capable of being controlled to transmit the first level signal Vgl from the first level terminal VGL to the third node A to control the pull-down control module 102 of the shift register unit ASGi−1 to stop transmitting the input signal Fw from the signal input terminal FW to the second node Q of each of shift register units ASGi−1, ASGi and ASGi+1. Similarly, when the input module 101 of the shift register unit ASGi+1 transmits the input signal Fw from the input signal terminal FW to the first node P3 of the shift register unit ASGi+1, the pull-up control module 105 of the shift register unit ASGi+1 is capable of being controlled to transmit the first level signal Vgl from the first level terminal VGL to the third node A to control the pull-down control module 102 of the shift register unit ASGi−1 to stop transmitting the input signal Fw from the signal input terminal FW to the second node Q of each of shift register units ASGi−1, ASGi and ASGi+1. In this manner, each shift register unit ASG of the same shift register unit group 10 is capable of independently controlling the pull-down control module 102 that is connected with the second node Q jointly with the shift register unit ASG to further ensure the stability of the potential of the second node Q, so that the potential of the first node P of each of shift register units ASGi−1, ASGi and ASGi+1 can restrain the potential of the respective second node Q of each of shift register units ASGi−1, ASGi and ASGi+1. Therefore, it is ensured that the input module 101 of each of shift register units ASGi−1, ASGi and ASGi+1 is capable of accurately transmitting the input signal Fw from the signal input terminal FW to the respective first node P (P1, P2, and P3) of each of shift register units ASGi−1, ASGi and ASGi+1 in the respective charging stage of each of shift register units ASGi−1, ASGi and ASGi+1, thereby improving the accuracy of the scan signal outputted from the signal output terminal Gout of each of shift register units ASGi−1, ASGi and ASGi+1.

Figure 9:
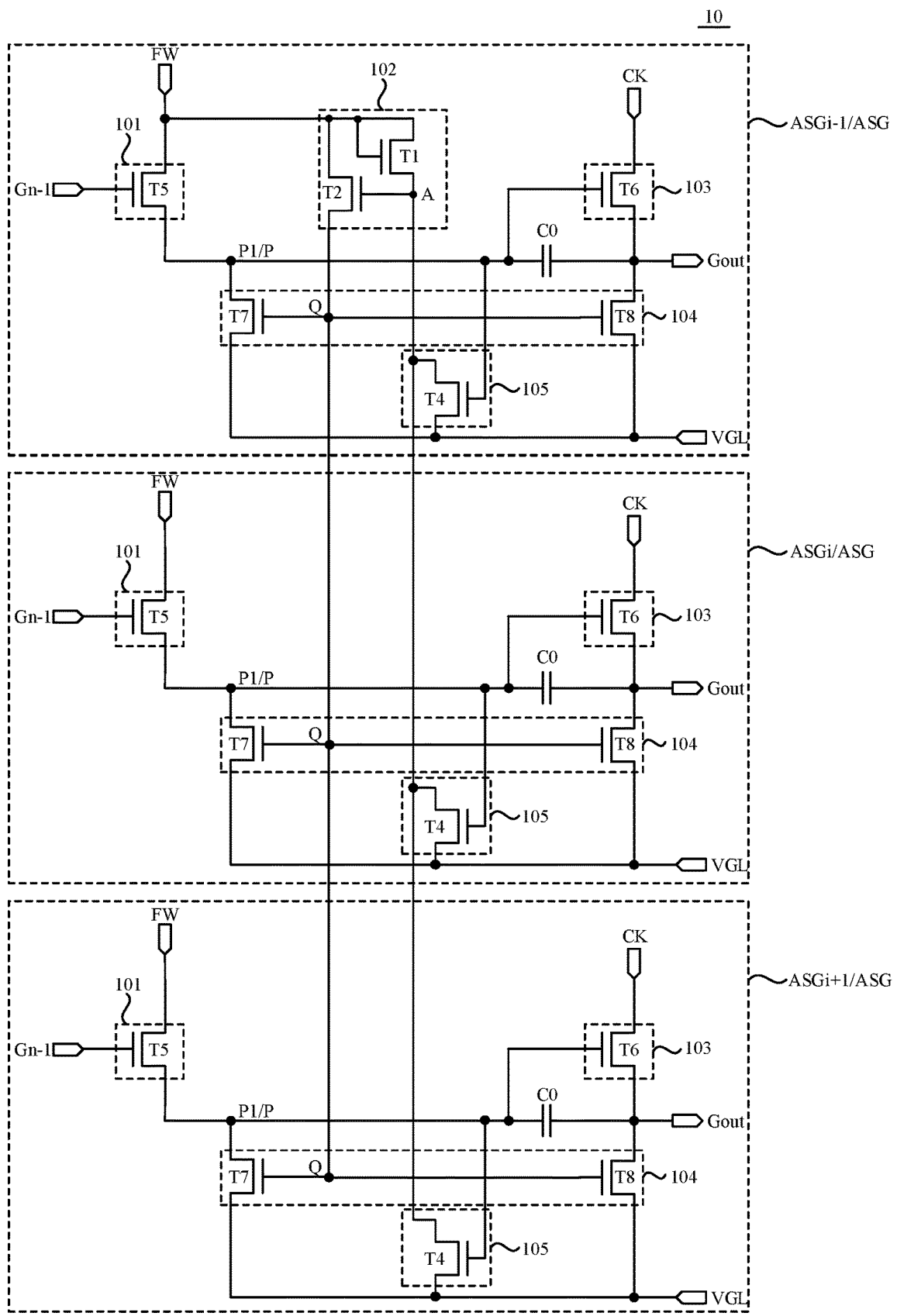
FIG. 9 is a structural schematic diagram of a circuit of another shift register unit group according to an embodiment of the present disclosure.

In an embodiment, FIG. 9 is a structural schematic diagram of a circuit of another shift register unit group according to an embodiment of the present disclosure. As shown in FIG. 9, each shift register unit ASG (ASGI−1, ASGI, and ASGI+1) in the same shift register unit group 10 includes a pull-up control module 105, and each pull-up control module 105 includes a fourth transistor T4, so that the fourth transistor T4 of each shift register unit ASG (ASGi−1, ASGi, and ASGi+1) in each shift register unit group 10 is capable of transmitting the first level signal Vgl from the first level terminal VGL under the control of the potential of the respective first node P (P1, P2, and P3) of each shift register unit ASG. In this manner, when the input module 101 of each shift register unit ASG (ASGi−1, ASGi, and ASGi+1) charges the respective first node P (P1, P2, and P3) of each shift register unit ASG, the potential of the third node A is incapable of controlling the pull-down control module 102 to transmit the input signal Fw from the signal input terminal FW to the second node Q to ensure that the potential of the second node Q does not control the pull-down module 104 of each shift register unit ASG (ASGi−1, ASGi, and ASGi+1) to transmit the first level signal Vgl from the first level terminal VGL to the respective first node P (P1, P2, and P3) of each shift register unit ASG, thereby improving the accuracy of the potential of the first node P (P1, P2, P3) and further improving the accuracy of the scan signal outputted from the signal output terminal Gout of each shift register unit ASG (ASGi−1, ASGi, and ASGi+1).

It is to be understood that when one shift register unit in the same shift register unit group is provided with a pull-up control module (as shown in FIGS. 6 and 7), the number of pull-up control modules provided in the shift register unit group can be reduced, which means that the number of pull-up control modules provided in the shift register circuit can be reduced, thereby reducing the size of the shift register circuit; when each shift register unit in the same shift register unit group is provided with a pull-up control module (as shown in FIGS. 8 and 9), the accuracy of the control of the pull-down control module by each shift register unit can be improved; and thus, each embodiment of the present disclosure has its unique beneficial effects. For ease of description, the embodiments of the present disclosure are all illustrated by using an example in which each shift register unit group includes one shift register unit that is provided with a pull-up control module to illustratively describe the technical solutions of the embodiments of the present disclosure.

It is to be noted that the structure of the pull-up control module in the shift register unit is illustratively described above, in which the pull-up control module is composed of a fourth transistor, and in the embodiments of the present disclosure, other modules in the shift register unit may also be composed of active and/or passive device components, where the active device may include three-terminal control devices such as transistors and the passive device may include resistors, capacitors, inductors and the like.

In an embodiment, with continued reference to FIG. 7, the pull-down control module 102 includes a first transistor T1 and a second transistor T2. In the same shift register unit ASGi−1, the gate and the first pole of the first transistor T1 are electrically connected with the signal input terminal FW, and the second pole of the first transistor T1 and the gate of the second transistor T2 are electrically connected with the third node A; the first pole of the second transistor T2 is electrically connected with the signal input terminal FW, and the second pole of the second transistor T2 is electrically connected to the second node Q.

Accordingly, the input module 101 may include a fifth transistor T5, the output module 103 may include a sixth transistor T6, and the pull-down module 104 may include a seventh transistor T7 and an eighth transistor T8. In the same shift register unit ASG, the gate of the fifth transistor T5 is electrically connected with the scan control terminal, the first pole of the fifth transistor T5 is electrically connected with the signal input terminal FW, and the second pole of the fifth transistor T5 is electrically connected with the first node P; the gate of the sixth transistor T6 is electrically connected with the first node P, the first pole of the sixth transistor T6 is electrically connected with the clock signal terminal CK, and the second pole of the sixth transistor T6 is electrically connected with the signal output terminal Gout; the gate of the seventh transistor T7 and the gate of the eighth transistor T8 are both electrically connected with the second node Q, the first pole of the seventh transistor T7 and the first pole of the eighth transistor T8 are both electrically connected with the first level terminal VGL, the second pole of the seventh transistor T7 is electrically connected with the first node P, and the second pole of the eighth transistor T8 is electrically connected with the signal output terminal Gout.

Figure 10:
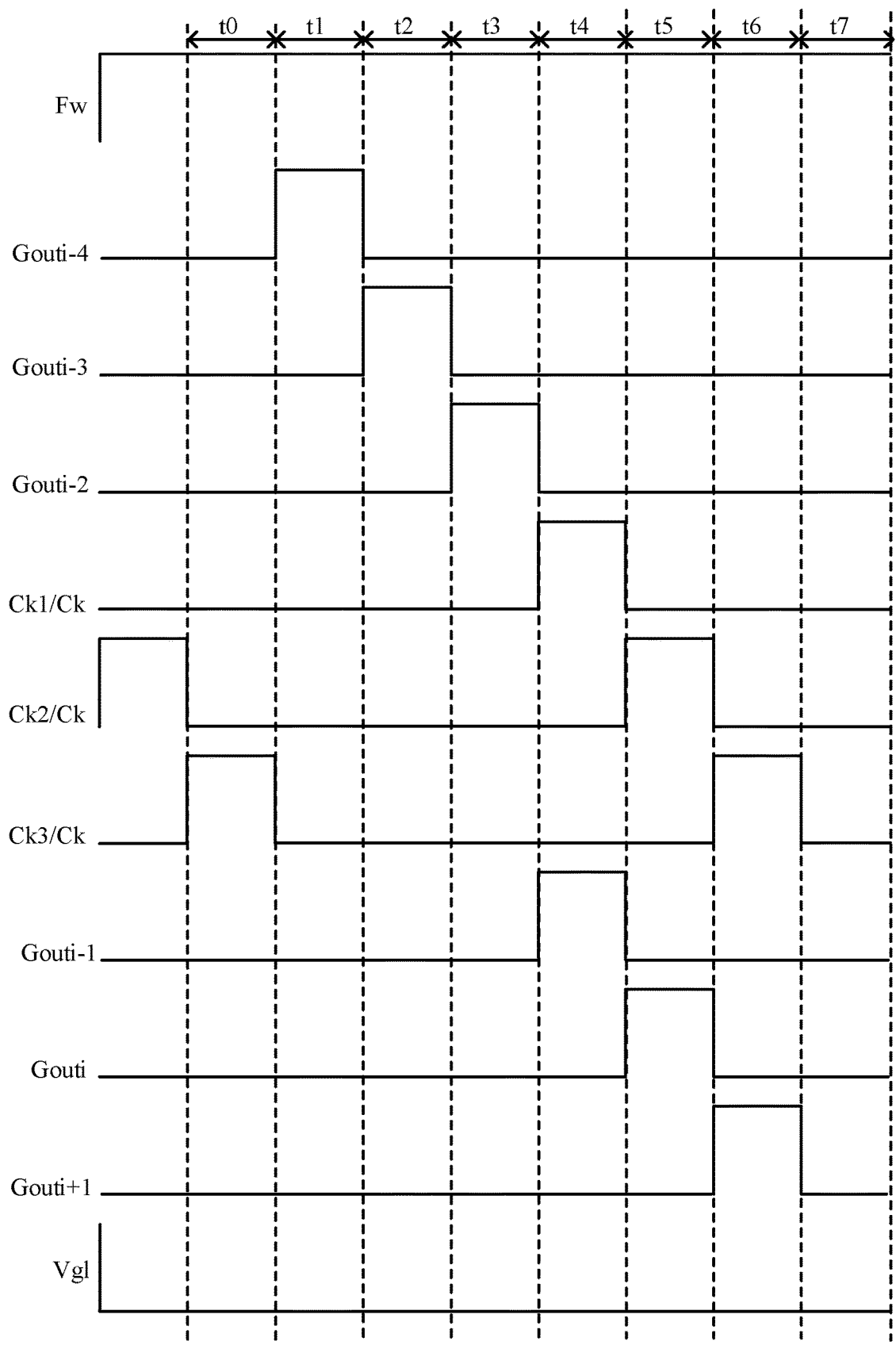
FIG. 10 is a drive timing diagram of a shift register unit group according to an embodiment of the present disclosure.

In an embodiment, FIG. 10 is a drive timing diagram of a shift register unit group according to an embodiment of the present disclosure, and the following is described by using an example in which transistors in the shift register unit are all N-type transistors. With reference to FIGS. 7 and 10, the working principle of each shift register unit 10 is as follows.

In stage t0, the scan control signal Gouti−4 received by the scan control terminal Gn−1 of the shift register unit ASGi−1, the scan control signal Gouti−3 received by the scan control terminal Gn−1 of the shift register unit ASGi, and the scan control signal Gouti−2 received by the scan control terminal Gn−1 of the shift register unit ASGi+1 are all at a low level so that the fifth transistor T5 of each of shift register units ASGi−1, ASGi and ASGi+1 are all in an off state. The input signal Fw from the signal input terminal FW controls the first transistor T1 of the shift register unit ASGi−1 to be turned on, the first transistor T1 transmits the input signal Fw to the third node A, the potential of the third node A controls the second transistor T2 to be turned on so that the second transistor T2 transmits the input signal Fw to the second node Q of each of shift register units ASGi−1, ASGi and ASGi+1, and the potential of the second node Q is capable of controlling the seventh transistor T7 and the eighth transistor T8 of the shift register unit ASGi−1, the seventh transistor T7 and the eighth transistor T8 of the shift register unit ASGi, and the seventh transistor T7 and the eighth transistor T8 of the shift register unit ASGi+1 to be turned on. At this point, the seventh transistor T7 of the shift register unit ASGi−1 transmits the first level signal Vgl from the first level terminal VGL to the first node P1 of the shift register unit ASGi−1, the eighth transistor T8 of the shift register unit ASGi−1 transmits the first level signal Vgl from the first level terminal VGL to the signal output terminal Gout of the shift register unit ASGi−1, and the shift register unit ASGi−1 outputs the disable level of the scan signal Gouti−1. The seventh transistor T7 of the shift register unit ASGi transmits the first level signal Vgl from the first level terminal VGL to the first node P2 of the shift register unit ASGi, the eighth transistor T8 of the shift register unit ASGi transmits the first level signal Vgl from the first level terminal VGL to the signal output terminal Gout of the shift register unit ASGi, and the shift register unit ASGi outputs the disable level of the scan signal Gouti. The seventh transistor T7 of the shift register unit ASGi+1 transmits the first level signal Vgl from the first level terminal VGL to the first node P3 of the shift register unit ASGi+1, the eighth transistor T8 of the shift register unit ASGi+1 transmits the first level signal Vgl from the first level terminal VGL to the signal output terminal Gout of the shift register unit ASGi+1, and the shift register unit ASGi+1 outputs the disable level of the scan signal Gouti+1.

At stage t1, the scan control signal Gouti−4 received by the scan control terminal Gn−1 of the shift register unit ASGi−1 becomes at a high level while the scan control signal Gouti−3 received by the scan control terminal Gn−1 of the shift register units ASGi and the scan control signal Gouti−2 received by the scan control terminal Gn−1 of the shift register unit ASGi+1 remain at a low level. The fifth transistor T5 of the shift register unit ASGi−1 is turned on to transmit the input signal from the signal input terminal FW to the first node P1 to charge the first node P1. When the potential of the first node P1 is sufficient, the potential of the first node P1 controls the fourth transistor T4 and the sixth transistor T6 to be turned on, and the fourth transistor T4 transmits the first level signal Vgl to the third node A so that the potential of the third node A controls the second transistor T2 to be turned off, and the second transistor T2 is incapable of transmitting the input signal to the second node Q. Meanwhile, the potential of the second node Q is incapable of controlling the seventh transistor T7 and the eighth transistor T8 of each of shift register units ASGi−1, ASGi and ASGi+1 to remain turned on, the first level signal Vgl from the first level terminal VGL is incapable of being transmitted to the first node P (P1, P2, and P3) of each of shift register units ASGi−1, ASGi and ASGi+1, and the first node P2 of the shift register unit ASGi and the first node P3 of the shift register unit ASGi+1 remain at the low level of the t0 stage. Meanwhile, the sixth transistor T6 of the shift register unit ASGi−1 is turned on under the control of the potential of the first node P1 of the shift register unit ASGi−1 so that the sixth transistor T6 transmits the clock signal Ck1 from the clock signal terminal CK to the signal output terminal Gout of the shift register unit ASGi−1, the scan signal Gouti−1 outputted from the shift register unit ASGi−1 is at a low level of the clock signal Ck1, and the shift register unit ASGi−1 keeps outputting the disable level of the scan signal Gouti−1. The respective first node P (P2 and P3) of each of other shift register units ASGi and ASGi+1 is incapable of controlling the respective sixth transistor T6 of each of other shift register units ASGi and ASGi+1 to be turned on so that the shift register units ASGi and ASGi+1 keep outputting the disable level of the output scan signal (Gouti and Gouti+1).

In stage t2, the scan control signal Gouti−4 from the scan control terminal Gn−1 of the shift register unit ASGi−1 becomes at a low level, the clock signal Ck1 from the clock signal terminal CK of the shift register unit ASGi−1 remains at a low level, the first node P1 of the shift register unit ASGi−1 remains at a high level because no other potential is written to the first node P1, the sixth transistor T6 of the shift register unit ASGi−1 keeps transmitting the clock signal Ck1 to the signal output terminal Gout of the shift register unit ASGi−1, and the signal output terminal Gout of the shift register unit ASGi−1 keeps transmitting the disable level of the scan signal Gouti−1 because the clock signal Ck1 is at a low level. The scan control signal Gouti from the scan control terminal Gn−1 of the shift register unit ASGi becomes at a high level so that the fifth transistor T5 of the shift register unit ASGi is turned on, the fifth transistor T5 transmits the input signal from the signal input terminal FW to the first node P2 of the shift register unit ASGi so that the first node P2 becomes at a high level, the sixth transistor T6 of the shift register unit ASGi is turned on, and the sixth transistor T6 transmits the clock signal Ck2 from the clock signal terminal CK of the shift register unit ASGi to the signal output terminal Gout of the shift register unit ASGi so that the scan signal Gouti outputted from the signal output terminal Gout of the shift register unit ASGi is at a low level of the clock signal Ck2, that is, the scan signal Gouti outputted from the signal output terminal Gout of the shift register unit ASGi remains at a disable level. The scan control signal Gouti−2 of the scan control terminal Gn−1 of the shift register unit ASGi+1 remains at a low level so that the potential of the first node P3 of the shift register unit ASGi+1 remains at a low level, the sixth transistor T6 of the shift register unit ASGi+1 remains in an off state, and the scan signal Gouti+1 outputted from the signal output terminal Gout of the shift register unit ASGi+1 remains at a disable level.

In stage t3, the first node P1 of the shift register unit ASGi−1 remains at a high level, the sixth transistor T6 of the shift register unit ASGi−1 keeps transmitting the clock signal Ck1 to the signal output terminal Gout of the shift register unit ASGi−1, and the clock signal CK1 remains at a low level so that the signal output terminal Gout of the shift register unit ASGi−1 keeps transmitting a disable level of the scan signal Gouti−1. The scan control signal Gouti from the scan control terminal Gn−1 of the shift register unit ASGi becomes at a low level so that the fifth transistor T5 of the shift register unit ASGi is turned off, the first node P2 of the shift register unit ASGi remains at a high level because no other potential is written to the first node P2, the sixth transistor T6 of the shift register unit ASGi remains turned on, the sixth transistor T6 continues to transmit the clock signal Ck2 from the clock signal terminal CK of the shift register unit ASGi to the signal output terminal Gout of the shift register unit ASGi, and the scan signal Gouti outputted from the signal output terminal Gout of the shift register unit ASGi remains at a disable level because the clock signal Ck2 remains at a low level. The scan control signal Gouti−2 from the scan control terminal Gn−1 of the shift register unit ASGi+1 becomes at a high level so that the fifth transistor T5 of the shift register unit ASGi+1 is turned on, the fifth transistor T5 transmits the input signal from the signal input terminal FW to the first node P3 of the shift register unit ASGi+1 so that the first node P3 becomes at a high level, the sixth transistor T6 of the shift register unit ASGi+1 is turned on, and the sixth transistor T6 transmits the clock signal Ck3 from the clock signal terminal CK of the shift register unit ASGi+1 to the signal output terminal Gout of the shift register unit ASGi+1 so that the scan signal Gouti outputted from the signal output terminal Gout is at a low level of the clock signal Ck3, that is, the scan signal Gouti outputted from the signal output terminal Gout of the shift register unit ASGi+1 remains at a non-enabled level.

In stage t4, the first node P1 of the shift register unit ASGi−1 remains at a high level, and the sixth transistor T6 of the shift register unit ASGi−1 keeps transmitting the clock signal Ck1 to the signal output terminal Gout of the shift register unit ASGi−1, and at this point, the clock signal Ck1 becomes at a high level so that the signal output terminal Gout of the shift register unit ASGi−1 outputs the enable level of the scan signal Gouti−1. The first node P2 of the shift register unit ASGi remains at a high level, the sixth transistor T6 of the shift register unit ASGi keeps transmitting the clock signal Ck2 to the signal output terminal Gout of the shift register unit ASGi, and the signal output terminal Gout of the shift register unit ASGi keeps transmitting the disable level of the scan signal Gouti−1 because the clock signal Ck2 remains at a low level. The first node P3 of the shift register unit ASGi+1 remains at a high level, the sixth transistor T6 of the shift register unit ASGi+1 keeps transmitting the clock signal Ck3 to the signal output terminal Gout of the shift register unit ASGi+1, and the signal output terminal Gout of the shift register unit ASGi+1 keeps outputting the disable level of the scan signal Gouti+1 because the clock signal Ck3 remains at a low level.

In stage t5, the first node P1 of the shift register unit ASGi−1 remains at a high level, the sixth transistor T6 of the shift register unit ASGi−1 keeps transmitting the clock signal Ck1 to the signal output terminal Gout of the shift register unit ASGi−1, and the signal output terminal Gout of the shift register unit ASGi−1 outputs the disable level of the scan signal Gouti−1 because the clock signal Ck1 becomes at a low level. The first node P2 of the shift register unit ASGi remains at a high level, the sixth transistor T6 of the shift register unit ASGi keeps transmitting the clock signal Ck2 to the signal output terminal Gout of the shift register unit ASGi, and the signal output terminal Gout of the shift register unit ASGi outputs the enable level of the scan signal Gouti−1 because the clock signal Ck2 becomes at a high level. The first node P3 of the shift register unit ASGi+1 remains at a high level, the sixth transistor T6 of the shift register unit ASGi+1 keeps transmitting the clock signal Ck3 to the signal output terminal Gout of the shift register unit ASGi+1, and the signal output terminal Gout of the shift register unit ASGi+1 keeps outputting the disable level of the scan signal Gouti+1 because the clock signal Ck3 remains at a low level.

In stage t6, the first node P1 of the shift register unit ASGi−1 remains at a high level, the sixth transistor T6 of the shift register unit ASGi−1 keeps transmitting the clock signal Ck1 to the signal output terminal Gout of the shift register unit ASGi−1, and the signal output terminal Gout of the shift register unit ASGi−1 outputs the disable level of the scan signal Gouti−1 because the clock signal Ck1 remains at a low level. The first node P2 of the shift register unit ASGi remains at a high level, the sixth transistor T6 of the shift register unit ASGi keeps transmitting the clock signal Ck2 to the signal output terminal Gout of the shift register unit ASGi, and the signal output terminal Gout of the shift register unit ASGi outputs the enable level of the scan signal Gouti−1 because the clock signal Ck2 becomes at a low level. The first node P3 of the shift register unit ASGi+1 remains at a high level, the sixth transistor T6 of the shift register unit ASGi+1 keeps transmitting the clock signal Ck3 to the signal output terminal Gout of the shift register unit ASGi+1, and the signal output terminal Gout of the shift register unit ASGi+1 keeps outputting the enable level of the scan signal Gouti+1 because the clock signal Ck3 becomes at a high level.

In stage t7, the first node P1 of the shift register unit ASGi−1 remains at a high level, the sixth transistor T6 of the shift register unit ASGi−1 keeps transmitting the clock signal Ck1 to the signal output terminal Gout of the shift register unit ASGi−1, and the signal output terminal Gout of the shift register unit ASGi−1 outputs the disable level of the scan signal Gouti−1 because the clock signal Ck1 remains at a low level. The first node P2 of the shift register unit ASGi remains at a high level, the sixth transistor T6 of the shift register unit ASGi keeps transmitting the clock signal Ck2 to the signal output terminal Gout of the shift register unit ASGi, and the signal output terminal Gout of the shift register unit ASGi outputs the enable level of the scan signal Gouti−1 because the clock signal Ck2 becomes at a low level. The first node P3 of the shift register unit ASGi+1 remains at a high level, the sixth transistor T6 of the shift register unit ASGi+1 keeps transmitting the clock signal Ck3 to the signal output terminal Gout of the shift register unit ASGi+1, and the signal output terminal Gout of the shift register unit ASGi+1 keeps outputting the disable level of the scan signal Gouti+1 because the clock signal Ck3 becomes at a low level.

In this manner, each of shift register units ASGi−1, ASGi and ASGi+1 in the same shift register unit group 10 is capable of outputting the enable level of the scan signal (Gouti−1, Gouti, and Gouti+1), and the enable level of the scan signal is sequentially shifted; the enable level of the scan signal (Gouti−1, Gouti, and Gouti+1) outputted from each of shift register units ASGi−1, ASGi and ASGi+1 in the stage shift register unit group 10 is located after the enable level of the scan signal (Gouti−4, Gouti−3, and Gouti−2) outputted from each shift register unit of the shift register unit group 10 of a previous stage; and the enable level of the scan signal (Gouti−1, Gouti, and Gouti+1) outputted from each of shift register units ASGi−1, ASGi and ASGi+1 of the shift register unit group 10 is located before the enable level of the scan signal outputted from each shift register unit in the shift register unit group of a next stage.

Figure 11:
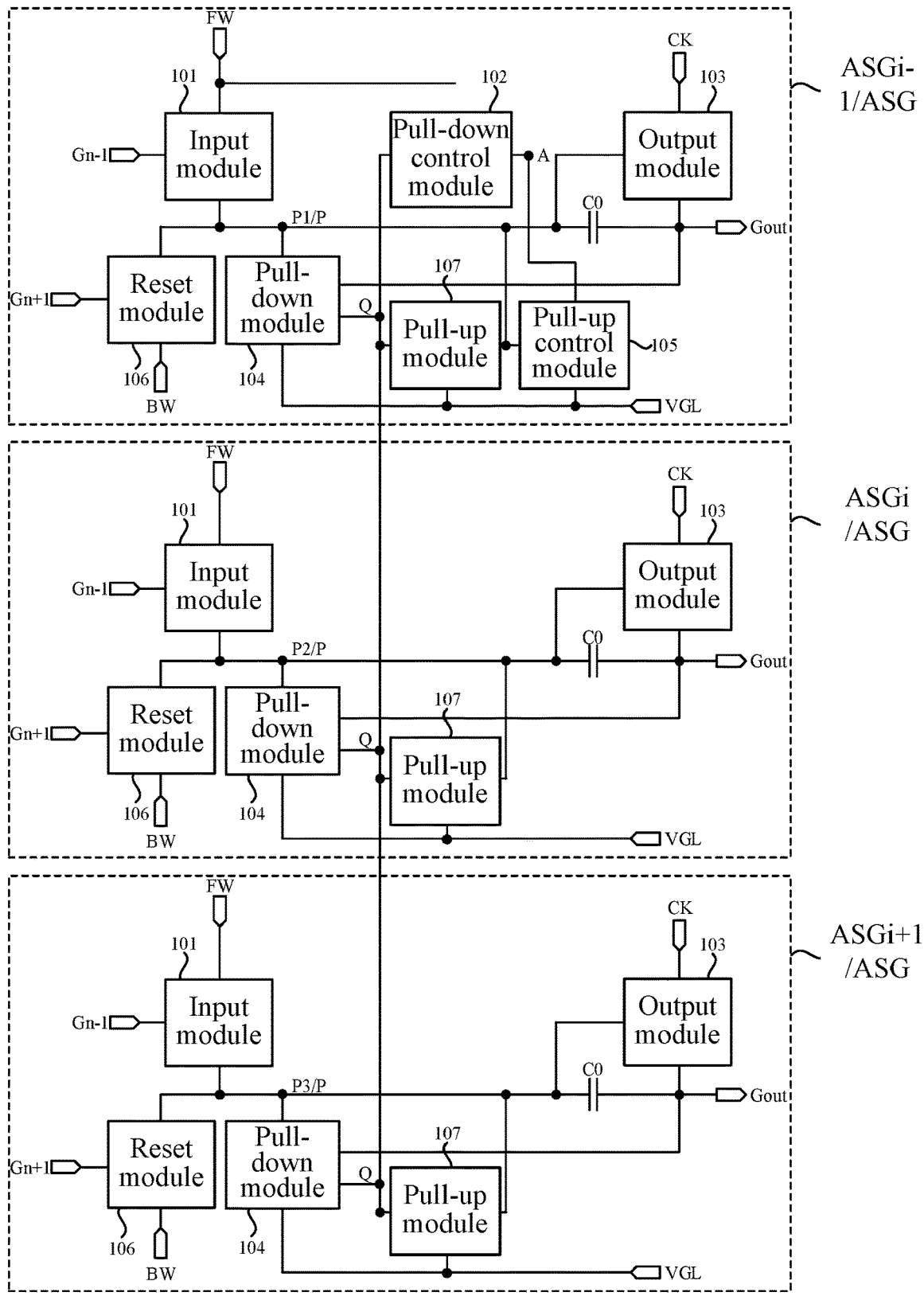
FIG. 11 is a structural schematic diagram of another shift register unit group according to an embodiment of the present disclosure.

In an embodiment, FIG. 11 is a structural schematic diagram of another shift register unit group according to an embodiment of the present disclosure. As shown in FIG. 11, at least one shift register unit ASG of the shift register unit group 10 further includes a pull-up module 107. In this shift register unit ASG, the pull-up module 107 is electrically connected with the first level terminal VGL, the first node P and the second node Q respectively, and the pull-up module 107 is used for controlling the first level signal Vgl from the first level terminal VGL to be transmitted to the second node Q according to the potential of the first node P.

In an embodiment, for example, each of all the shift register units in each shift register unit group is provided with a pull-up module. In the same shift register unit group 10, when the input module 101 of the shift register unit ASGi−1 charges the first node P1 of the shift register unit ASGi−1, the potential of the first node P1 of the shift register unit ASGi−1 controls the pull-up module 107 to transmit the first level signal Vgl from the first level terminal VGL of the shift register unit ASGi−1 to the second node Q so that the second node Q of each of shift register units ASGi−1, ASGi and ASGi+1 does not control the respective pull-down module 104 of each of shift register units ASGi−1, ASGi and ASGi+1 to transmit the first level signal Vgl from the first level terminal VGL to the respective first node P (P1, P2, and P3) of each of shift register units ASGi−1, ASGi and ASGi+1. Similarly, when the input module 101 of the shift register unit ASGi charges the first node P2 of the shift register unit ASGi, the potential of the first node P2 of the shift register unit ASGi controls the pull-up module 107 of the shift register unit ASGi to transmit the first level signal Vgl from the first level terminal VGL of the shift register unit ASGi to the second node Q so that the second node Q of each of shift register units ASGi−1, ASGi and ASGi+1 does not control the respective pull-down module 104 of each of shift register units ASGi−1, ASGi and ASGi+1 to transmit the first level signal Vgl from the first level terminal VGL to the respective first node P (P1, P2, and P3) of each of shift register units ASGi−1, ASGi and ASGi+1. When the input module 101 of the shift register unit ASGi11 charges the first node P3 of the shift register unit ASGi+1, the potential of the first node P3 of the shift register unit ASGi+1 controls the pull-up module 107 to transmit the first level signal Vgl from the first level terminal VGL to the second node Q so that the second node Q of each of shift register units ASGi−1, ASGi and ASGi+1 does not control the respective pull-down module 104 of each of shift register units ASGi−1, ASGi and ASGi+1 to transmit the first level signal Vgl from the first level terminal VGL to the respective first node P (P1, P2, and P3) of each of shift register units ASGi−1, ASGi and ASGi+1. In this manner, by providing the pull-up module 107 in each shift register unit ASG, the accuracy of the potential of the first node P of each shift register unit ASG can be ensured, thereby improving the accuracy of the scan signal outputted from each shift register unit.

Figure 12:
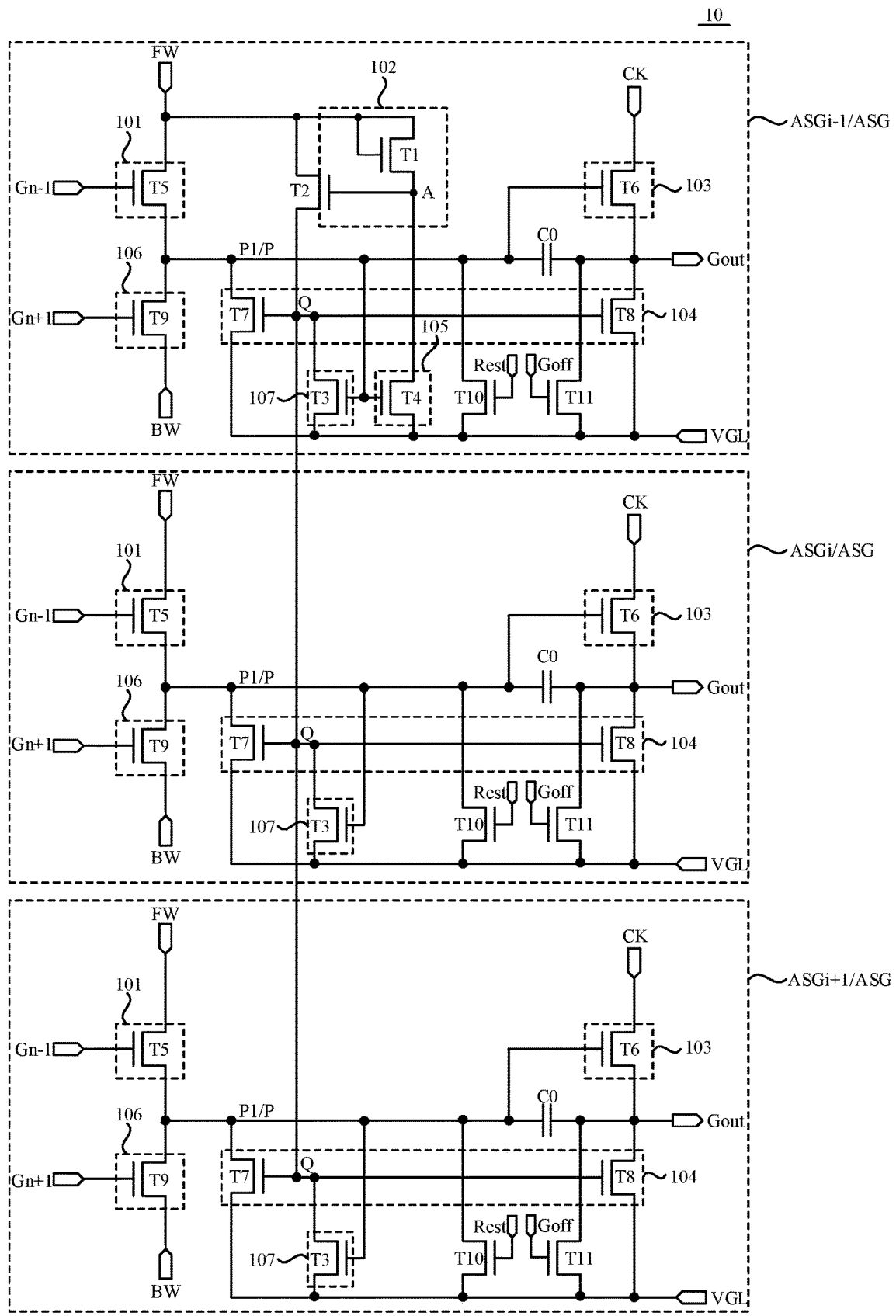
FIG. 12 is a structural schematic diagram of a circuit of another shift register unit group according to an embodiment of the present disclosure.

In an embodiment, FIG. 12 is a structural schematic diagram of a circuit of another shift register unit group according to an embodiment of the present disclosure. As shown in FIG. 12, the pull-up module 107 includes a third transistor T3. In the same shift register unit ASG, the gate of the third transistor T3 is electrically connected with the first node P, the first pole of the third transistor T3 is electrically connected with the first level terminal VGL, and the second pole of the third transistor T3 is electrically connected with the second node Q.

For example, the third transistor T3 is an N-type transistor. With reference to FIGS. 10 and 12, when a shift register unit ASG transmits the input signal Fw from the signal input terminal FW of the shift register unit ASG to the first node P, the potential of the first node P is at a high level so that the potential of the first node P is capable of controlling the third transistor T3 to be in an on state. The first level signal Vgl from the first level terminal VGL is transmitted to the second node Q through the turned-on third transistor T3 so that the potential of the second node Q is at a low level, the potential of the second node Q controls the seventh transistor T7 and the eighth transistor T8 of the pull-down module 104 of the shift register unit ASG to be in an off state, and the first level signal Vgl from the first level terminal VGL is incapable of being transmitted to the first node P through the seventh transistor T7 and is incapable of being transmitted to the signal output terminal Gout through the eighth transistor T8. In this manner, the potential of the first node P is a high-level signal transmitted from the input module 101, and the scan signal of the signal output terminal Gout is a clock signal Ck transmitted from the output module 103.

Figure 13:
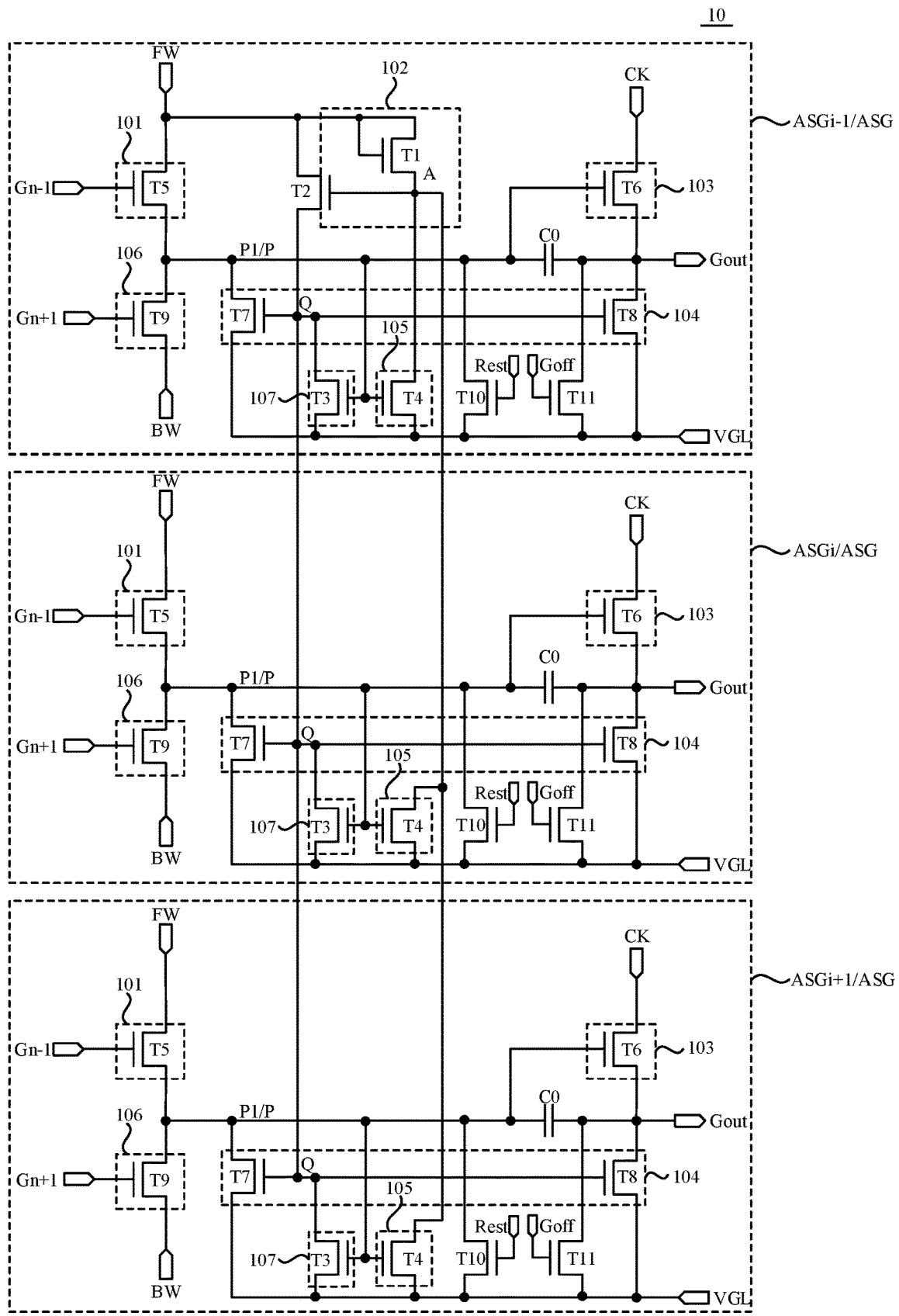
FIG. 13 is a structural schematic diagram of a circuit of another shift register unit group according to an embodiment of the present disclosure.

It is to be noted that FIG. 12 is an illustrative drawing of the embodiments of the present disclosure. FIG. 12 illustratively shows that each of shift register units ASGi−1, ASGi and ASGi+1 is provided with a pull-up module 107 and only the shift register unit ASGi−1 is provided with a pull-up control module 105. In the embodiments of the present disclosure, as shown in FIG. 13, each of shift register units ASGi−1, ASGi and ASGi+1 is provided with both a pull-up module 107 and a pull-up control module 105, and for the working principle, reference may be made to the above description, which will not be repeated herein. For ease of description, unless otherwise specifically noted, the embodiments of the present disclosure are all illustrated by using an example in which each of shift register unit groups ASGi−1, ASGi and ASGi+1 is provided with a pull-up module 107 and only the shift register unit group ASGi−1 is provided with a pull-up control module 105 to illustratively describe the technical solutions of the embodiments of the present disclosure.

In an embodiment, with continued reference to FIG. 11, the shift register unit ASG further includes a reset module 106, a reset signal terminal BW and a reset control terminal Gn+1. In the same shift register unit ASG, the reset module 106 is electrically connected with the reset signal terminal BW, the reset control terminal Gn+1 and the first node P respectively. The reset module 106 is used for transmitting the reset signal Bw from the reset signal terminal BW to the first node P under the control of the reset control signal from the reset control terminal Gn+1 to control the potential of the first node P. The reset control signal of the reset control terminal Gn+1 may also serve as the scan signal outputted from the signal output terminal Gout of each of other shift register units.

Figure 14:
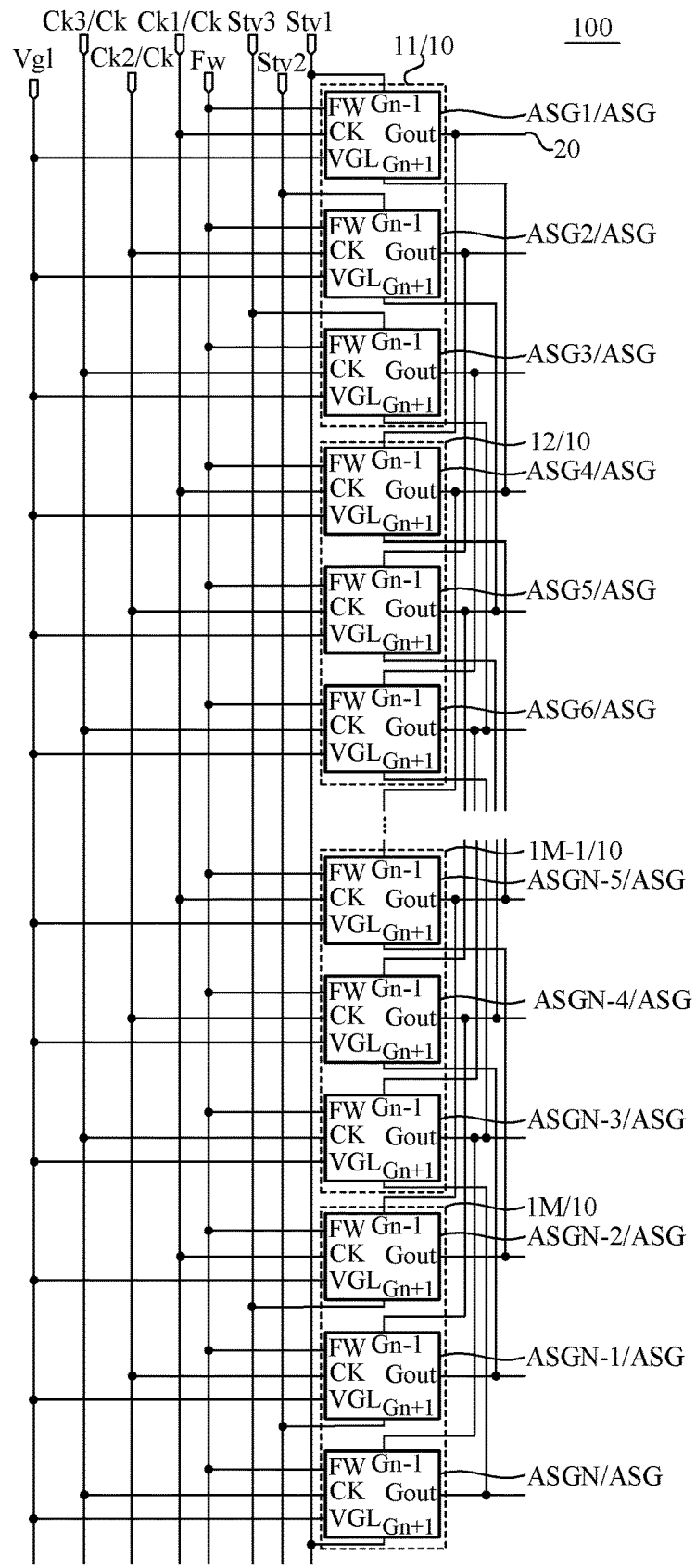
FIG. 14 is a structural schematic diagram of another shift register circuit according to an embodiment of the present disclosure.

FIG. 14 is a structural schematic diagram of another shift register circuit according to an embodiment of the present disclosure. With reference to FIGS. 11 and 14, the reset control terminal Gn+1 of each shift register unit in a shift register unit group of a previous stage is electrically connected with the signal output terminal Gout of each shift register unit in a shift register unit group of a next stage. For example, in the shift register unit group 11 of the first stage, the reset control terminal Gn+1 of the shift register unit ASG1 may be electrically connected with the signal output terminal Gout of the shift register unit ASG4 in the shift register unit group 12 of the second stage, the reset control terminal Gn+1 of the shift register unit ASG2 may be electrically connected with the signal output terminal Gout of the shift register unit ASG5 in the shift register unit group 12 of the second stage, and the reset control terminal Gn+1 of the shift register unit ASG3 may be electrically connected with the signal output terminal Gout of the shift register unit ASG3 in the shift register unit group 12 of the second stage. By analogy, in the shift register unit group 1M−1 of the $(M-1)^{th}$ stage, the reset control terminal Gn+1 of the shift register unit ASGN−5 may be electrically connected with the signal output terminal Gout of the shift register unit ASGN−2 in the shift register unit group 1M of the $M^{th}$ stage, the reset control terminal Gn+1 of the shift register unit ASGN−4 may be electrically connected with the signal output terminal Gout of the shift register unit ASGN−1 in the shift register unit group 1M of the $M^{th}$ stage, and the reset control terminal Gn+1 of the shift register unit ASGN−3 may be electrically connected with the signal output terminal Gout of the shift register unit ASGN in the shift register unit group 1M of the $M^{th}$ stage.

In an embodiment, the following is described with the shift register unit group 11 of the first stage and the shift register unit group 12 of the second stage as examples. When the signal output terminal Gout of each of shift register units ASG1, ASG2 and ASG3 of the shift register unit group 11 of the first stage sequentially outputs the enable level of the scan signal, the signal output terminal Gout of the shift register unit ASG4 of the shift register unit group 12 of the second stage starts outputting the enable level of the scan signal Gout4, and the enable level of the scan signal Gout4 is supplied to the corresponding scan signal line 20 and is also supplied as a reset control signal to the reset control terminal Gn+1 of the shift register unit ASG1, so that the reset module 106 of the shift register unit ASG1 is turned on under the control of the reset control signal Gout4 received at the reset control terminal Gn+1 of the shift register unit ASG1; and in this manner, the reset module 106 of the shift register unit ASG1 transmits the reset signal Bw from the reset signal terminal BW of the shift register unit ASG1 to the first node P1 to reset the potential of the first node P1, the output module 103 of the shift register unit ASG1 stops transmitting the clock signal Ck1 from the clock signal terminal CK of the shift register unit ASG1 to the signal output terminal Gout of the shift register unit ASG1 under the control of the potential of the first node P1, and the shift register unit ASG1 no longer outputs the enable level of the scan signal Gout1. Similarly, when the signal output terminal Gout of the shift register unit ASG5 of the shift register unit group 12 of the second stage starts outputting the enable level of the scan signal Gout5, the reset module 106 of the shift register unit ASG2 is turned on, and the reset module 106 of the shift register unit ASG2 transmits the reset signal Bw from the reset signal terminal BW of the shift register unit ASG2 to the first node P2 to reset the potential of the first node P2, so that the output module 103 of the shift register unit ASG2 stops transmitting the clock signal Ck2 from the clock signal terminal CK of the shift register unit ASG2 to the signal output terminal Gout of the shift register unit ASG2 under the control of the potential of the first node P2 of the shift register unit ASG2 and the shift register unit ASG2 no longer outputs the enable level of the scan signal Gout2. When the signal output terminal Gout of the shift register unit ASG6 of the shift register unit group 12 of the second stage starts outputting the enable level of the scan signal Gout6, the reset module 106 of the shift register unit ASG3 is turned on, the reset module 106 of the shift register unit ASG3 transmits the reset signal Bw from the reset signal terminal BW of the shift register unit ASG3 to the first node P3 to reset the potential of the first node P3, the output module 103 of the shift register unit ASG3 stops transmitting the clock signal Ck3 from the clock signal terminal CK of the shift register unit ASG3 to the signal output terminal Gout of the shift register unit ASG3 under the control of the potential of the first node P3 of the shift register unit ASG3, and the shift register unit ASG3 no longer outputs the enable level of the scan signal Gout2. At this point, the clock signal terminal CK of the shift register unit ASG1 in the shift register unit group 11 of the first stage and the clock signal terminal CK of the shift register unit ASG4 in the shift register unit group 12 of the second stage may receive the same clock signal Ck1, the clock signal terminal CK of the shift register unit ASG2 in the shift register unit group 11 of the first stage and the clock signal terminal CK of the shift register unit ASG5 in the shift register unit group 12 of the second stage may receive the same clock signal Ck2, and the clock signal terminal CK of the shift register unit ASG3 in the shift register unit group 11 of the first stage and the clock signal terminal CK of the shift register unit ASG6 in the shift register unit group 12 of the second stage may receive the same clock signal Ck3. In other words, the change of the clock signal received by each shift register unit in each shift register unit group (11, . . . , and 1M−1) of the odd-numbered stage may be the same as the change of the clock signal received by each shift register unit in each shift register unit group (12, . . . , and 1M) of the even-numbered stage.

In this manner, the scan signal outputted from each of shift register units ASG4, ASG5 and ASG6 in the shift register unit group 12 of the second stage is capable of controlling the reset module of each of shift register units ASG1, ASG2 and ASG3 in the shift register unit group 11 of the first stage to reset the first node P each of shift register units ASG1, ASG2 and ASG3, and meanwhile, the scan signal outputted from each of shift register units ASG1, ASG2 and ASG3 in the shift register unit 11 of the first stage control the input module of each of shift register units ASG4, ASG5 and ASG6 in the shift register unit group 12 of the second stage to charge the first node P each of shift register units ASG4, ASG5 and ASG6, thereby ensuring that the enable level of the scan signal outputted from each shift register unit in the shift register circuit is sequentially shifted and improving the accuracy of the scan signal outputted from each shift register unit in the shift register circuit.

In an embodiment, as shown in FIG. 12, the reset module may include a ninth transistor T9. In the same shift register unit ASG, the gate of the ninth transistor T9 is electrically connected with the reset control terminal Gn+1, the first pole of the ninth transistor T9 is electrically connected with the reset signal terminal BW, and the second pole of the ninth transistor T9 is electrically connected with the first node P.

Figure 15:
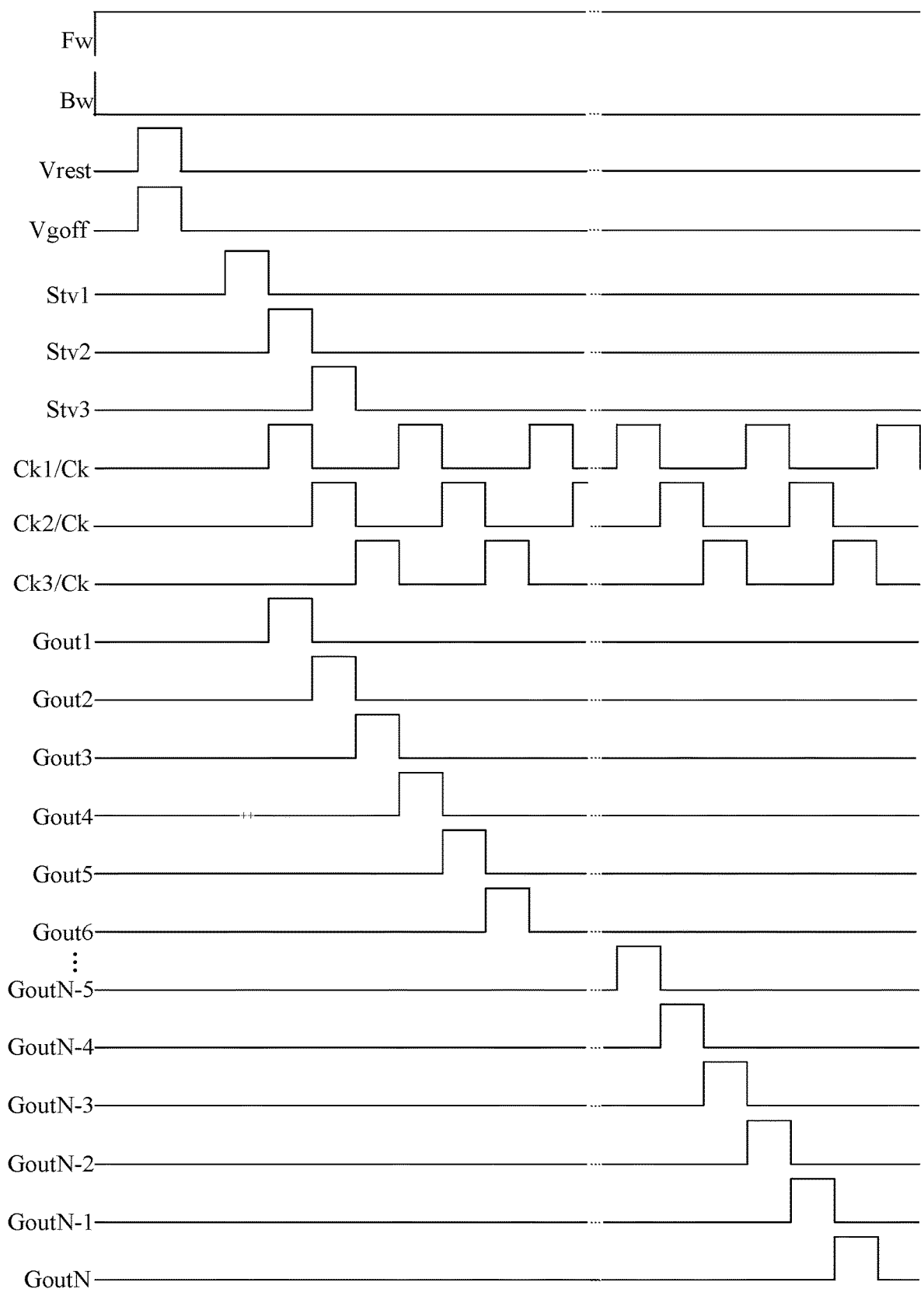
FIG. 15 is a drive timing diagram of another shift register circuit according to an embodiment of the present disclosure.

FIG. 15 is a drive timing diagram of another shift register circuit according to an embodiment of the present disclosure. With reference to FIGS. 12, 14 and 15, after the shift register unit ASG3 of the shift register unit group 11 of the first stage outputs the enable level of the scan signal, the signal output terminal Gout of the shift register unit ASG4 of the shift register unit group 12 of the second stage starts outputting the enable level of the scan signal Gout4, and the enable level of the scan signal Gout4 serves as a reset control signal to control the ninth transistor T9 of the shift register unit ASG1 to be turned on, so that the ninth transistor T9 of the shift register unit ASG1 transmits the reset signal Bw from the reset signal terminal BW of the shift register unit ASG1 to the first node P1 and the potential of the first node P1 becomes at a low level; in this manner, the third transistor T3, the fourth transistor T4 and the sixth transistor T6 of the shift register unit ASG1 are all in an off state under the control of the potential of the first node P1, the transistor T3 no longer transmits the first level signal Vgl from the second node Q of the shift register unit ASG1, the sixth transistor T6 no longer transmits the clock signal Ck1 to the signal output terminal Gout of the shift register unit ASG1, and the fourth transistor T4 no longer transmits the first level signal Vgl to the third node A, so that the second transistor T2 is turned on under the control of the input signal Fw transmitted from the first transistor T1 and transmits the input signal Fw to the second node Q and the potential of the second node Q is capable of controlling the seventh transistor T7 and the eighth transistor T8 of each of shift register units ASG1, ASG2 and ASG3 in the shift register unit group 11 of the first stage to be turned on; and at this point, the first level signal Vgl is transmitted to the first node P1 through the seventh transistor T7 of each of shift register units ASG1, ASG2 and ASG3 respectively, the first level signal Vgl is transmitted to the signal output terminal Gout through the eighth transistor T8 of each of shift register units ASG1, ASG2 and ASG3 respectively, and each of shift register units ASG1, ASG2 and ASG3 in the shift register unit group 11 of the first stage is capable of outputting the enable level of the scan signal. Similarly, when the signal output terminal Gout of the shift register unit ASG5 of the shift register unit group 12 of second stage starts outputting the enable level of the scan signal Gout5, the ninth transistor T9 of the shift register unit ASG2 is capable of being controlled to be turned on, and the reset signal Bw is transmitted to the first node P2 of the shift register unit ASG2 through the ninth transistor T9 that is turned on, so that the potential of the first node P2 is incapable of controlling the third transistor T3 and sixth transistor T6 of the shift register unit ASG2 to be turned on; and since the gate of the seventh transistor T7 and the gate of the eighth transistor T8 of the shift register unit ASG2 and the second transistor T2 of the shift register unit ASG1 are electrically connected with the second node Q, the seventh transistor T7 and the eighth transistor T8 of the shift register unit ASG2 are also in an on state to transmit the first level signal Vgl to the first node P2 and the signal output terminal Gout of the shift register unit ASG2 respectively, and the shift register unit ASG2 outputs the disable level of the scan signal Gout2. When the signal output terminal Gout of the shift register unit ASG6 of the shift register unit group 12 of the second stage starts outputting the enable level of the scan signal Gout6, the ninth transistor T9 of the shift register unit ASG3 is capable of being controlled to be turned on, and the working process of the shift register unit ASG3 is similar to the working process of the shift register unit ASG2, for which reference may be made to the above description of the operation process of the shift register unit ASG3, which will not be repeated herein. For the working process of the other shift register unit groups, reference may be made to the above description of the working process of the shift register unit group of the first stage, which will not be repeated herein.

In addition, each shift register unit may further include a bootstrap capacitor C0, a tenth transistor T10 and an eleventh transistor T11. In the same shift register unit, the bootstrap capacitor C0 is electrically connected between the first node P and the signal output terminal Gout and is capable of controlling the potential of the first node P to continue to rise when the signal output terminal Gout outputs the enable level of the scan signal to ensure that the sixth transistor T6 has a great on state. The gate of the tenth transistor T10 is electrically connected with a set signal terminal Rest, the gate of the eleventh transistor T11 is electrically connected with a clear signal terminal Goff, the first pole of the tenth transistor T10 and the first pole of the eleventh transistor T11 are both electrically connected with the first level terminal VGL, the second pole of the tenth transistor T10 is electrically connected with the first node P, and the second pole of the eleventh transistor T11 is electrically connected with the signal output terminal Gout. In this manner, before each shift register unit ASG in the shift register unit group 11 of the first stage outputs the enable level of the scan signal, the tenth transistors T10 in all shift register units ASG are capable of being controlled to be turned on through a set signal Vrest from the set signal terminal Rest so that the first level signal Vgl from the first level terminal VGL is transmitted to the first node P through the tenth transistor T10, so as to prevent the potential of the first node P in the previous drive cycle from affecting the working process of the current drive cycle. Meanwhile, before each shift register unit ASG in the shift register unit group 11 of the first stage outputs the enable level of the scan signal, the eleventh transistors T11 in all the shift register units ASG are also capable of being controlled to be turned on through a clear signal Vgoff from the clear signal terminal Goff so that the first level signal Vgl from the first level terminal VGL is transmitted to the signal output terminal Gout through the eleventh transistor T11, so as to clear the scan signal outputted from the signal output terminal Gout of each shift register unit ASG and thus prevent the signal outputted from the signal output terminal GOUT from being affected by the interference of other signals, thereby further improving the accuracy of the scan signal outputted from each shift register unit.

Figure 16:
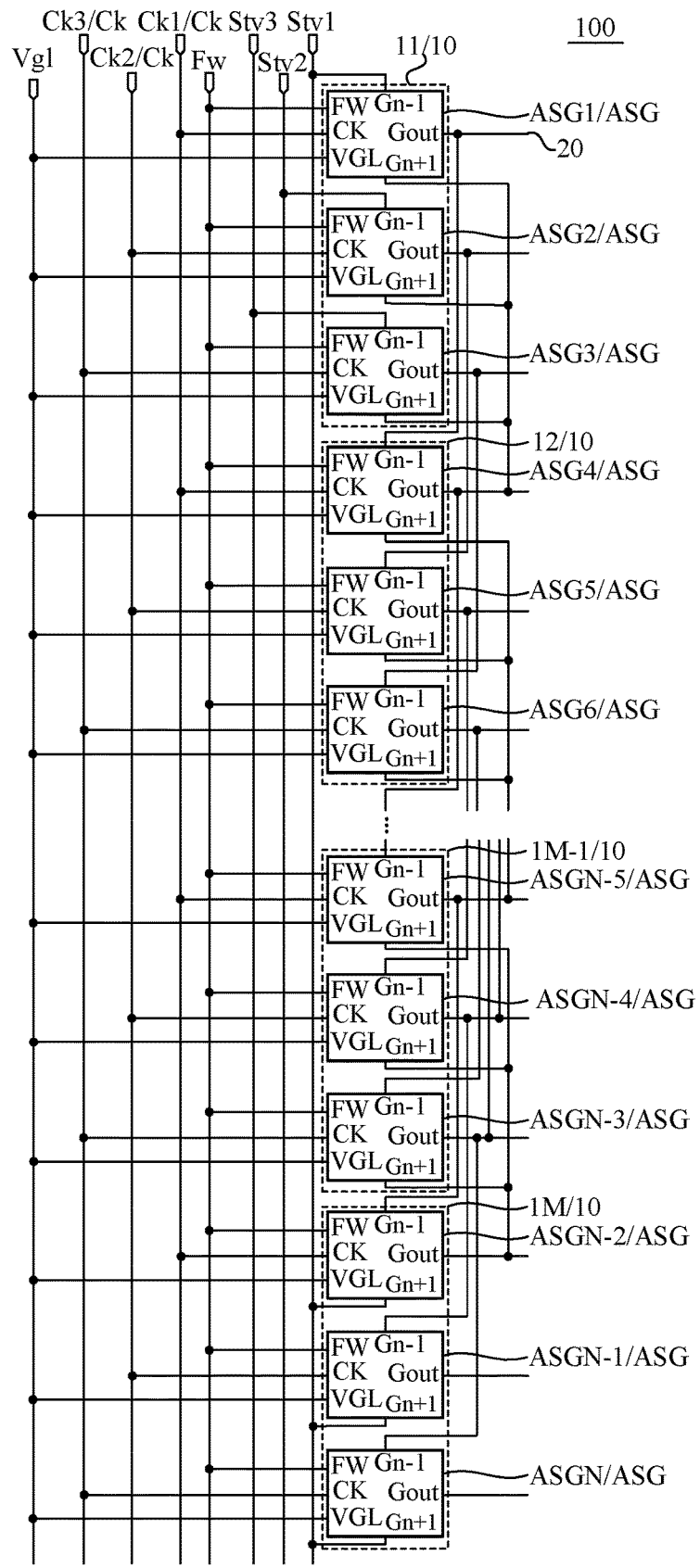
FIG. 16 is a structural schematic diagram of another shift register circuit according to an embodiment of the present disclosure.
Figure 17:
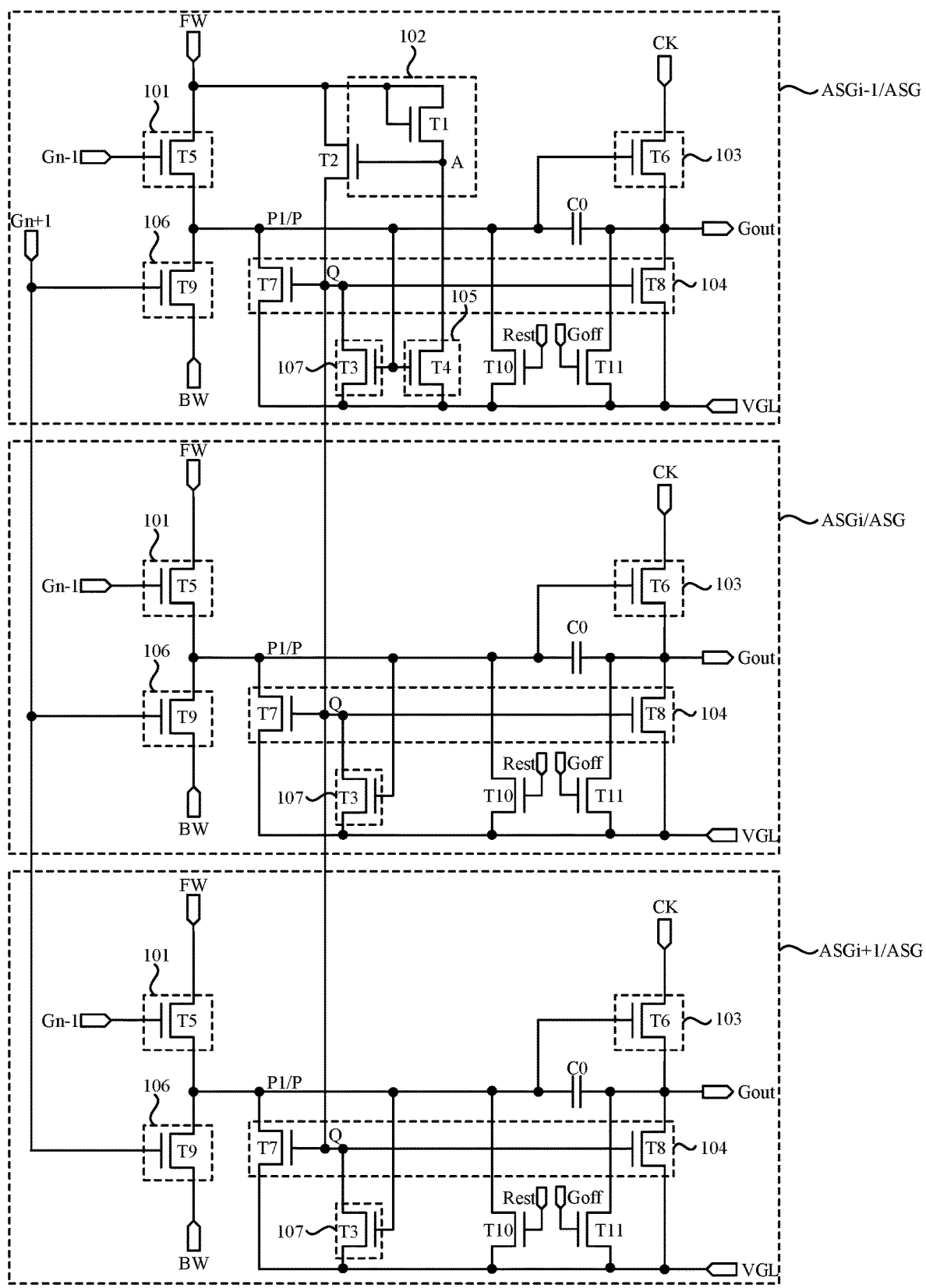
FIG. 17 is a structural schematic diagram of a circuit of another shift register unit group according to an embodiment of the present disclosure.

In an embodiment, FIG. 16 is a structural schematic diagram of another shift register circuit according to an embodiment of the present disclosure, and FIG. 17 is a structural schematic diagram of a circuit of another shift register unit group according to an embodiment of the present disclosure. With reference to FIGS. 16 and 17, in the same shift register unit group 10, the reset control terminal Gn+1 of one shift register unit ASGi−1 also serves as the reset control terminal of each of other shift register units ASGi and ASGi+1. In this manner, the reset module 106 of the shift register unit ASGi−1, the reset module 106 of the shift register unit ASGi and the reset module 106 of the shift register unit ASGi+1 are all capable of transmitting the first level signal Vgl from the first level terminal VGL to respective first node P (P1, P2 and P3) of each of shift register units ASGi−1, ASGi and ASGi+1 under the control of the reset control signal from the reset control terminal Gn+1 of the shift register unit ASGi−1 so that the number of signal terminals provided in each shift register unit group 10 can be reduced and the number and length of signal lines for connecting the reset control terminal of each shift register unit in the shift register unit group of a previous stage and the signal output terminal of each shift register unit in the shift register unit group of a next stage can be reduced, thereby further reducing the size of each shift register unit group 10 and reducing the size of the entire shift register circuit.

In an embodiment, with continued reference to FIGS. 16 and 17, each shift register unit ASG of the shift register unit group 10 includes a first shift register unit. The reset control terminal of each shift register unit of the shift register unit group of a previous stage is electrically connected with the signal output terminal of the first shift register unit in the shift register unit group of the next stage. In the same Shift register group 10, the enable level of the scan signal outputted from a first shift register unit is located before the enable level of the scan signals outputted from the other shift register units.

For example, the following is described with the shift register unit group 11 of the first stage and the shift register unit group 12 of the second stage as examples. The shift register unit group 12 of the second stage includes a first shift register unit group ASG4, and the enable level of the scan signal Gout4 outputted from the first shift register unit ASG4 is located before the enable levels of the scan signals Gout5 and Gout6 outputted from the other shift register units ASG5 and ASG6. The reset control terminal Gn+1 shared by each shift register unit ASG1, ASG2 and ASG3 in the shift register unit group 11 of the first stage is electrically connected with the signal output terminal Gout of the first shift register unit ASG4 in the shift register unit group 12 of the second stage so that under the control of the scan signal outputted from the first shift register unit ASG4 that first outputs the enable level of the scan signal in the shift register unit group 12 of the second stage, the reset module 106 of each ASG1, ASG2 and ASG3 in the shift register unit group 11 of the first stage simultaneously resets the respective first node P (P1, P2, and P3) of each ASG1, ASG2 and ASG3, thereby ensuring the accuracy of the scan signal outputted from each shift register unit ASG while reducing the number of signal terminals and signal lines provided in the shift register unit group 10.

It is to be noted that the above is described by using an example in which all shift register units are provided with the pull-up module, and in the embodiments of the present disclosure, at least one shift register unit in each shift register unit group may include a pull-up module, that is, the number of pull-up modules in each shift register unit group may be less than or equal to the number of shift register units.

Figure 18:
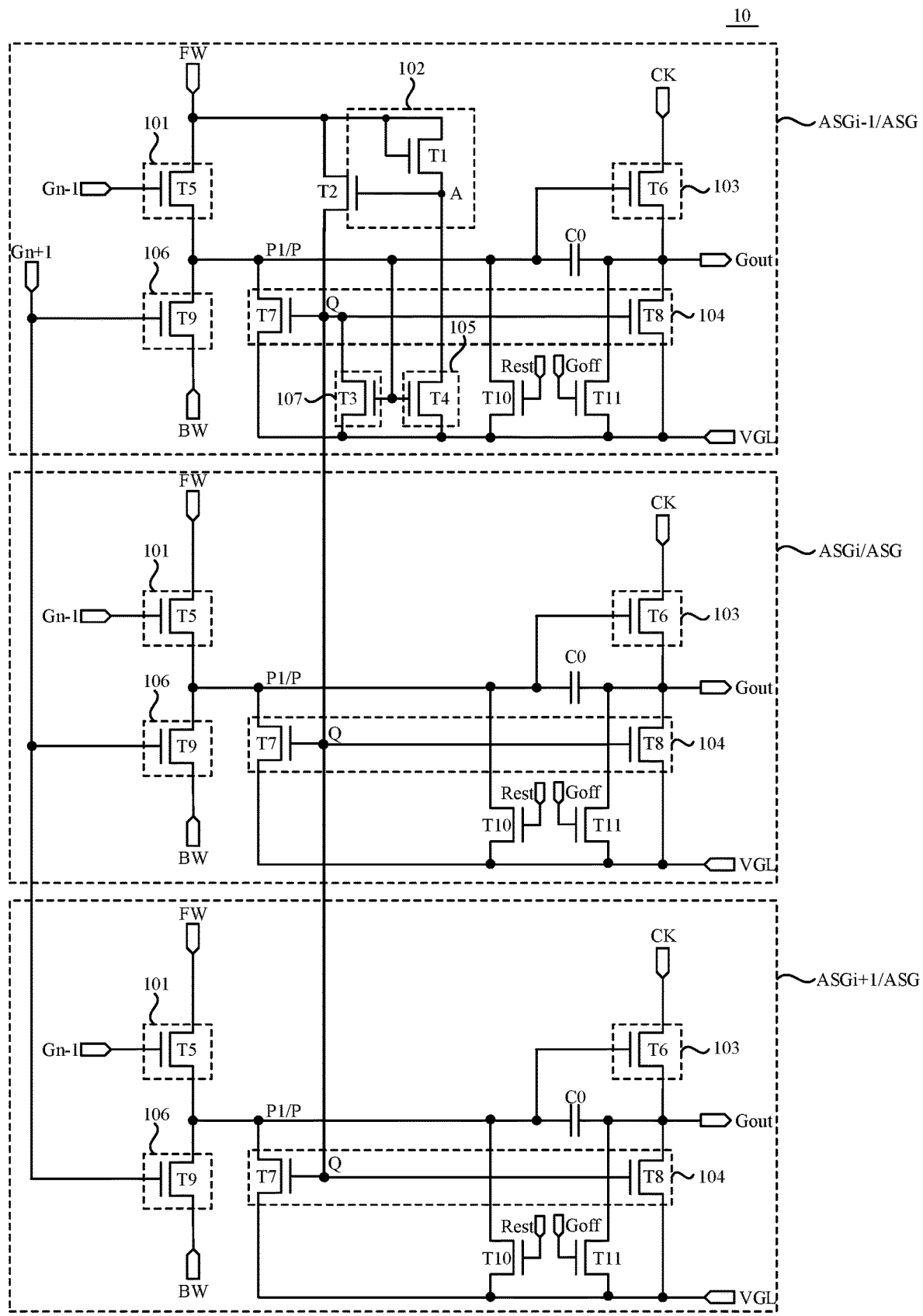
FIG. 18 is a structural schematic diagram of a circuit of another shift register unit group according to an embodiment of the present disclosure.

In an embodiment, FIG. 18 is a structural schematic diagram of a circuit of another shift register unit group according to an embodiment of the present disclosure. As shown in FIG. 18, in the same shift register unit group 10, the pull-up module 107 of one shift register unit ASGi−1 also serves as the pull-up module of each of other shift register units ASGi and ASGi+1. In this manner, under the control of the potential of the first node P1 of the shift register unit ASGi−1, the pull-up module 107 of the shift register unit ASGi−1 is capable of transmitting the first level signal Vgl from the first level terminal VGL to the second node Q of each of shift register units ASGi−1, ASGi and ASGi+1 to ensure that the potential of the second node Q does not affect the potential of the respective first node P (P1, P2, and P3) of each of shift register units ASGi−1, ASGi and ASGi+1. Meanwhile, by serving the pull-up module 107 of one shift register unit ASGi−1 of the same shift register unit group 10 as the pull-up module of each of other shift register units ASGi and ASGi+1, the number of pull-up modules 107 provided in the shift register unit group 10 can be reduced, thereby reducing the size of the shift register unit group 10, further reducing the size of the shift register circuit, reducing the size of the non-display area occupied by the shift register circuit in the display panel, and implementing the narrow bezel of the display panel.

Figure 19:
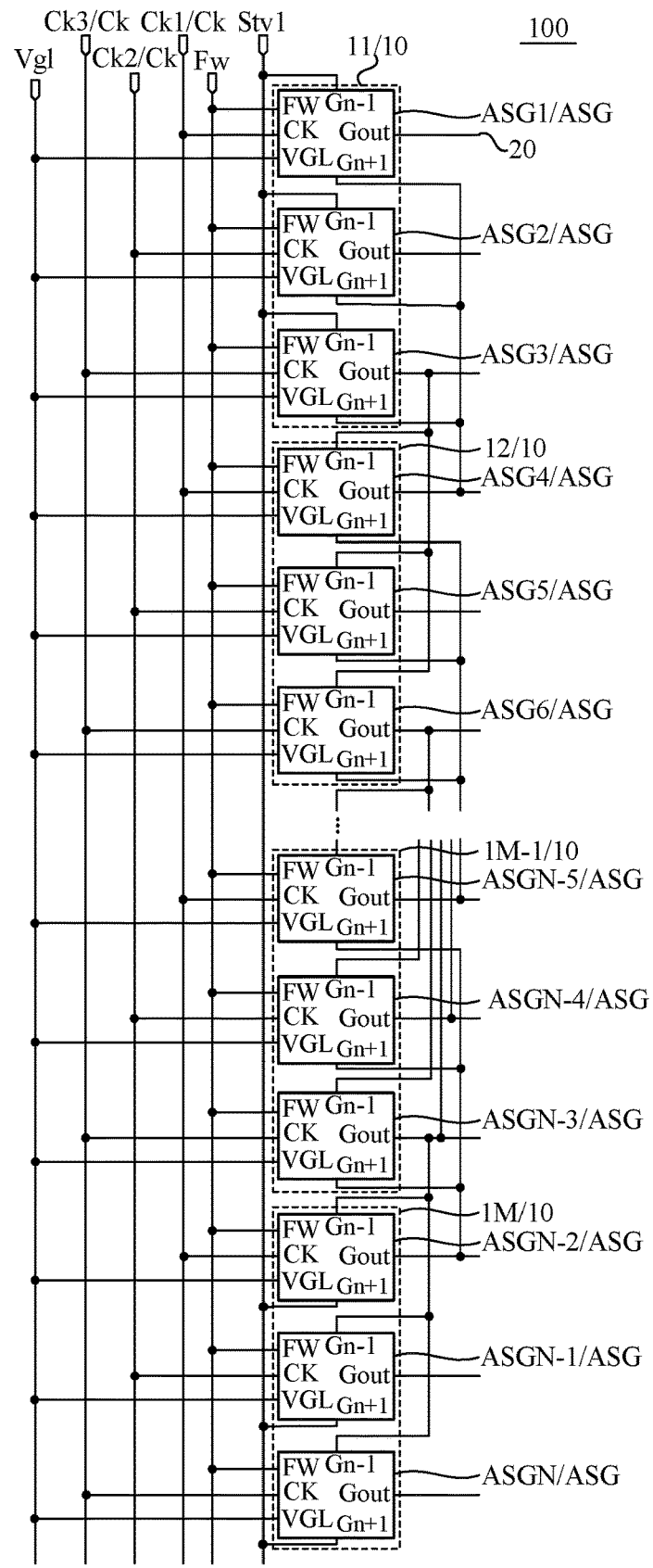
FIG. 19 is a structural schematic diagram of another shift register circuit according to an embodiment of the present disclosure.
Figure 20:
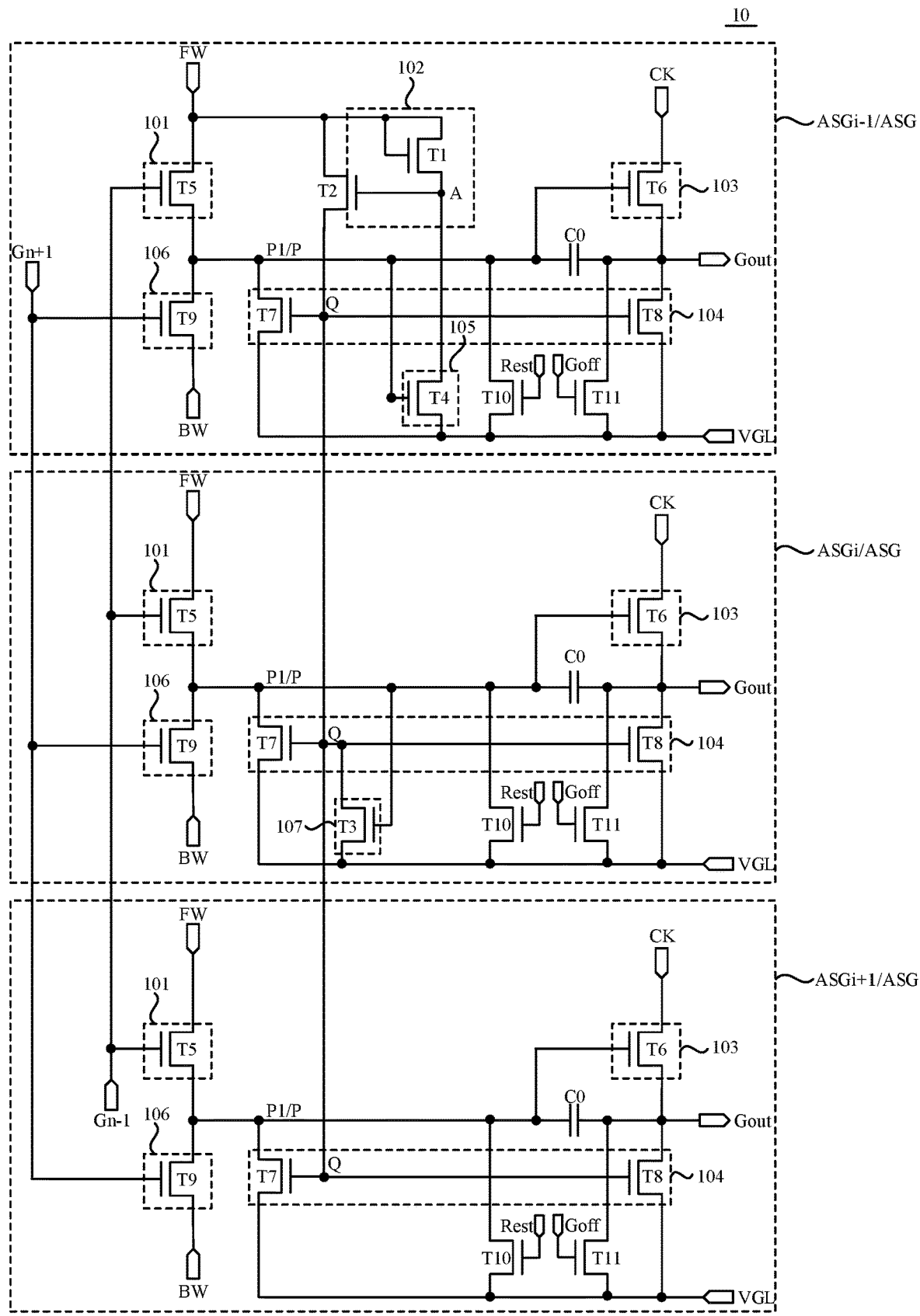
FIG. 20 is a structural schematic diagram of a circuit of another shift register unit group according to an embodiment of the present disclosure.

In an embodiment, FIG. 19 is a structural schematic diagram of another shift register circuit according to an embodiment of the present disclosure, and FIG. 20 is a structural schematic diagram of a circuit of another shift register unit group according to an embodiment of the present disclosure. With reference to FIGS. 19 and 20, in the same shift register unit group 10, the scan control terminal Gn+1 of one shift register unit ASGi+1 also serves as the scan control terminal of each of other shift register units ASGi and ASGi−1. In this manner, the input module 101 of the shift register unit ASGi−1, the input module 101 of the shift register unit ASGi and the input module 101 of the shift register unit ASGi+1 are all capable of transmitting the input signal Fw from the signal input terminal Fw to respective first node P (P1, P2, and P3) of each of shift register units ASGi−1, ASGi and ASGi+1 under the control of the scan control signal from the scan control terminal Gn−1 of the shift register unit ASGi+1 so that the number of signal terminals provided in each shift register unit group 10 can be reduced and the number and length of signal lines for connecting the signal output terminal of each shift register unit in the shift register unit group of a previous stage and the scan output terminal of each shift register unit in the shift register unit group of a next stage can be reduced, thereby further reducing the size of each shift register unit group 10 and reducing the size of the entire shift register circuit.

In an embodiment, with continued reference to FIGS. 19 and 20, each shift register unit ASG of the shift register unit group 10 includes a second shift register unit. The scan control terminal of each shift register unit of the shift register unit group of the next stage is electrically connected with the signal output terminal of the second shift register unit in the shift register unit group of a previous stage. In the same shift register group 10, the stage in which the second shift register unit outputs the enable level of the scan signal is located after the stage in which each of the other shift register units outputs the enable level of the scan signal.

In an embodiment, the following is described with the shift register unit group 11 of the first stage and the shift register unit group 12 of the second stage as examples. The shift register unit group 11 of the first stage includes a second shift register unit group ASG3, and the enable level of the scan signal Gout2 outputted from the second shift register unit ASG3 is located after the enable levels of the scan signals Gout1 and Gout2 outputted from the other shift register units ASG1 and ASG2. The scan control terminal Gn−1 shared by each of shift register units ASG4, ASG5 and ASG6 in the shift register unit group 12 of the second stage is electrically connected with the signal output terminal Gout of the second shift register unit ASG3 in the shift register unit group 11 of the first stage so that under the control of the scan signal outputted from the second shift register unit ASG3 that last outputs the enable level of the scan signal in the shift register unit group 11 of the first stage, the input module 101 of each of ASG4, ASG5 and ASG6 in the shift register unit group 12 of the second stage simultaneously charges the respective first node P (P1, P2, and P3) of each of ASG4, ASG5 and ASG6, thereby ensuring the accuracy of the scan signal outputted from each register unit ASG while reducing the number of signal terminals and the number of signal lines provided in the shift register unit group 10.

In an embodiment, with continued reference to FIG. 20, in the same shift register unit group 10, the pull-up module 106 and the pull-down control module 102 are each located in different shift register units. For example, the pull-up module 106 may be located in the shift register unit ASGi while the pull-down control module 102 may be located in the shift register unit ASGi−1. In this manner, on the premise that the pull-up module 106 and the pull-down control module 102 achieve their respective functions, it can be ensured that the number of devices in the shift register unit ASGi−1 provided with the pull-down control module 102 is equal to the number of devices in the shift register unit ASGi provided with the pull-up module 106, thereby reducing the difference between the parasitic capacitance of each shift register unit.

It is to be understood that when the shift register unit provided with the pull-down control module and the shift register unit provided with the pull-up module in a shift register unit group are the same shift register unit, the number of devices in this shift register unit provided with both modules is large, and the parasitic capacitance generated due to the presence of devices in this shift register unit is large. At this point, a corresponding compensation module may be provided in other shift register units that are not provided with the pull-down control module and/or the pull-up module. For ease of description, the compensation mode of other shift register units in the embodiments of the present disclosure is described by using an example of the arrangement mode of the pull-down control module.

Figure 21:
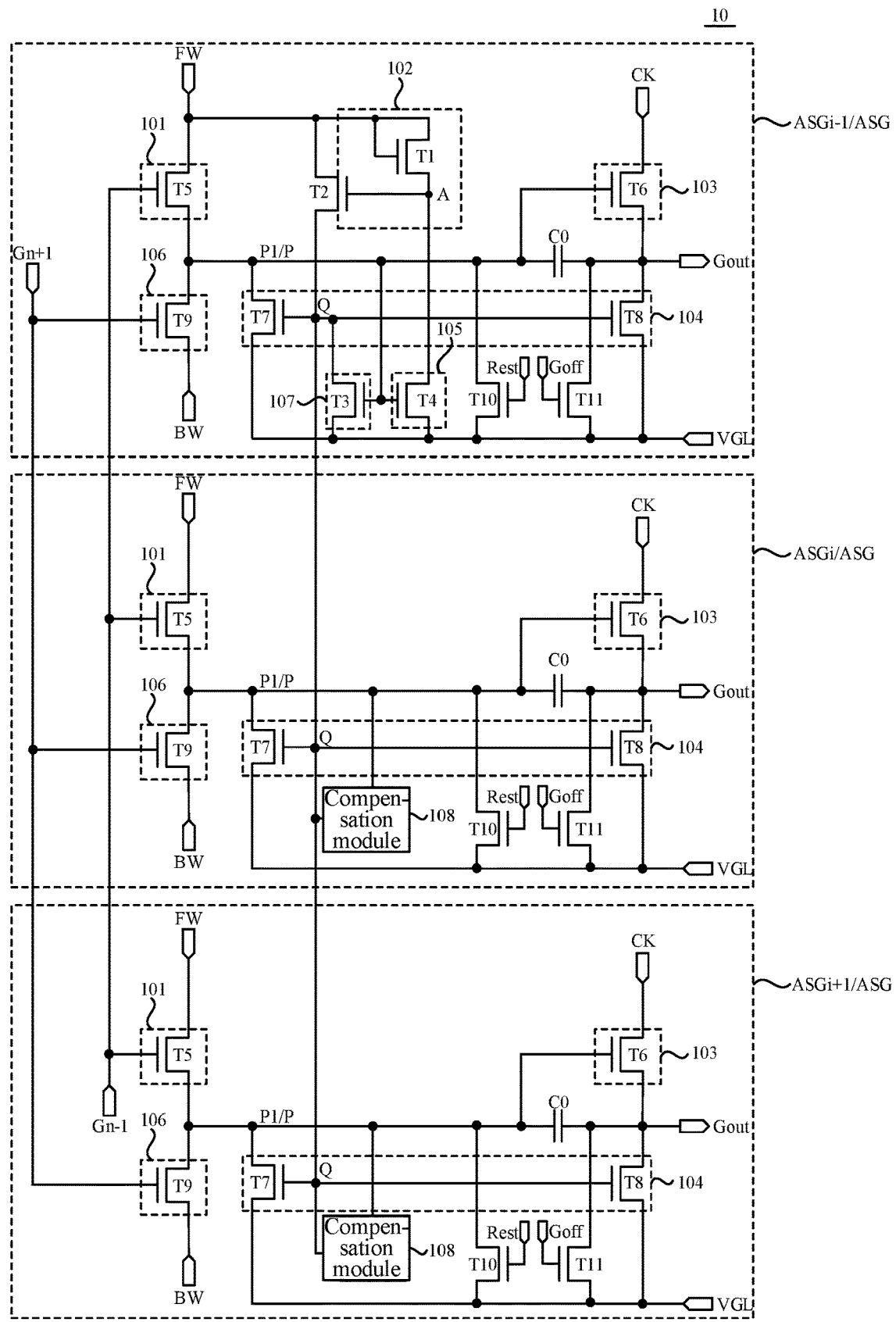
FIG. 21 is a structural schematic diagram of another shift register unit group according to an embodiment of the present disclosure.

In an embodiment, FIG. 21 is a structural schematic diagram of another shift register unit group according to an embodiment of the present disclosure. As shown in FIG. 21, in the same shift register unit group 10, the pull-down control module 102 is located in the first shift register unit ASGi−1 while the other shift register units ASGi and ASGi+1 are not provided with the pull-down control module 102. In the same shift register unit group 10, each of shift register units ASGi and ASGi+1 except the first shift register unit ASGi−1 includes a compensation module 108. In the same shift register unit group 10, the compensation module 108 is electrically connected with the first node P and the second node Q. In this manner, the compensation module 108 is electrically connected with the first node P2 (P3) and the second node Q of the shift register unit ASGi (ASGI+1) that is provided with the pull-down control module 102 to compensate the parasitic capacitance at the first node P2 (P3) and the second node Q, so that the case where the interference at the first node P1 and the second node Q of the first shift register unit ASGi−1 are different from the interference at the first node P2 (P3) and the second node Q of other shift register units ASGi (ASGi+1) due to the difference between the parasitic capacitance at the first node P2 (P3) and the second node Q of the shift register unit ASGi (ASGi+1) and the parasitic capacitance at the first node P1 and the second node Q of the first shift register unit ASGi−1 can be avoided, thereby reducing the differences among the shift register units ASGi−1, ASGi and ASGi+1.

Figure 22:
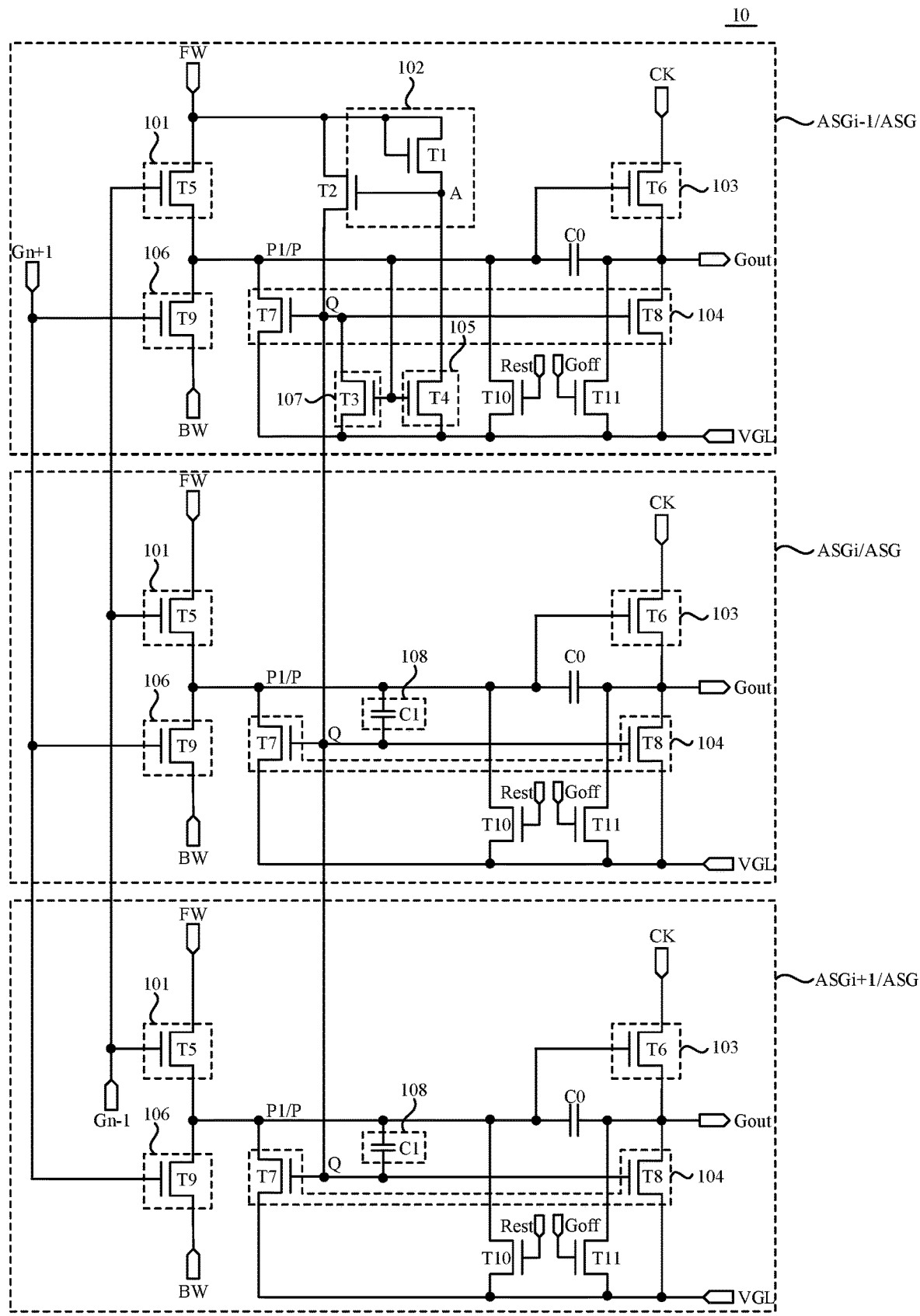
FIG. 22 is a structural schematic diagram of a circuit of another shift register unit group according to an embodiment of the present disclosure.

In an embodiment, FIG. 22 is a structural schematic diagram of a circuit of another shift register unit group according to an embodiment of the present disclosure. As shown in FIG. 22, the compensation module 108 may include at least one compensation capacitor C1. In the same shift register unit ASGi (ASGi−1), the first plate of the compensation capacitor C1 is electrically connected with the first node P2 (P3), and the second plate of the compensation capacitor C1 is electrically connected with the second node Q. In this manner, the parasitic capacitance at the first node P2 (P3) and the second node Q of the shift register unit ASGi (ASGi−1) can be compensated with the compensation capacitor C1.

Figure 23:
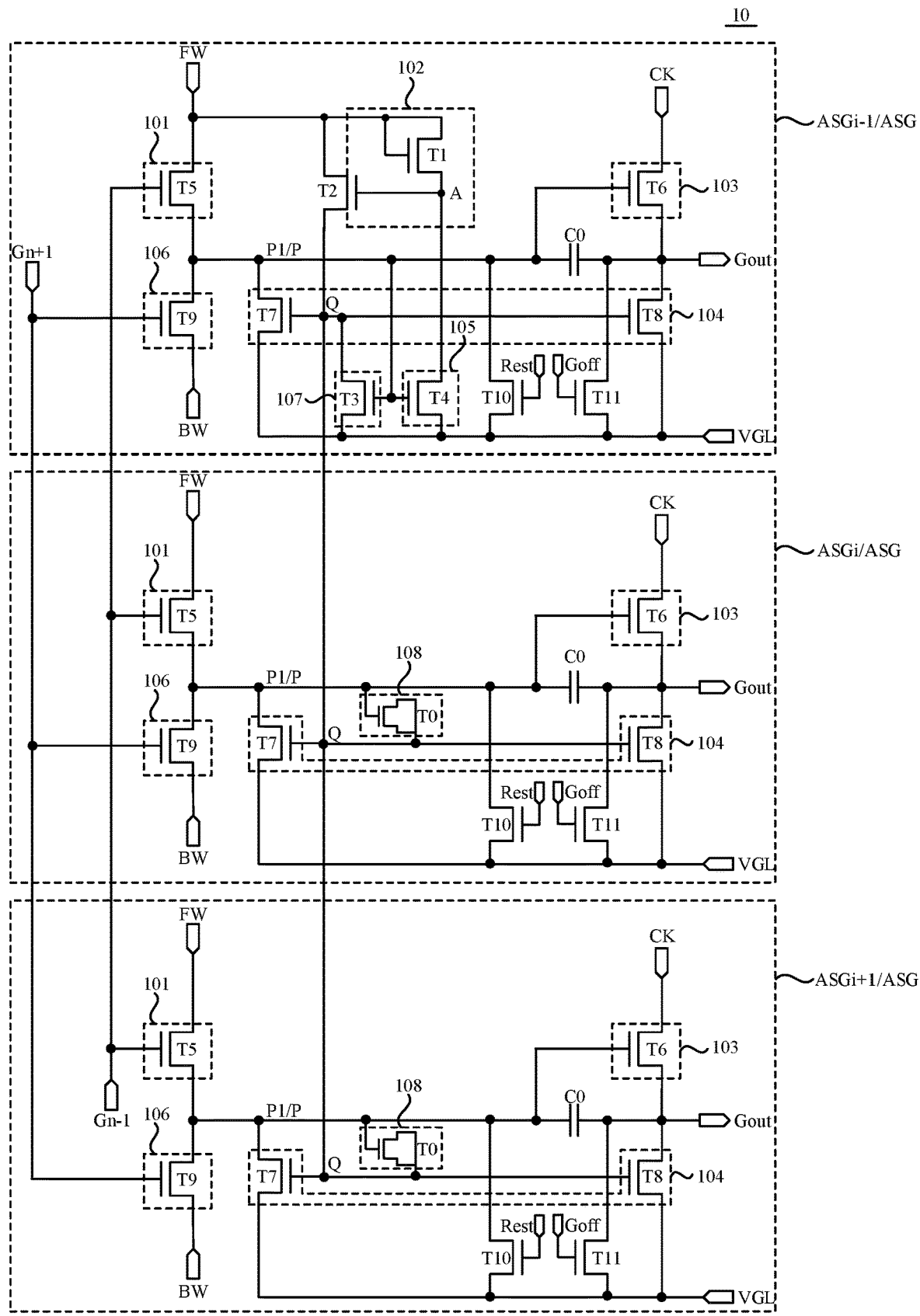
FIG. 23 is a structural schematic diagram of a circuit of another shift register unit group according to an embodiment of the present disclosure.

In an embodiment, FIG. 23 is a structural schematic diagram of a circuit of another shift register unit group according to an embodiment of the present disclosure. As shown in FIG. 23, the compensation module 108 may include at least one compensation transistor T0. In the same shift register unit ASGi (ASGi−1), the gate of the compensation transistor T0 is electrically connected with the first node P2 (P3), and the first plate and the second plate of the compensation transistor T0 are electrically connected with the second node Q. In this manner, the parasitic capacitance at the first node P2 (P3) and the second node Q of the shift register unit ASGi (ASGi−1) can be compensated with the compensation transistor T0.

Figure 24:
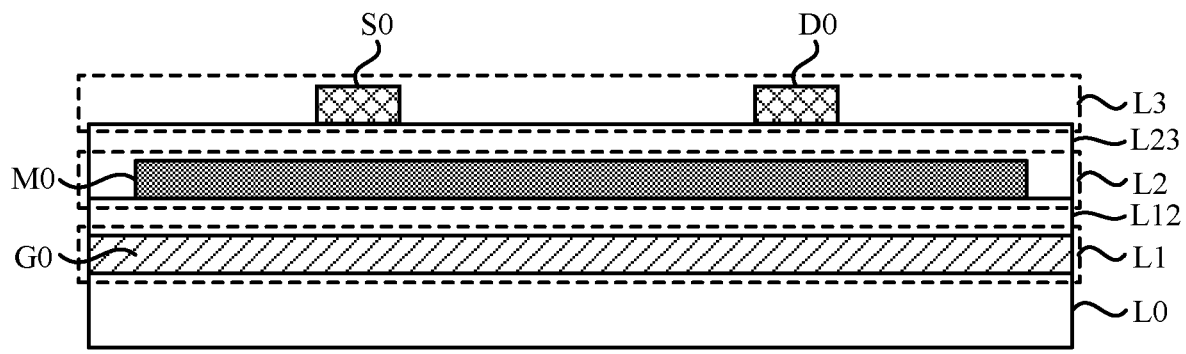
FIG. 24 is a structural schematic diagram of partial film layers of a shift register circuit according to an embodiment of the present disclosure.

In an embodiment, FIG. 24 is a structural schematic diagram of partial film layers of a shift register circuit according to an embodiment of the present disclosure. With reference to FIGS. 23 and 24, the shift register circuit includes a semiconductor layer L2, and a first metal layer L1 and a second metal layer L3 that are located on two sides of the semiconductor layer L2. The semiconductor layer L2 includes an active layer M0 of the compensation transistor T0. The first metal layer L1 includes the gate G0 of the compensation transistor T0, and the second metal layer L3 includes the first pole S0 and the second pole D0 of the compensation transistor T0. In this manner, the compensation transistor T0 is a bottom-gate transistor by providing the first metal layer L1 and the second metal layer L3 on two sides of the semiconductor layer L2 so that, and the magnitude of the parasitic capacitance formed by the compensation transistor T0 can be controlled by controlling the overlapping area between the gate pole G0 of the first metal layer L1 and the active layer M0 located on the semiconductor layer L2 and controlling the overlapping area between the first pole S0 and the second pole D0 located on the second metal layer L3 and the semiconductor layer L2.

It is to be noted that in addition to the above-mentioned film layers, the shift register circuit may further include a base substrate L0, the semiconductor layer L2, the first metal layer L1 and the second metal layer L3 are all located on the base substrate L0, and insulating layers are provided among the semiconductor layer L2, the first metal layer L1 and the second metal layer L3.

Figure 25:
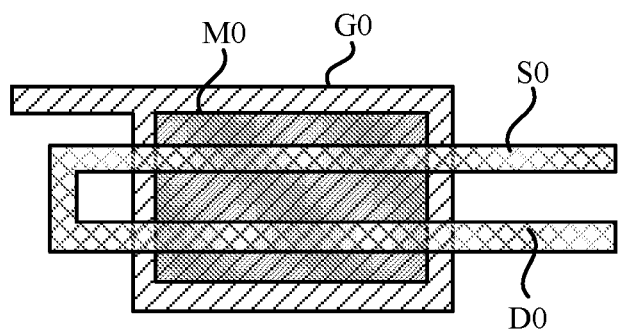
FIG. 25 is a schematic top view of film layers of a compensation transistor according to an embodiment of the present disclosure.

In an embodiment, FIG. 25 is a schematic top view of film layers of a compensation transistor according to an embodiment of the present disclosure. As shown in FIG. 25, the gate G0 of the compensation transistor T0 may be rectangular, the gate G0 of the compensation transistor T0 may be electrically connected with the first node P1 (P2) through a lead-out wire, and the first pole S and the second pole D0 of the compensation transistor T0 are electrically connected with the second node Q to form a closed-loop structure.

Figure 26:
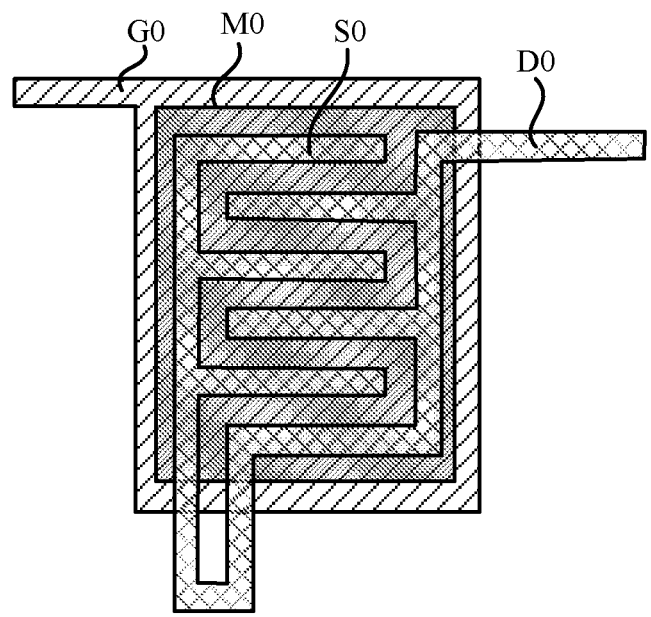
FIG. 26 is a schematic top view of film layers of another compensation transistor according to an embodiment of the present disclosure.

It is to be noted that FIG. 25 is an illustrative drawing of the embodiments of the present disclosure and illustratively shows the structure of the compensation transistor T0, and the structure of the compensation transistor T0 in the embodiments of the present disclosure is not limited thereto and may be other structures (as shown in FIG. 26).

Figure 27:
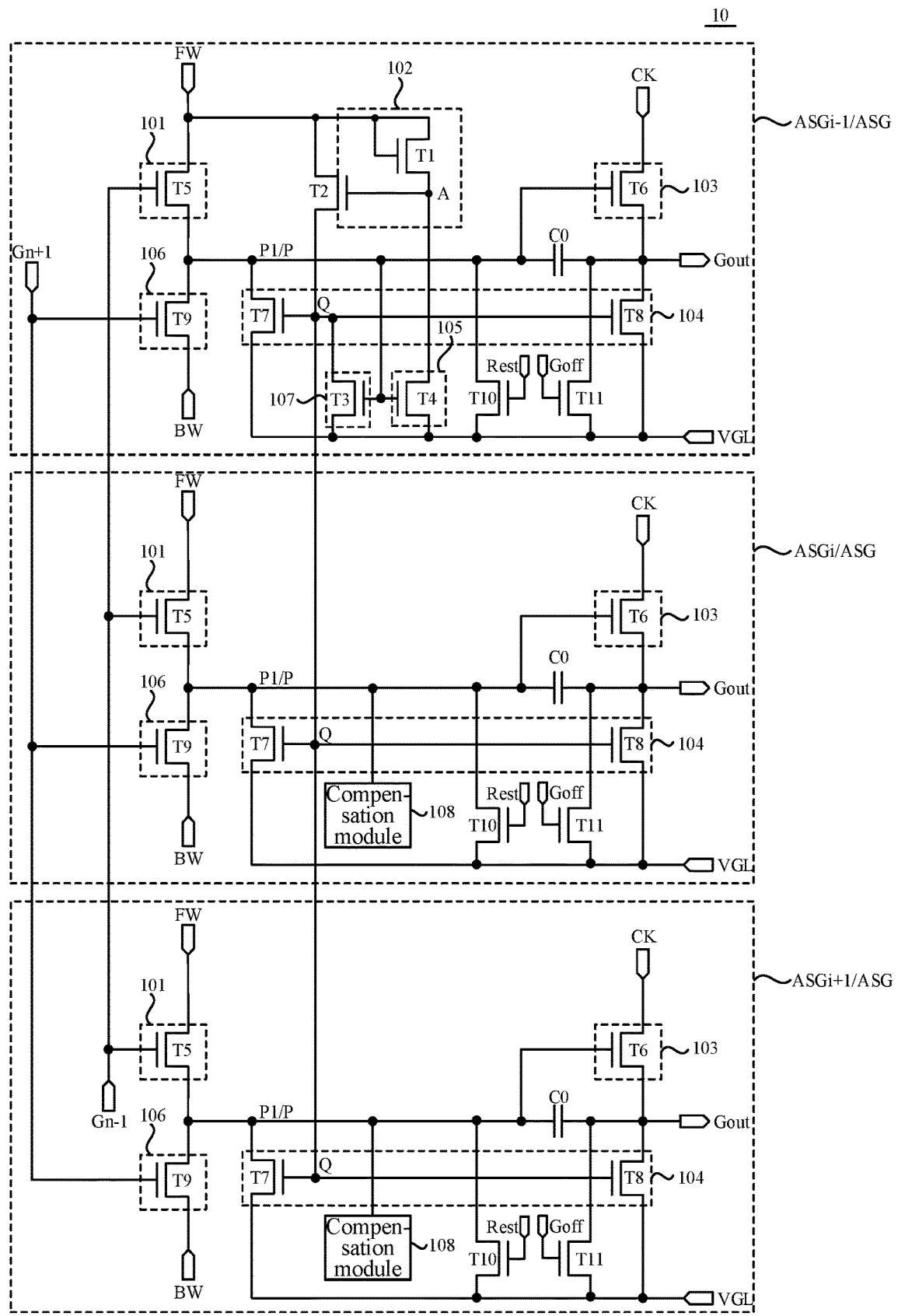
FIG. 27 is a structural schematic diagram of another shift register unit group according to an embodiment of the present disclosure.
Figure 28:
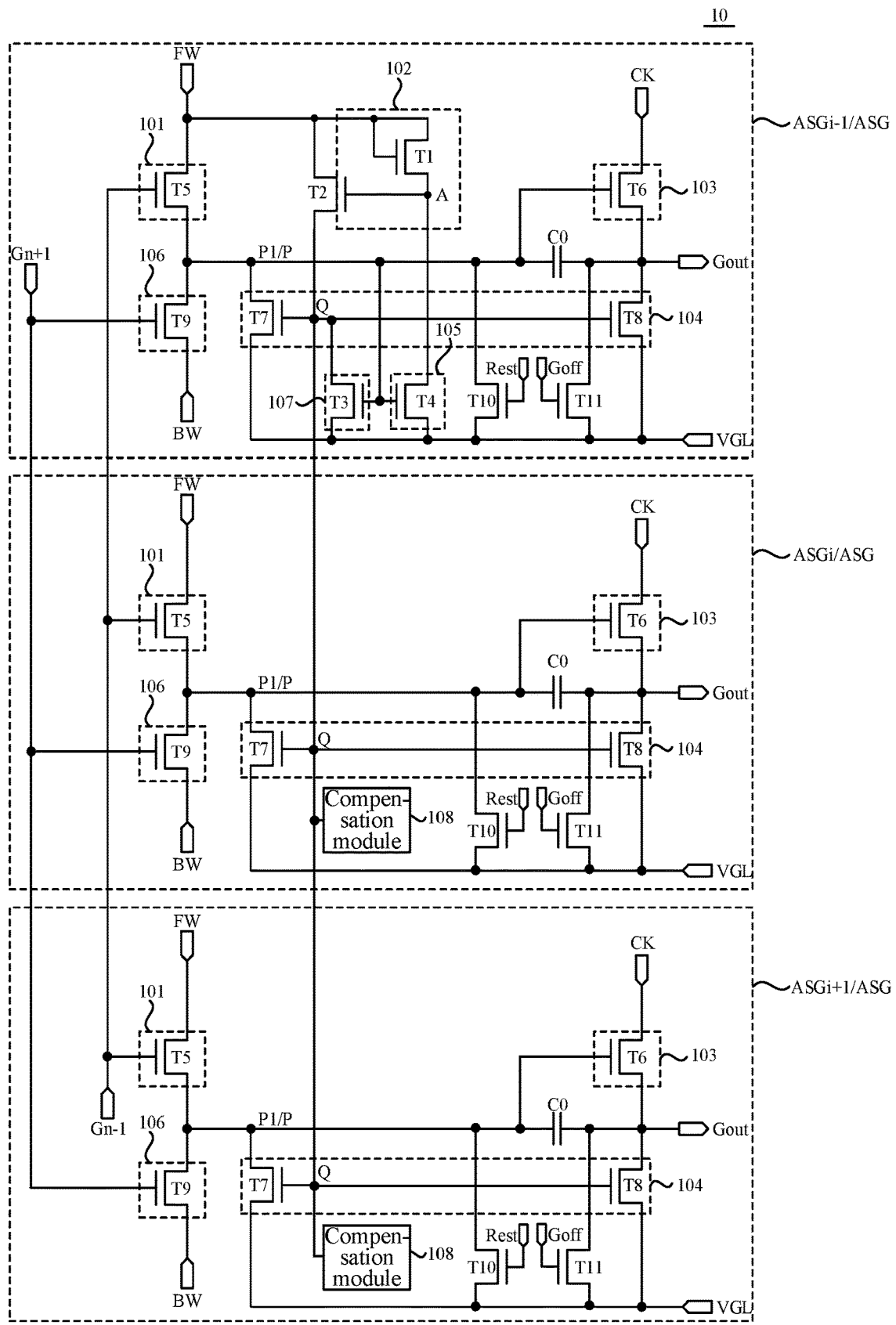
FIG. 28 is a structural schematic diagram of another shift register unit group according to an embodiment of the present disclosure.

It is to be understood that FIGS. 21 to 23 are illustrative drawings of the present disclosure and illustratively show that the compensation module 108 in each of the other shift register units except the first shift register unit is electrically connected with the first node P and the second node Q; and in the embodiment of the present disclosure, as shown in FIG. 27, the compensation module 108 of each of other shift register units except the first shift register unit may be electrically connected with the first node P to compensate the parasitic capacitance of the first node P, or as shown in FIG. 28, the compensation module 108 of each of other shift register units except the first shift register unit may be electrically connected with the second node Q to compensate the parasitic capacitance of the second node Q.

Figure 29:
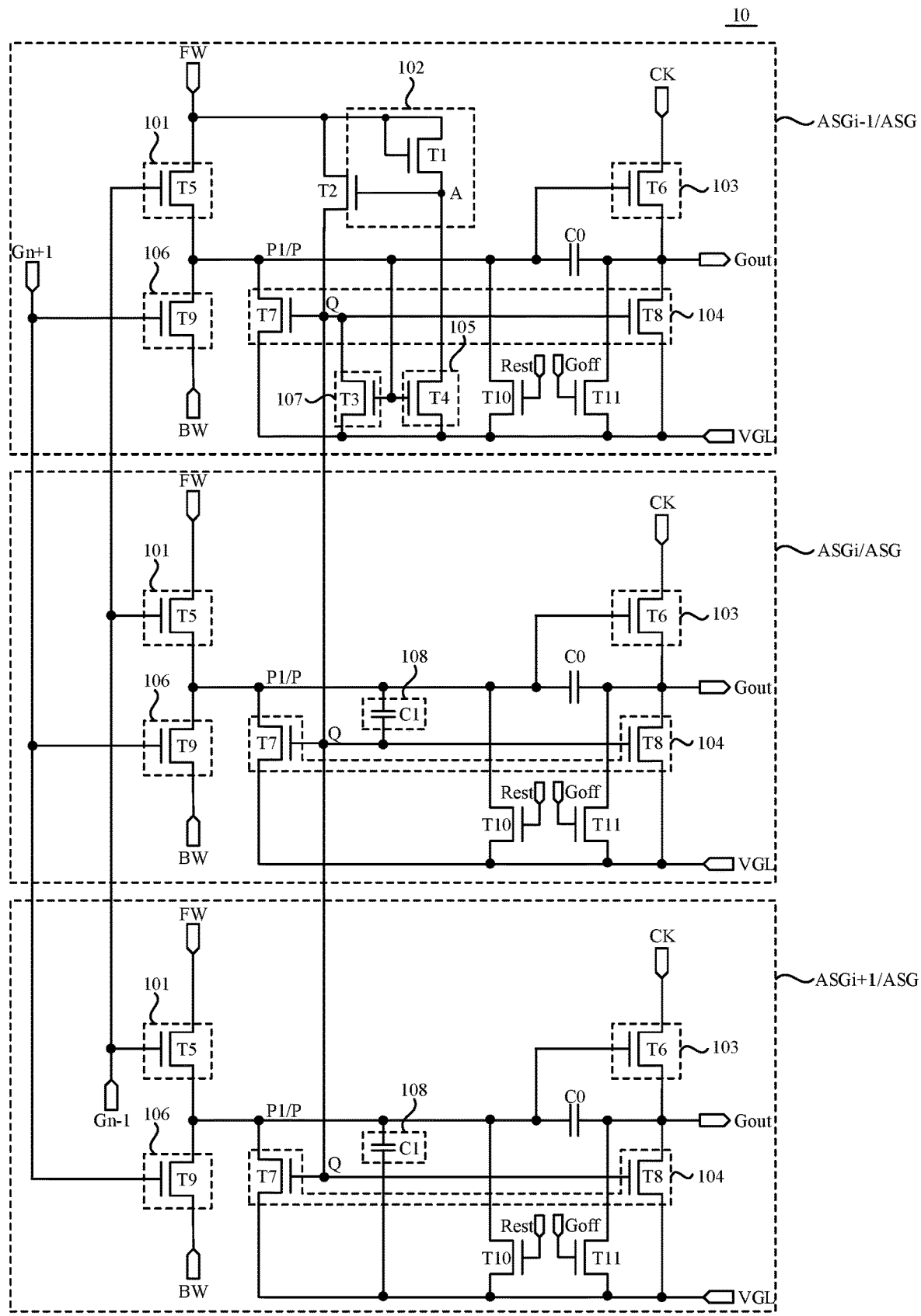
FIG. 29 is a structural schematic diagram of a circuit of another shift register unit group according to an embodiment of the present disclosure.
Figure 30:
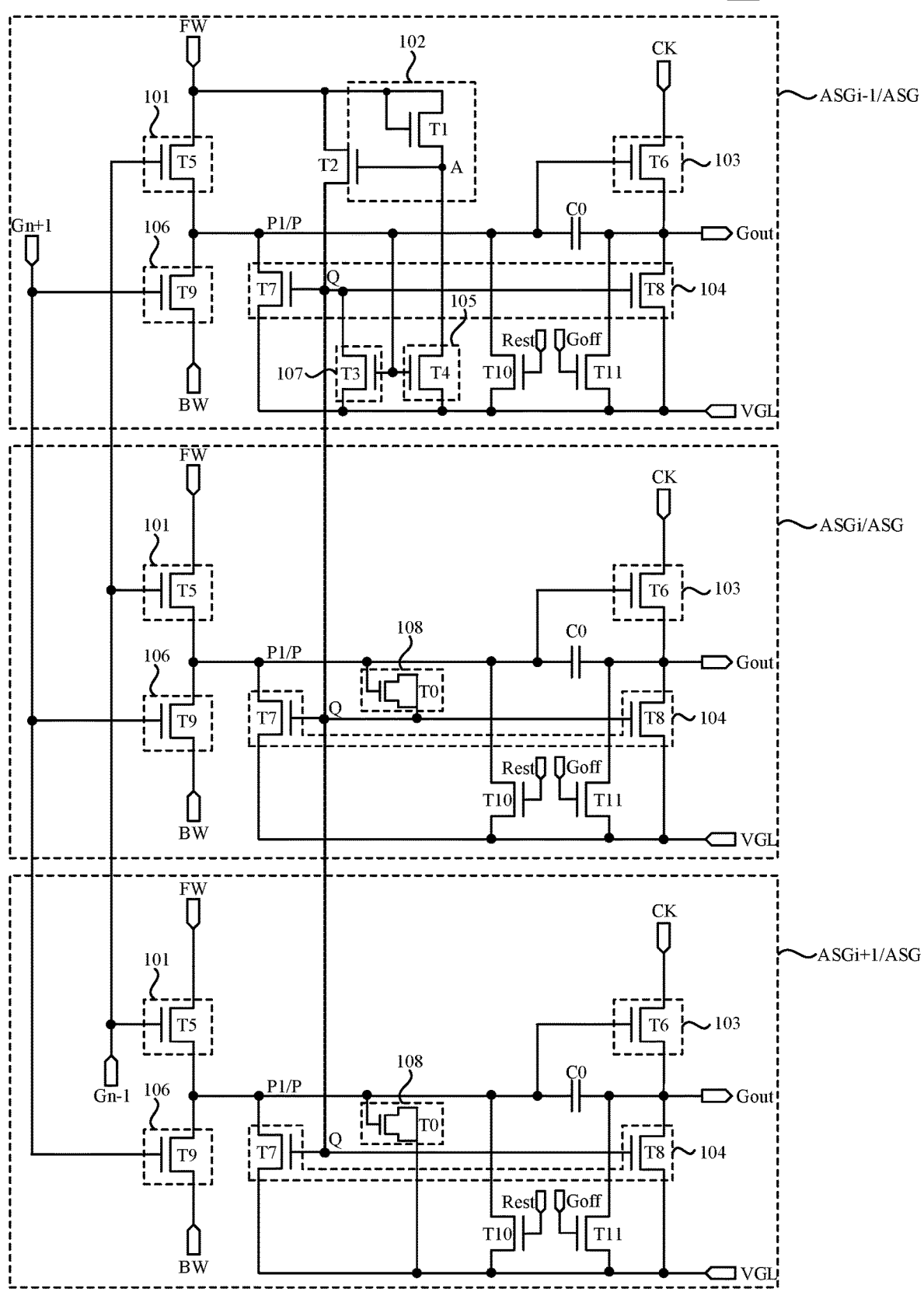
FIG. 30 is a structural schematic diagram of a circuit of another shift register unit group according to an embodiment of the present disclosure.

In an embodiment, the following is described by using an example in which the compensation module of the shift register unit is electrically connected with the first node. As shown in FIG. 29, when the compensation module 108 includes at least one compensation capacitor C0, the first plate of the compensation capacitor C1 is electrically connected with the first node P2 (P3), and the second plate of the compensation capacitor C1 is electrically connected with the first level terminal VGL; or as shown in FIG. 30, when the compensation module 108 includes at least one compensation transistor T0, the gate of the compensation transistor T0 is electrically connected with the first node P2 (P3), and both the first pole and the second pole of the compensation transistor T0 are electrically connected with the first level terminal VGL.

In the above embodiments, only the structure in which the pull-down control module includes the first transistor and the second transistor in the same shift register unit group is illustratively described, and in the embodiments of the present disclosure, the structure of the pull-down control module is not limited thereto. The technical solutions of the embodiments of the present disclosure will be illustratively described with reference to the following typical embodiments.

Figure 31:
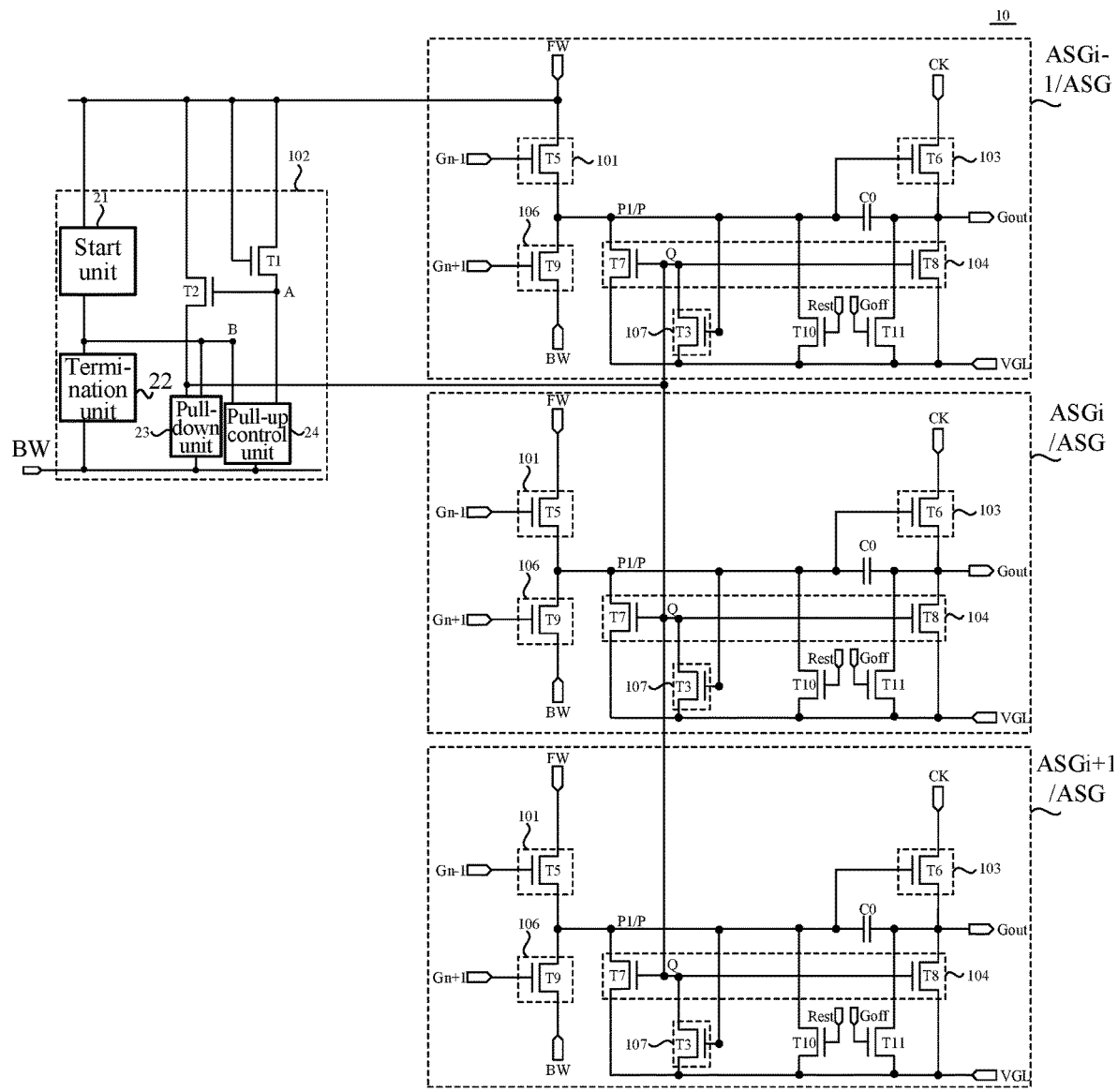
FIG. 31 is a structural schematic diagram of another shift register unit group according to an embodiment of the present disclosure.

In an embodiment, FIG. 31 is a structural schematic diagram of another shift register unit group according to an embodiment of the present disclosure. As shown in FIG. 31, in addition to the first transistor T1 and the second transistor T2, the pull-down control module 102 may include a start unit 21, a termination unit 22, a pull-down unit 23 and a pull-up control unit 24, and at this point, the shift register unit may include a reset signal terminal BW. In the same shift register unit group 10, the start unit 21 is electrically connected with the signal input terminal FW and the termination unit 22 respectively, and the start unit 21 and the termination unit 22 are electrically connected with a fourth Node B. The start unit 21 is used for controlling the input signal Fw from the signal input terminal FW to be transmitted to the fourth node B in a start stage, and the start stage is located before the enable level of the scan signal outputted from each shift register unit of the shift register unit group. The termination unit 22 is further electrically connected with the reset signal terminal BW. The termination unit 22 is used for controlling the reset signal Bw from the reset signal terminal BW to be transmitted to the fourth node B in a termination stage, and the termination stage is located after the enable level of the scan signal outputted by each shift register unit ASG of the shift register unit group 10. The pull-up control unit 24 is electrically connected with the third node A, the fourth node B and the reset signal terminal BW respectively. The pull-up control unit 24 is used for controlling the reset signal Bw from the reset signal terminal BW to be transmitted to the third node A according to the potential of the fourth node B. The pull-down unit 23 is electrically connected with the second node Q, the reset signal terminal BW and the fourth node B respectively. The pull-down unit 23 is used for controlling the reset signal Bw from the reset signal terminal BW to be transmitted to the second node Q according to the potential of the fourth node B.

In an embodiment, the shift register units ASGi−1, ASGi and ASGi+1 of the shift register unit group 10 sequentially output the enable level of the scan signal, and before the shift register unit ASGi−1 outputs the enable level of the scan signal, the input module 101 of the shift register unit ASGi−1 transmits the input signal Fw from the signal input terminal FW of the shift register unit ASGi−1 to the first node P1 of the shift register unit ASGi−1 to charge the first node P1, which may be considered as the start stage. At this point, the input signal from the signal input terminal FW of the shift register unit ASGi−1 is transmitted to the fourth node B through the start unit 21 in the pull-down control module 102 so that the potential of the fourth node B is sufficient to control the pull-down unit 23 and the pull-up control unit 24 to be turned on. The pull-up control unit 24 transmits the reset signal Bw from the reset signal terminal BW to the third node A so that the second transistor T2 electrically connected with the third node A is turned off and the second transistor T2 is incapable of transmitting the input signal Fw from the signal input terminal FW to the second node Q of the shift register unit ASGi−1. Meanwhile, the pull-down unit 23 transmits the reset signal Bw from the reset signal terminal BW to the second node Q to reset the second node Q, ensuring that the potential of the second node Q does not turn on the pull-down module 104 of each of shift register units ASGi−1, ASGi and ASGi+1 of the shift register unit group 10 and preventing the potential used for charging the first node P by the input module 101 of each of shift register units ASGi−1, ASGi and ASGi+1 from being affected because the pull-down module 104 is turned on. After that stage, the shift register unit ASGi−1 starts outputting the enable level of the scan signal, and the start unit 21 does not transmit the input signal from the signal input terminal FW to the fourth node B. When no other signal is inputted to the fourth node B, the fourth node B remains at the potential of the input signal written in the start stage so that the second node Q also remains at the potential of the reset signal Bw. The potential of the first node P of each of shift register units ASGi−1, ASGi and ASGi+1 of the shift register unit group 10 is determined by the respective input module 101 of each of shift register units ASGi−1, ASGi and ASGi+1. After the shift register unit ASGi+1 of the shift register unit group 10 outputs the enable level of the scan signal, and the termination unit 22 of the pull-down control module 102 transmits the reset signal Bw from the reset signal terminal BW to the fourth node B so that the potential of the fourth node B becomes the potential of the reset signal Bw. At this point, the potential of the fourth node B controls the pull-down unit 23 and the pull-up control unit 24 to be turned off, and the reset signal Bw from the reset signal terminal BW is incapable of being transmitted to the third node A and the second node Q, so that the second transistor T2 is turned on under the control of the input signal Fw transmitted from the first transistor T1 and transmits the input signal Fw to the second node Q. At this point, the potential of the second node Q is capable of controlling the pull-down module 104 in each of shift register units ASGi−1, ASGi and ASGi+1 of the shift register unit group 10 to be turned on so that the pull-down module 104 in each of shift register units ASGi−1, ASGi and ASGi+1 is capable of transmitting the first level signal Vgl from the first level terminal VGL to the respective first node P and signal output terminal Gout of each of shift register units ASGi−1, ASGi and ASGi+1 respectively, and in this manner, each of shift register units ASGi−1, ASGi and ASGi+1 of the shift register unit group 10 continuously outputs the disable level of the scan signal.

In this manner, by providing the start unit 21, the termination unit 22, the pull-down unit 23 and the pull-up control unit 24 in the pull-down control module 102, the accuracy of the scan signal outputted from each of shift register units ASGi−1, ASGi and ASGi+1 of the shift register unit group 10 to which the pull-down control module 102 belongs can be ensured, thereby improving the accuracy of the scan signal outputted from the entire shift register circuit. The start unit 21, the termination unit 22, the pull-down unit 23 and the pull-up control unit 24 in the pull-down control module 102 may all be composed of an active device or a passive device, which is not specifically limited to the embodiments of the present disclosure.

Figure 32:
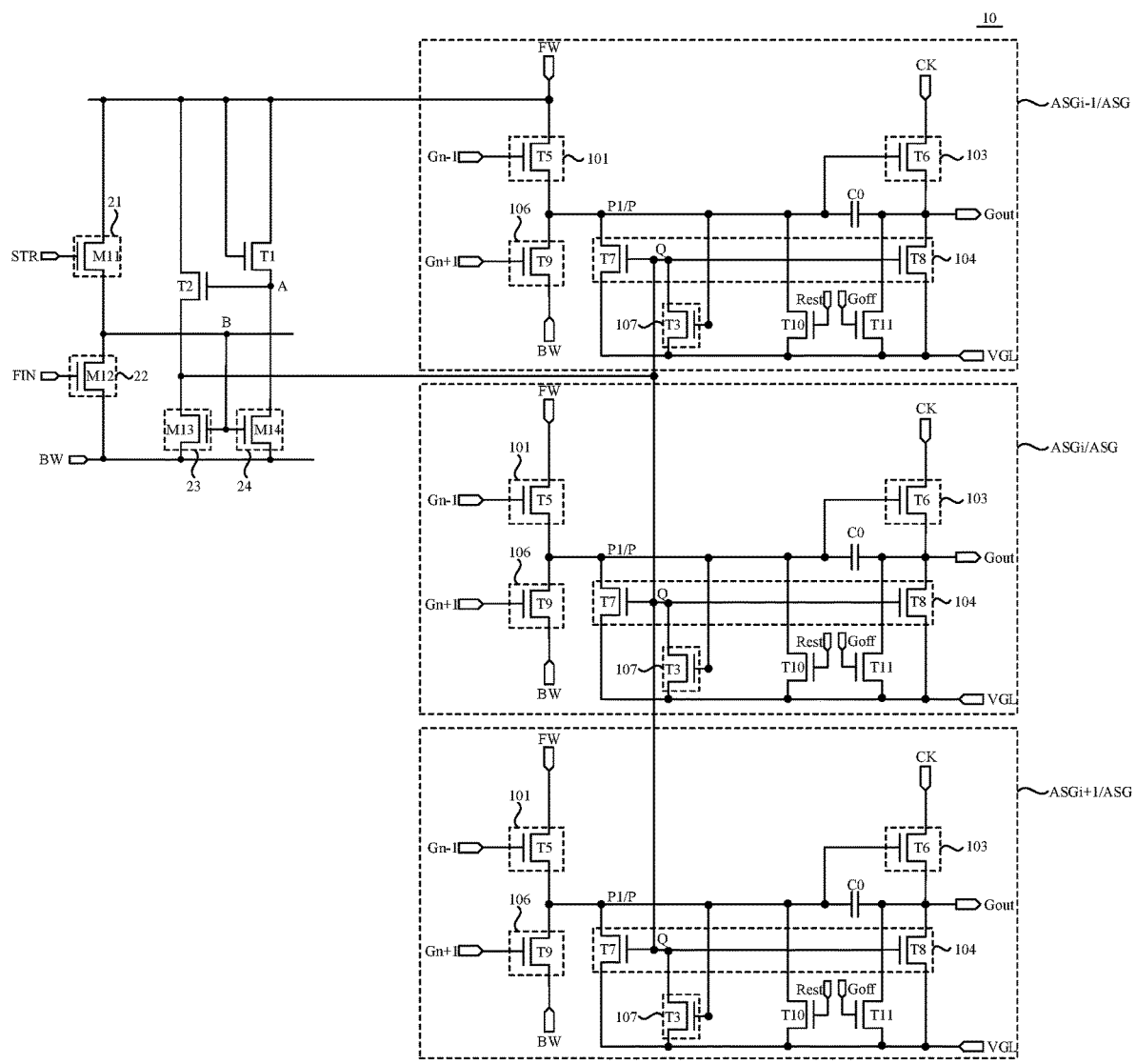
FIG. 32 is a structural schematic diagram of a circuit of another shift register unit group according to an embodiment of the present disclosure.

In an embodiment, FIG. 32 is a structural schematic diagram of a circuit of another shift register unit group according to an embodiment of the present disclosure. As shown in FIG. 32, when the start unit 21 includes a start transistor M11, the shift register unit group further includes a start control terminal STR. At this point, the gate of the start transistor M11 is electrically connected with the start control terminal STR, the first pole of the start transistor M11 is electrically connected with the signal input terminal FW, and the second pole of the start transistor M11 is electrically connected with the fourth node B, so that the start transistor M11 is capable of being turned on or off under the control of a start control signal Vstr from the start control terminal STR.

In an embodiment, with continued reference to FIG. 32, when the termination unit 22 includes the termination transistor M12, the shift register unit group 10 may further include a termination control terminal FIN. At this point, the gate of the termination transistor M12 is electrically connected with the termination control terminal FIN, the first pole of the termination transistor M12 is electrically connected with the reset signal terminal BW, and the second pole of the termination transistor M12 is electrically connected with the fourth node B, so that the termination transistor M12 is capable of being turned on under the control of a termination control signal Vfin from the termination control terminal FIN.

In an embodiment, with continued reference to FIG. 32, the pull-up control unit 14 may include a pull-up control transistor M14. The gate of the pull-up control transistor M14 is electrically connected with the fourth node B, the first pole of the pull-up control transistor M14 is electrically connected with the reset signal terminal BW, and the second pole of the pull-up control transistor M14 is electrically connected with the third node A, so that the pull-up control transistor M14 is capable of being turned on or off under the control of the potential of the fourth node B, so as to control the potential of the third node A.

In an embodiment, with continued reference to FIG. 32, the pull-down unit 23 may include a pull-down transistor M13. The gate of the pull-down transistor M13 is electrically connected with the fourth node B, the first pole of the pull-down transistor M13 is electrically connected with the reset signal terminal BW, and the second pole of the pull-down transistor M13 is electrically connected with the second Node Q. In this manner, the pull-down transistor M13 is capable of transmitting the reset signal from the reset signal terminal BW to the second node Q under the control of the potential of the fourth node B.

Figure 33:
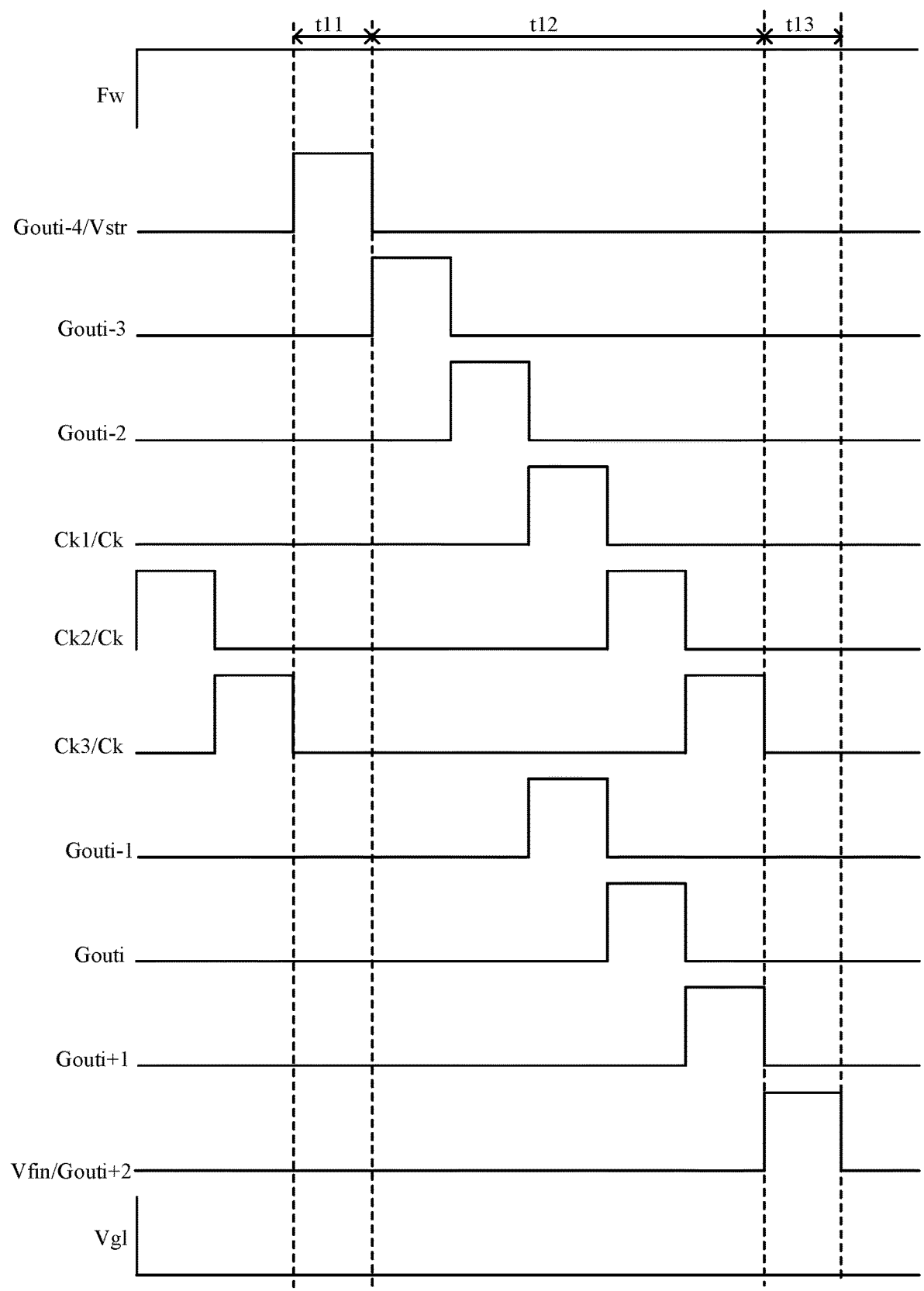
FIG. 33 is a drive timing diagram of another shift register unit group according to an embodiment of the present disclosure.

In an embodiment, the following is described by using an example in which all transistors in the shift register unit group are N-type transistors. FIG. 33 is a drive timing diagram of another shift register unit group according to an embodiment of the present disclosure. With reference to FIGS. 32 and 33, in the start stage t11 that is before the shift register unit ASGi−1 starts outputting the enable level of the scan signal, the scan control signal Gouti−4 of the scan control terminal Gn−1 of the shift register unit ASGi−1 control the input terminal 10 to transmit the input signal Fw from the signal input terminal FW to the first node P1 of the scan control terminal Gn−1 to charge the first node P1. Meanwhile, the high-level start control signal Vstr from the start control terminal STR controls the start transistor M11 to be turned on so that the start transistor M11 transmits the high-level input signal Fw from the signal input terminal FW to the fourth node B, and in this manner, the potential of the fourth node B becomes at a high level so that both the pull-down transistor M13 and the pull-up control transistor M14 are turned on. The pull-up control transistor M14 transmits the low-level reset signal Bw from the reset signal terminal BW to the third node A so that the potential of the third node A controls the second transistor T2 to be in an off state and the input signal Fw from the signal input terminal FW is incapable of being transmitted to the second node Q. The pull-down transistor M13 transmits the low-level reset signal Bw from the reset signal terminal BW to the second node Q so that the potential of the second node Q is at a low level and the pull-down module 104 of the shift register unit ASGi−1 is incapable of transmitting the first level signal Vgl from the first level terminal VGL to the first node P1 and the signal output terminal Gout of the shift register unit ASGi−1, and in this manner, the potential of the first node P1 of the shift register unit ASGi−1 is the potential of the input signal Fw transmitted from the input module 101 of the shift register unit ASGi−1 so that the first node P1 controls the output module 103 of the shift register unit ASGi−1 to transmit the clock signal Ck1 from the clock signal terminal CK of the shift register unit ASGi−1 to the signal output terminal Gout of the shift register unit ASGi−1.

In the stage t12 between the start stage t11 and the termination stage t13, the scan signal outputted from the shift register unit ASGi−1 is consistent with the clock signal Ck1 received by the clock signal terminal of the shift register unit ASGi−1, the start control signal Vstr from the start control terminal STR becomes at a low level, the start transistor M11 is turned off, the potential of the fourth node B remains at a high level because no other signals are written to the fourth node B, the potential of the second node Q remains at a low level, and the pull-down module of each of shift register units ASGi−1, ASGi and ASGi+1 are in an off state, so that the potential of the first nodes P1, P2 and P3 of each of shift register units ASGi−1, ASGi and ASGi+1 is related to the charging condition of the respective input modules 101 of each of shift register units ASGi−1, ASGi and ASGi+1 to the first nodes P1, P2 and P3.

In the termination stage t13 after the shift register unit ASGi+1 outputs the enable level of the scan signal, the termination control signal Vfin from the termination control terminal FIN controls the termination transistor M12 to be turned on, the termination transistor M12 transmits the low-level reset signal Bw from the reset signal terminal BW to the fourth node B, and the potential of the fourth node B becomes at a low level, so that both the pull-down transistor M13 and the pull-up control transistor M14 are turned off. The pull-down transistor M13 is incapable of transmitting the reset signal Bw to the second node Q, and the pull-up control transistor M14 is incapable of transmitting the reset signal Bw to the third node A, so that the potential of the third node A becomes the high-level input signal Fw transmitted from the first transistor T1. The second transistor T2 is turned on, and the input signal Fw from the signal input terminal FW is transmitted to the second node Q through the second transistor T2, so that the potential of the second node Q becomes at a high level. The pull-down module 104 of each of shift register units ASGi−1, ASGi and ASGi+1 transmits the first level signal Vgl from the first level terminal VGL to the first node P and the signal output terminal Gout of each of shift register units ASGi−1, ASGi and ASGi+1 so that each of shift register units ASGi−1, ASGi and ASGi+1 keeps outputting the disable level of the scan signal.

It is to be understood that in the above embodiments, the stage in which the input module 101 of the shift register unit ASGi−1 charges the first node P1 of the shift register unit ASGi−1 and the start stage are the same stage, and at this point, the scan control terminal Gn−1 of the shift register unit ASGi−1 also serves as the start control terminal STR of the shift register unit group 10. Meanwhile, the enable level stage of the first scan signal in the shift register unit group of the next stage of the shift register unit group 10 of the current stage and the termination stage are the same stage, and at this point, the signal output terminal of the shift register unit that first outputs the enable level of the scan signal in the shift register unit group of the next stage is electrically connected with the termination control terminal FIN of the shift register unit group of the current stage. In this manner, it is not necessary to provide an additional start control signal and a termination control signal for each shift register unit group, and the number of signal lines for transmitting signals is reduced, thereby reducing the size of the shift register circuit. Of course, unless otherwise specifically limited, the start stage and the termination stage may be any stage that meets the requirements, and those skilled in the art can design such stages according to requirements, which is not specifically limited to the embodiments of the present disclosure.

Figure 34:
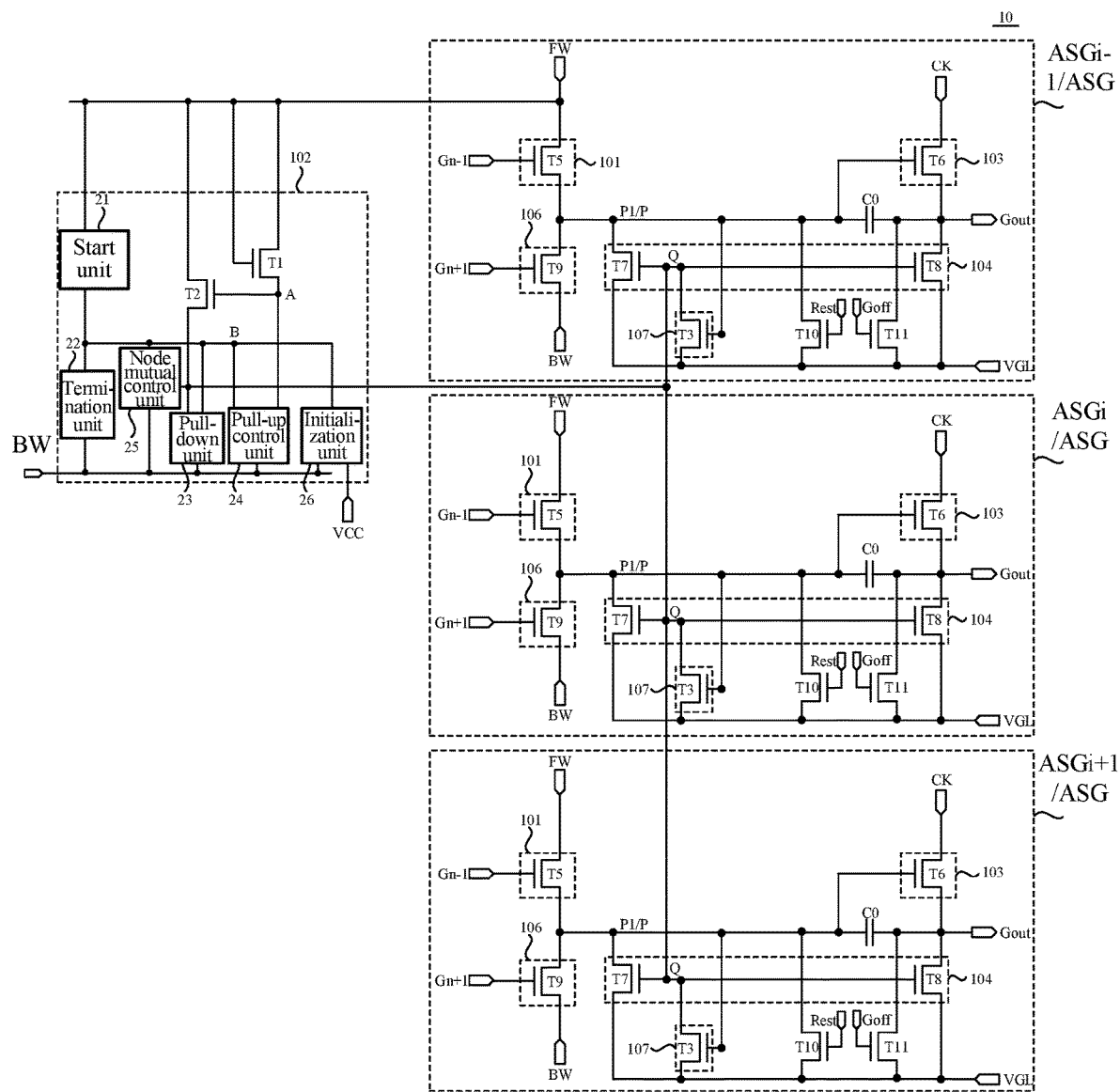
FIG. 34 is a structural schematic diagram of another shift register unit group according to an embodiment of the present disclosure.

On the basis of the above embodiments, optionally, FIG. 34 is a structural schematic diagram of another shift register unit group according to an embodiment of the present disclosure. As shown in FIG. 34, the pull-down control module 102 may further include an initialization unit 26, and at this point, the shift register unit group 10 further includes a fixed voltage terminal VCC. In the same shift register unit group 10, the initialization unit 26 is electrically connected with the fixed voltage terminal VCC, the reset signal terminal BW and the fourth node B respectively. The initialization unit 26 is used for transmitting the reset signal Bw from the reset signal terminal BW to the fourth node B in an initialization stage and transmitting a fixed voltage signal Vcc from the fixed voltage terminal VCC to the fourth node B in a potential holding stage, where the initialization stage is located before the potential holding stage, and the potential holding stage is located between the start stage and the termination stage.

It is to be understood that when the potential holding stage is located between the start stage and the termination stage and the initialization stage is located before the potential holding stage, the initialization stage may overlap with the start stage, or the initialization stage may be located before the start stage, or the initialization stage may be located between the start stage and the potential holding stage, which is not specifically limited to the embodiments of the present disclosure.

In an embodiment, in the initialization stage, the initialization unit 26 transmits the reset signal Bw from the reset signal terminal BW to the fourth node B to initialize the fourth node B, so that the potential of the fourth node B is the voltage of the reset signal Bw, so as to prevent the potential of the fourth node B in the previous drive cycle from affecting the drive process of the current drive cycle. After the initialization stage, the circuit enters the potential holding stage, and if no other potential is written to the fourth node B, the initialization unit 26 controls the fixed voltage signal Vcc from the fixed voltage terminal VCC to be transmitted to the fourth node B so that the potential of the fourth node B is consistent with the fixed voltage signal Vcc from the fixed voltage terminal VCC. In this manner, when no other signal is inputted, it can be ensured that the potential of the fourth node B controls the pull-down unit 23 and the pull-up control unit 24 to remain in an on state, which means that the potential of the second node Q in the shift register unit is consistent with the reset signal Bw, thereby ensuring that between the start stage and the termination stage, each of shift register units ASGi−1, ASGi and ASGi+1 can accurately output corresponding scan signals.

Figure 35:
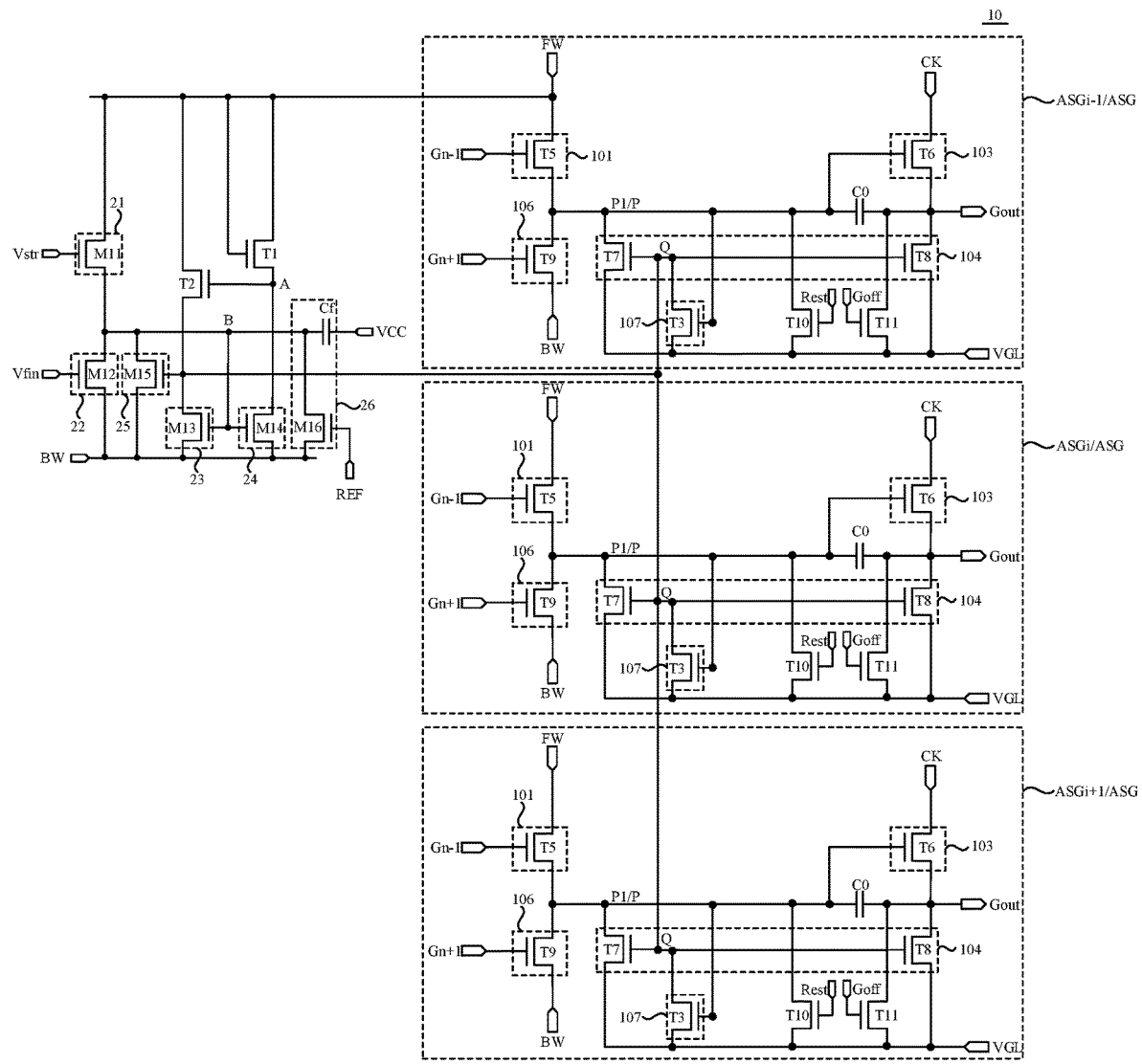
FIG. 35 is a structural schematic diagram of a circuit of another shift register unit group according to an embodiment of the present disclosure.

In an embodiment, FIG. 35 is a structural schematic diagram of a circuit of another shift register unit group according to an embodiment of the present disclosure. As shown in FIG. 35, when the initialization unit 26 includes an initialization transistor M16 and an initialization capacitor Cf, the shift register unit group 10 may further include an initialization control terminal REF. The gate of the initialization transistor M16 is electrically connected with the initialization control terminal REF, the first pole of the initialization transistor M16 is electrically connected with the reset signal terminal BW, and the second pole of the initialization transistor M16 is electrically connected with the fourth node B. The first plate of the initialization capacitor Cf is electrically connected with the fixed voltage terminal VCC, and the second plate of the initialization capacitor Cf is electrically connected with the fourth node B.

In this manner, in the initialization stage, the initialization control signal Vref from the initialization control terminal REF controls the initialization transistor M16 to be turned on so that the reset signal Bw from the reset signal terminal BW is transmitted to the fourth node B through the turned-on initialization transistor M16 to initialize the fourth node B. At this point, the potential at the first plate of the initialization capacitor Cf is consistent with the fixed voltage signal Vcc at the fixed voltage terminal VCC, and the potential at the second plate of the initialization capacitor Cf is consistent with the potential at the reset fourth node B, which means that the potential at the second plate of the initialization capacitor Cf is consistent with the reset signal Bw. In the potential holding stage, the initialization control signal Vref from the initialization control terminal REF controls the initialization transistor M16 to turn off so that the reset signal Bw from the reset signal terminal BW is incapable of being transmitted to the fourth node B, and under the coupling action of the initialization capacitor Cf, the initialization capacitor Cf is capable of coupling the fixed voltage signal Vcc from the fixed voltage terminal VCC that is electrically connected with the first plate of the initialization capacitor Cf to the fourth node B that is electrically connected with the second plate of the initialization capacitor Cf, so that the potential of the fourth node B is consistent with the fixed voltage signal Vcc.

In an embodiment, with continued reference to FIG. 34, the pull-down control module 102 may further include a node mutual control unit 25. In the same shift register unit group 102, the node mutual control unit 25 is electrically connected with the second node Q, the fourth node B and the reset signal terminal BW respectively. The node mutual control unit 25 is used for controlling the reset signal Bw from the reset signal terminal BW to be transmitted to the fourth node B according to the potential of the second node Q.

In this manner, when the potential of the second node Q controls the node mutual control unit 25 to be in an on state, the node mutual control unit 25 is capable of transmitting the reset signal Bw from the reset signal terminal BW to the fourth node B so that the potential of the fourth node B is consistent with the reset signal Bw. At this point, both the pull-down unit 23 and the pull-up control unit 24 are turned off under the control of the fourth node B so that the reset signal from the reset signal terminal BW is incapable of being transmitted to the second node Q and the third node A and thus the second node Q remains at a potential capable of controlling the node mutual control unit 25 to be turned on. On the contrary, when the potential of the second node Q is incapable of controlling the node mutual control unit 25 to be in an on state, the reset signal Bw from the reset signal terminal BW is incapable of being transmitted to the fourth node B so that the potential of the fourth node B is controlled by other units (for example, the start unit 21, the termination unit 22 or the initialization unit 26).

In an embodiment, with continued reference to FIG. 35, the node mutual control unit 25 may include a node mutual control transistor M15. The gate of the node mutual control transistor M15 is electrically connected with the second node Q, the first pole of the node mutual control transistor M15 is electrically connected with the reset signal terminal BW, and the second pole of the node mutual control transistor M15 is electrically connected with the fourth node B. In this manner, the node mutual control transistor M15 is capable of being turned on or off under the control of the potential of the second node Q to achieve the function of controlling the potential of the fourth node B based on the potential of the second node B.

Figure 36:
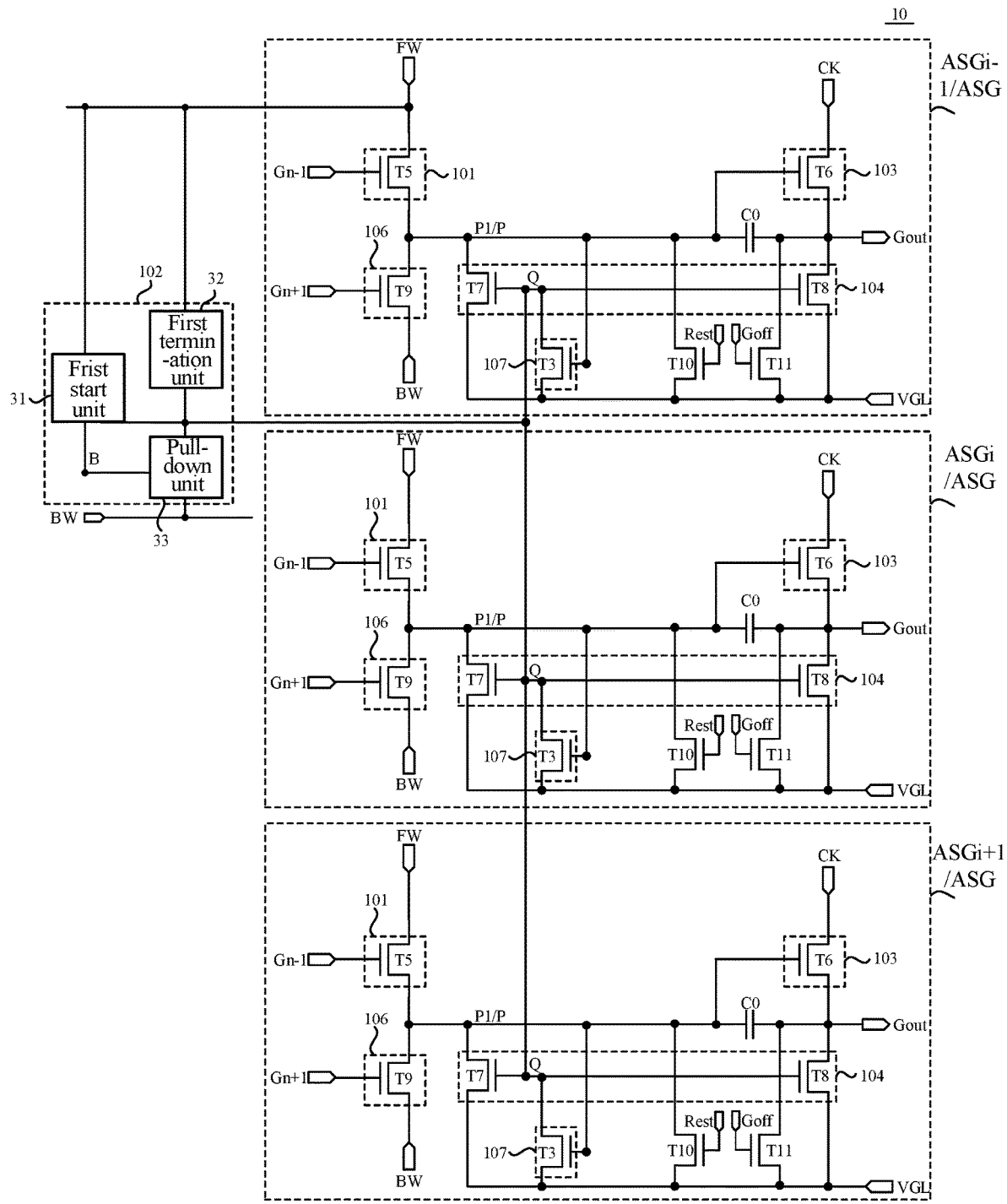
FIG. 36 is a structural schematic diagram of another shift register unit group according to an embodiment of the present disclosure.

In an embodiment, FIG. 36 is a structural schematic diagram of another shift register unit group according to an embodiment of the present disclosure. As shown in FIG. 36, when the shift register unit ASG includes the reset signal terminal BW, the pull-down control module 102 may include a first start unit 31, a first termination unit 32 and a pull-down unit 33. In the same shift register unit group 10, the first start unit 31 is electrically connected with the signal input terminal FW and the pull-down unit 37 respectively, and the first start unit 31 and the pull-down unit 33 are electrically connected with the fourth Node B. The first start unit 31 is used for transmitting the input signal Fw from the control signal input terminal FW to the fourth node Q in the initiation stage. The start stage is located before the stage in which each of shift register units ASGi−1, ASGi and ASGi+1 in the shift register unit group 10 outputs the enable level of the scan signal. The first termination unit 32 is electrically connected with the signal input terminal FW and the second node Q respectively. The first termination unit 32 is used for transmitting the input signal Fw from the control signal input terminal FW to the second node Q in the termination stage. The termination stage is located after the stage in which each of shift register units ASGi−1, ASGi and ASGi+1 in the shift register unit group 10 outputs the enable level of the scan signal. The pull-down unit 33 is further electrically connected with the reset signal terminal BW and the second node Q respectively. The pull-down unit 33 is used for controlling the reset signal Bw from the reset signal terminal BW to be transmitted to the second node Q according to the potential of the fourth node B.

In an embodiment, the shift register units ASGi−1, ASGi and ASGi+1 of the shift register unit group 10 sequentially output the enable level of the scan signal, and before the shift register unit ASGi−1 outputs the enable level of the scan signal, the input module 101 of the shift register unit ASGi−1 transmits the input signal Fw from the signal input terminal FW of the shift register unit ASGi−1 to the first node P1 of the shift register unit ASGi−1 to charge the first node P1, which may be considered as the start stage. At this point, the input signal from the signal input terminal FW of the shift register unit ASGi−1 is transmitted to the fourth node B through the first start unit 31 in the pull-down control module 102 so that the potential of the fourth node B is sufficient to control the pull-down unit 33 to be turned on. The pull-up unit 33 transmits the reset signal Bw from the reset signal terminal BW to the second node Q to reset the second node Q, ensuring that the potential of the second node Q does not turn on the pull-down module 104 of each of shift register units ASGi−1, ASGi and ASGi+1 in the shift register unit group 10 and preventing the potential used for charging the first node P by the input module 101 of each of shift register units ASGi−1, ASGi and ASGi+1 from being affected because the pull-down module 104 is turned on. After the start stage, the shift register unit ASGi−1 starts outputting the enable level of the scan signal, and the start unit 21 does not transmit the input signal from the signal input terminal FW to the fourth node B. When no other signal is inputted to the fourth node B, the fourth node B remains at the potential of the input signal written in the start stage so that the second node Q also remains at the potential of the reset signal Bw. The potential of the first node P of each of shift register units ASGi−1, ASGi and ASGi+1 in the shift register unit group 10 is determined by the respective input module 101 of each of shift register units ASGi−1, ASGi and ASGi+1. After the shift register unit ASGi+1 of the shift register unit group 10 outputs the enable level of the scan signal, the first termination unit 32 of the pull-down control module 102 transmits the input signal Fw from the signal input terminal FW to the second node Q so that the potential of the second node Q is capable of controlling the pull-down module 104 of each of shift register units ASGi−1, ASGi and ASGi+1 of the shift register unit group 10 to be turned on, and at this point, the pull-down module 104 of each of shift register units ASGi−1, ASGi and ASGi+1 is capable of transmitting the first level signal Vgl from the first level terminal VGL to the respective first node P and signal output terminal Gout of each of shift register units ASGi−1, ASGi and ASGi+1 respectively so that each of shift register units ASGi−1, ASGi and ASGi+1 of the shift register unit group 10 continuously outputs the disable level of the scan signal.

In this manner, by providing the first start unit 31, the first termination unit 32 and the pull-up unit 33 in the pull-down control module 102, the accuracy of the scan signal outputted from each of shift register units ASGi−1, ASGi and ASGi+1 of the shift register unit group 10 to which the pull-down control module 102 belongs can be ensured, thereby improving the accuracy of the scan signal outputted from the entire shift register circuit. The first start unit 31, the first termination unit 32 and the pull-up unit 33 in the pull-down control module 102 may all be composed of an active device or a passive device, which is not specifically limited to the embodiments of the present disclosure.

Figure 37:
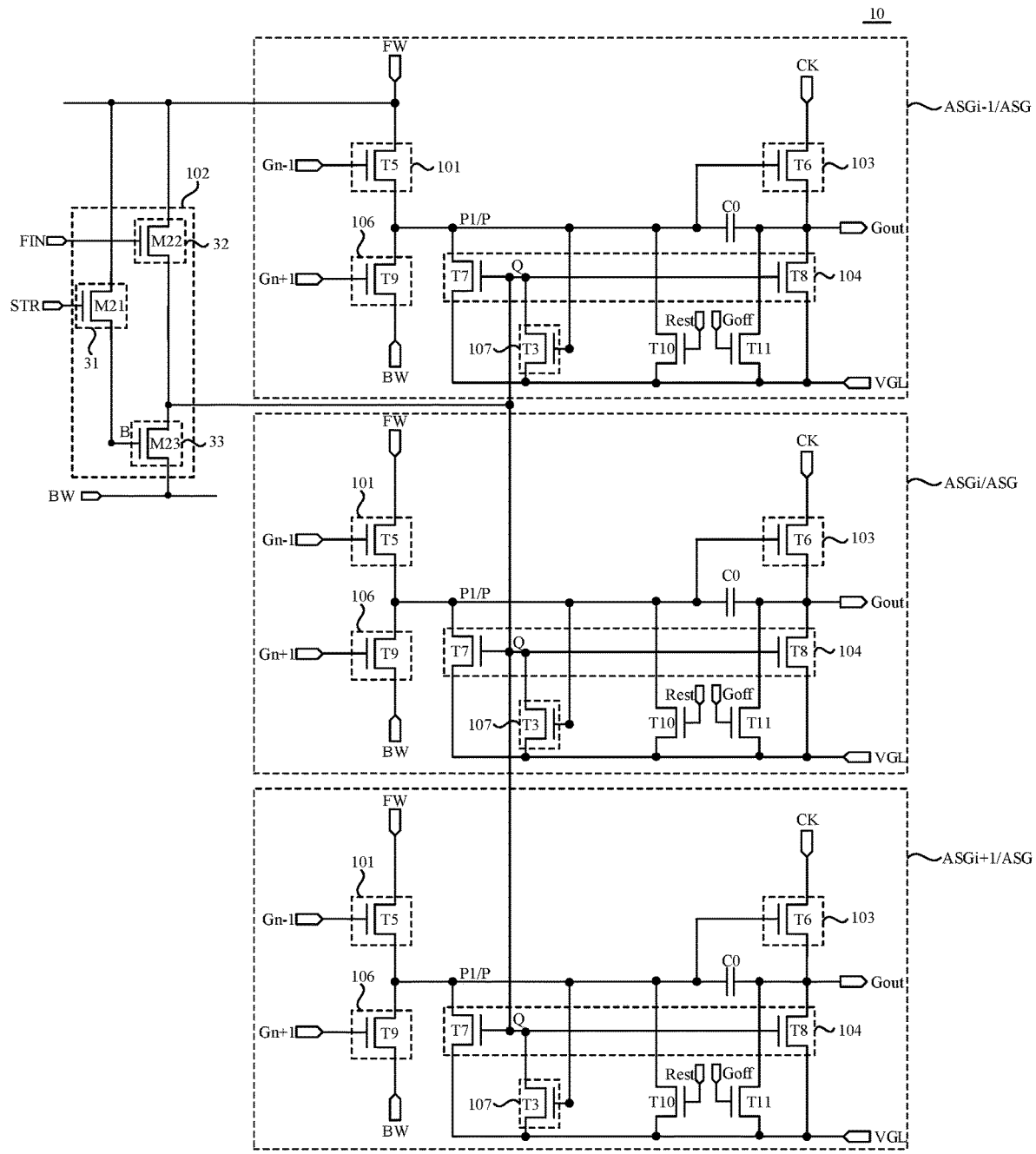
FIG. 37 is a structural schematic diagram of a circuit of another shift register unit group according to an embodiment of the present disclosure.

In an embodiment, FIG. 37 is a structural schematic diagram of a circuit of another shift register unit group according to an embodiment of the present disclosure. As shown in FIG. 37, when the first start unit 31 includes a first start transistor M21, the shift register unit group 10 further includes a start control terminal STR. At this point, the gate of the first start transistor M21 is electrically connected with the start control terminal STR, the first pole of the first start transistor M21 is electrically connected with the signal input terminal FW, and the second pole of the first start transistor M21 is electrically connected with the fourth node B.

In this manner, the start control signal Vstr from the start control terminal STR is capable of controlling the first start transistor M21 to be turned on or off. In the start stage, the start control signal Vstr from the start control terminal STR controls the first start transistor M21 to be turned on, and the first start transistor M21 is capable of transmitting the input signal Fw from the signal input terminal FW to the fourth node B, so that the potential of the fourth node B is sufficient to control the pull-down unit 33 to be turned on. When the start control signal Vstr from the start control terminal STR controls the first start transistor M21 to be turned off, the first start transistor M21 no longer transmits the input signal Fw from the signal input terminal FW to the fourth node B, and when no other signal is transmitted to the fourth node B, the fourth node B remains at a potential written in the previous stage.

In an embodiment, with continued reference to FIG. 37, when the first termination unit 32 includes a first termination transistor M22, the shift register unit group 10 may further include a termination control terminal FIN. At this point, the gate of the first termination transistor M22 is electrically connected with the termination control terminal FIN, the first pole of the first termination transistor M22 is electrically connected with the signal input terminal FW, and the second pole of the first termination transistor M22 is electrically connected with the fourth node B.

In this manner, the termination control signal Vfin from the termination control terminal FIN is capable of controlling the first termination transistor M22 to be turned on or off. In the termination stage, the termination control signal Vfin from the termination control terminal FIN controls the first termination transistor M22 to be turned on, and the first termination transistor M22 is capable of transmitting the input signal Fw from the signal input terminal FW to the second node Q, so that the potential of the second node Q is sufficient to control the pull-down module 104 of each of shift register units ASGi−1, ASGi and ASGi+1 to be turned on. When the termination control signal Vfin from the termination control terminal FIN controls the first termination transistor M22 to be turned off, the first termination transistor M22 no longer transmits the input signal Fw from the signal input terminal FW to the second node Q, and when no other signal is transmitted to the second node Q, the second node Q remains at a potential written in the previous stage.

In an embodiment, with continued reference to FIG. 37, the pull-down unit 33 includes a pull-down transistor M23. The gate of the pull-down transistor M23 is electrically connected with the fourth node B, the first pole of the pull-down transistor M23 is electrically connected with the reset signal terminal BW, and the second pole of the pull-down transistor M23 is electrically connected with the second Node Q. In this manner, the pull-down transistor M23 is capable of transmitting the reset signal from the reset signal terminal BW to the second node Q under the control of the potential of the fourth node B.

Figure 38:
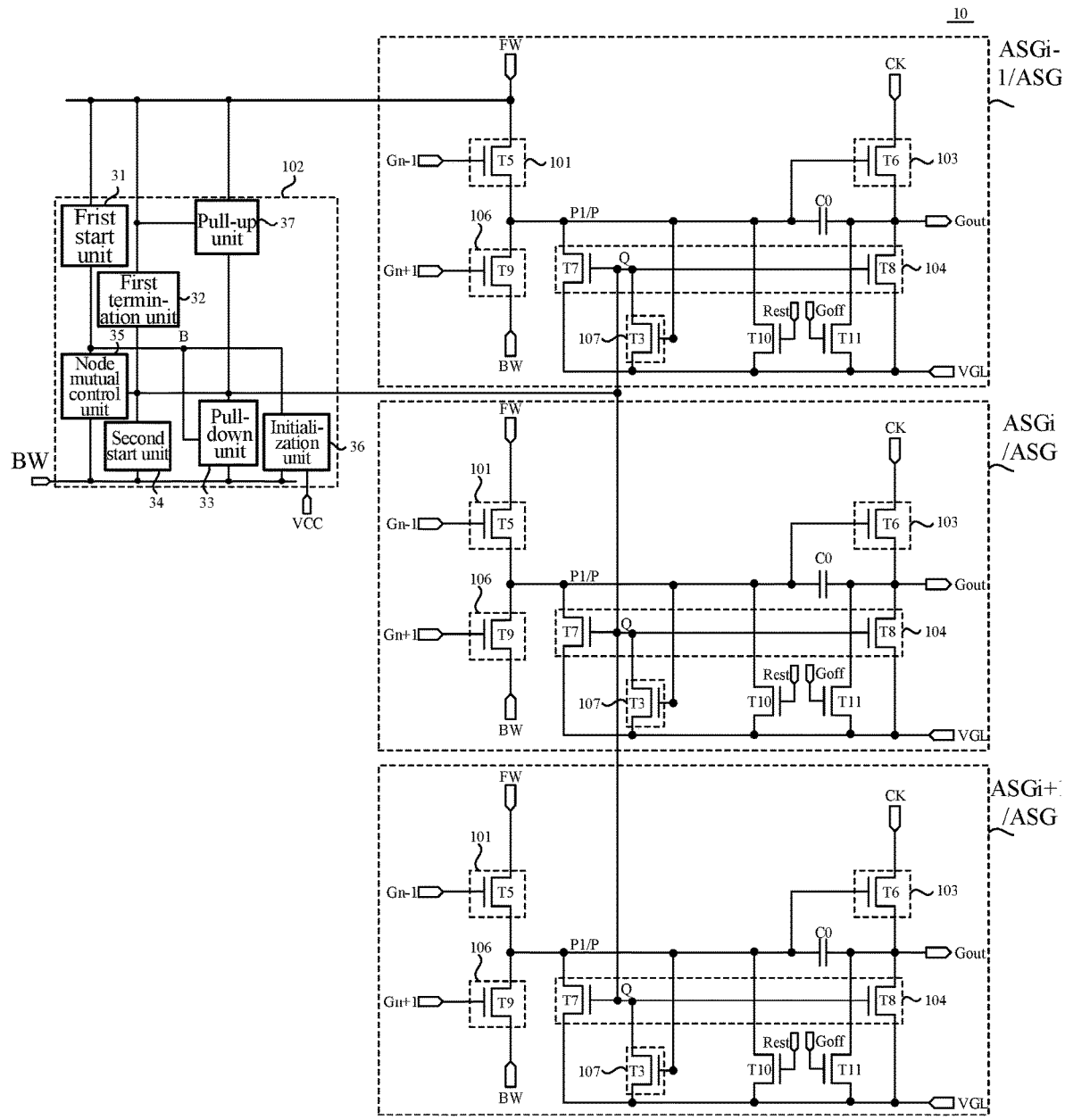
FIG. 38 is a structural schematic diagram of another shift register unit group according to an embodiment of the present disclosure.

On the basis of the above embodiments, optionally, FIG. 38 is a structural schematic diagram of another shift register unit group according to an embodiment of the present disclosure. As shown in FIG. 38, the pull-down control module 102 further includes a second start unit 34. In the same shift register unit group 10, the second start unit 34 is electrically connected with the reset signal terminal BW and the second node Q respectively. The second start unit 34 is used for transmitting the reset signal Bw from the reset signal terminal BW to the second node Q in the start stage. In this manner, in the start stage, the second start unit 34 transmits the reset signal Bw from the reset signal terminal BW to the second node Q to reset the second node Q so that the potential of the second node Q is consistent with the reset signal BW.

Figure 39:
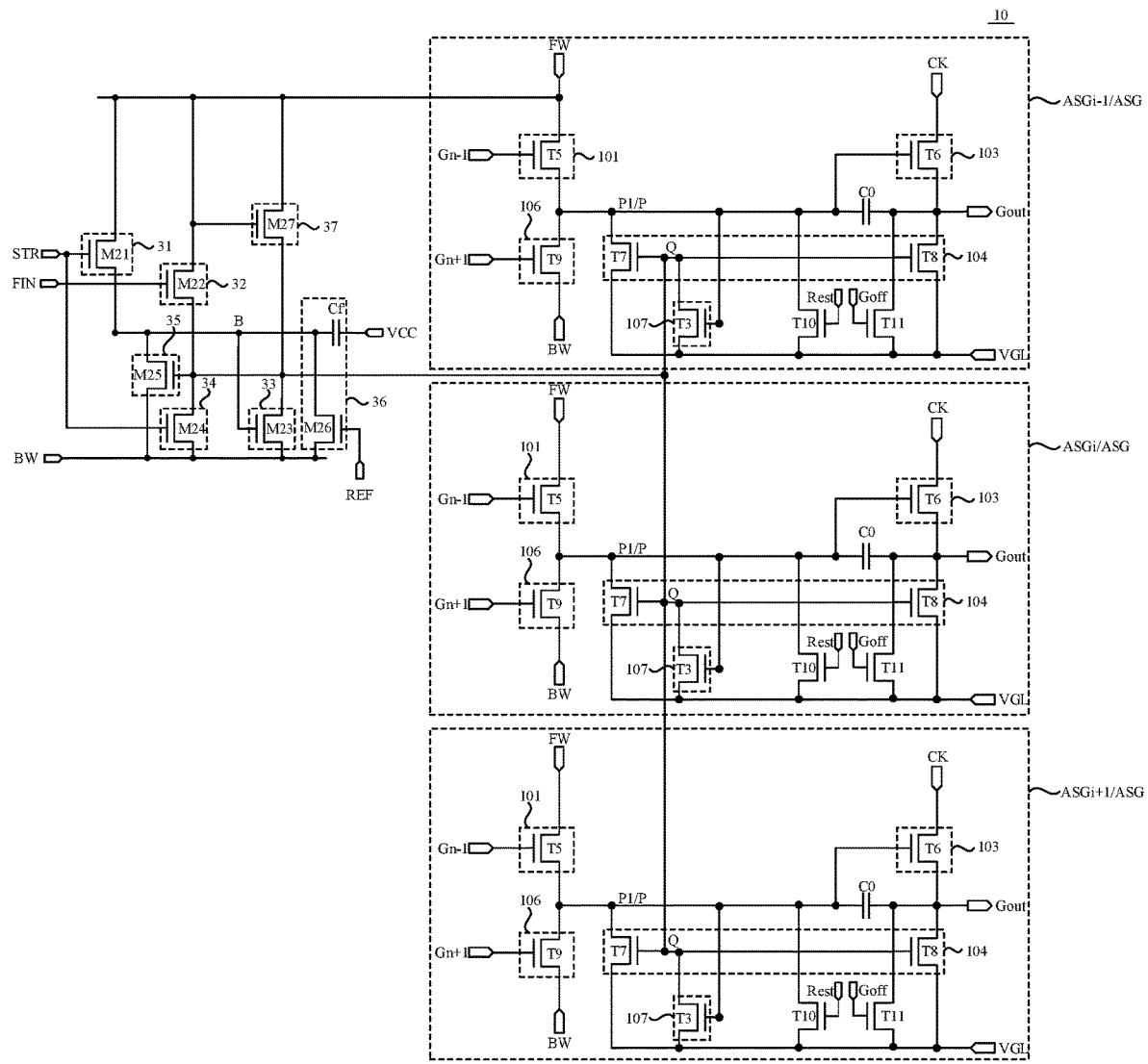
FIG. 39 is a structural schematic diagram of a circuit of another shift register unit group according to an embodiment of the present disclosure.

In an embodiment, FIG. 39 is a structural schematic diagram of a circuit of another shift register unit group according to an embodiment of the present disclosure. As shown in FIG. 39, the second start unit 34 may include a second start transistor M24. The gate of the second start transistor M24 is electrically connected with the start control terminal STR, the first pole of the second start transistor M24 is electrically connected with the reset signal terminal BW, and the second pole of the second start transistor M24 is electrically connected with the second node Q.

In this manner, the start control signal Vstr from the start control terminal STR is capable of controlling the second start transistor M24 to be turned on or off. In the start stage, the start control signal Vstr from the start control terminal STR controls the second start transistor M24 to be turned on, and the second start transistor M24 is capable of transmitting the reset signal Bw from the reset signal terminal BW to the second node Q to reset the second node Q. When the start control signal Vstr from the start control terminal STR controls the second start transistor M24 to be turned off, the second start transistor M24 no longer transmits the input signal Fw from the signal input terminal FW to the second node Q, and when no other signal is transmitted to the second node Q, the second node Q remains at a potential written in the previous stage.

In an embodiment, with continued reference to FIG. 38, the shift register unit group 10 may further include a fixed voltage terminal VCC, and the pull-down control module 102 may further include an initialization unit 36. In the same shift register unit group 10, the initialization unit 36 is electrically connected with the fixed voltage terminal VCC, the reset signal terminal BW and the fourth node B respectively. The initialization unit 36 is used for transmitting the reset signal Bw from the reset signal terminal BW to the fourth node B in the initialization stage and transmitting the fixed voltage signal Vcc from the fixed voltage terminal VCC to the fourth node B in the potential holding stage, where the initialization stage is located before the potential holding stage, and the potential holding stage is located between the start stage and the termination stage.

In an embodiment, in the initialization stage, the initialization unit 36 transmits the reset signal Bw from the reset signal terminal BW to the fourth node B to initialize the fourth node B, so that the potential of the fourth node B is the voltage of the reset signal Bw, so as to prevent the potential of the fourth node B in the previous drive cycle from affecting the drive process of the current drive cycle. After the initialization stage, the circuit enters the potential holding stage, and if no other potential is written to the fourth node B, the initialization unit 36 controls the fixed voltage signal Vcc from the fixed voltage terminal VCC to be transmitted to the fourth node B so that the potential of the fourth node B is consistent with the fixed voltage signal Vcc from the fixed voltage terminal VCC. In this manner, when no other signal is inputted, it can be ensured that the potential of the fourth node B controls the pull-down unit 33 to remain in an on state, which means that the potential of the second node Q in the shift register unit is consistent with the reset signal Bw, thereby ensuring that between the start stage and the termination stage, each of shift register units ASGi−1, ASGi and ASGi+1 can accurately output corresponding scan signals.

In an embodiment, with continued reference to FIG. 39, when the initialization unit 36 includes an initialization transistor M26 and an initialization capacitor Cf, the shift register unit group 10 may further include an initialization control terminal REF. The gate of the initialization transistor M26 is electrically connected with the initialization control terminal REF, the first pole of the initialization transistor M26 is electrically connected with the reset signal terminal BW, and the second pole of the initialization transistor M26 is electrically connected with the fourth node B. The first plate of the initialization capacitor Cf is electrically connected with the fixed voltage terminal VCC, and the second plate of the initialization capacitor Cf is electrically connected with the fourth node B.

In this manner, in the initialization stage, the initialization control signal Vref from the initialization control terminal REF controls the initialization transistor M26 to be turned on so that the reset signal Bw from the reset signal terminal BW is transmitted to the fourth node B through the turned-on initialization transistor M26 to initialize the fourth node B. At this point, the potential at the first plate of the initialization capacitor Cf is consistent with the fixed voltage signal Vcc at the fixed voltage terminal VCC, and the potential at the second plate of the initialization capacitor Cf is consistent with the potential at the reset fourth node B, which means that the potential at the second plate of the initialization capacitor Cf is consistent with the reset signal Bw. In the potential holding stage, the initialization control signal Vref from the initialization control terminal REF controls the initialization transistor M26 to turn off so that the reset signal Bw from the reset signal terminal BW is incapable of being transmitted to the fourth node B, and under the coupling action of the initialization capacitor Cf, the initialization capacitor Cf is capable of coupling the fixed voltage signal Vcc from the fixed voltage terminal VCC that is electrically connected with the first plate of the initialization capacitor Cf to the fourth node B that is electrically connected with the second plate of the initialization capacitor Cf, so that the potential of the fourth node B is consistent with the fixed voltage signal Vcc.

In an embodiment, with continued reference to FIG. 38, the pull-down control module 102 may further include a node mutual control unit 35. In the same shift register unit group 102, the node mutual control unit 35 is electrically connected with the second node Q, the fourth node B and the reset signal terminal BW respectively. The node mutual control unit 35 is used for controlling the reset signal Bw from the reset signal terminal BW to be transmitted to the fourth node B according to the potential of the second node Q.

In this manner, when the potential of the second node Q controls the node mutual control unit 35 to be in an on state, the node mutual control unit 35 is capable of transmitting the reset signal Bw from the reset signal terminal BW to the fourth node B so that the potential of the fourth node B is consistent with the reset signal Bw. At this point, the pull-down unit 33 is turned off under the control of the fourth node B so that the reset signal from the reset signal terminal BW is incapable of being transmitted to the second node Q and thus the second node Q remains at a potential capable of controlling the node mutual control unit 25 to be turned on. On the contrary, when the potential of the second node Q is incapable of controlling the node mutual control unit 35 to be in an on state, the reset signal Bw from the reset signal terminal BW is incapable of being transmitted to the fourth node B so that the potential of the fourth node B is controlled by other units.

In an embodiment, with continued reference to FIG. 39, the node mutual control unit 35 may include a node mutual control transistor M25. The gate of the node mutual control transistor M25 is electrically connected with the second node Q, the first pole of the node mutual control transistor M25 is electrically connected with the reset signal terminal BW, and the second pole of the node mutual control transistor M25 is electrically connected with the fourth node B. In this manner, the node mutual control transistor M25 is capable of being turned on or off under the control of the potential of the second node Q to achieve the function of controlling the potential of the fourth node B based on the potential of the second node B.

In an embodiment, with continued reference to FIG. 38, the pull-down control module 102 may further include a pull-up unit 37. The pull-up unit 37 is electrically connected with the signal input terminal FW and the second node Q respectively, and the pull-up unit 37 is used for controlling the input signal Fw from the input signal terminal FW to be transmitted to the second node Q. In this manner, the magnitude of the potential of the second node Q can be controlled by controlling the pull-up unit 37.

In an embodiment, with continued reference to FIG. 39, the pull-up unit 37 includes a pull-up transistor M27. The gate and the first pole of the pull-up transistor M27 are electrically connected with the signal input terminal FW, and the second pole of the pull-up transistor M27 is electrically connected to the second node Q. In this manner, the pull-up transistor M27 controls the electric quantity for transmitting the input signal Fw from the signal input terminal FW to the second node Q so that the potential of the second node Q can be controlled.

Figure 40:
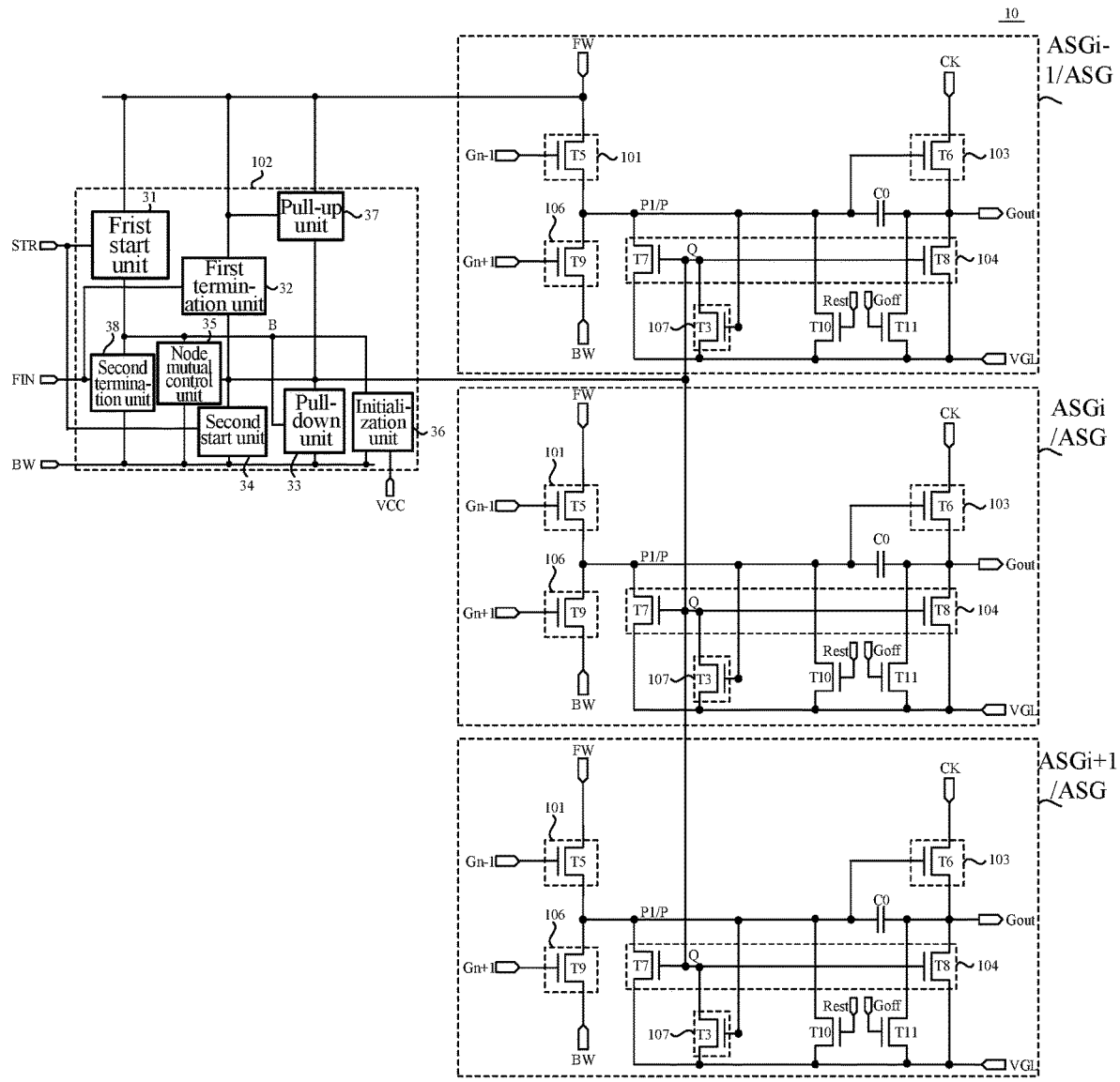
FIG. 40 is a structural schematic diagram of another shift register unit group according to an embodiment of the present disclosure.

In an embodiment, FIG. 40 is a structural schematic diagram of another shift register unit group according to an embodiment of the present disclosure. As shown in FIG. 40, the pull-down control module 102 may further include a second termination unit 38. In the same shift register unit group 10, the second termination unit 38 is electrically connected with the reset signal terminal BW and the fourth node B respectively, and the second termination unit 38 is used for transmitting the reset signal Bw from the reset signal terminal BW to the fourth node B in the termination stage.

In this manner, in the termination stage, the second termination unit 38 transmits the reset signal Bw from the reset signal terminal BW to the fourth node B so that the potential of the fourth node B is incapable of controlling the pull-down unit 33 to be turned on and thus is incapable of transmitting the reset signal Bw from the reset signal terminal BW to the second node Q, and at this point, the second node Q remains the input signal Fw written by the first termination unit 32, ensuring that the potential of the second node Q turns on the pull-down module 104 in each of shift register units ASGi-1, ASGi and ASGi+1 of the shift register unit group 10 and that each of shift register units ASGi-1, ASGi and ASGi+1 keeps outputting the disable level of the scan signal.

Figure 41:
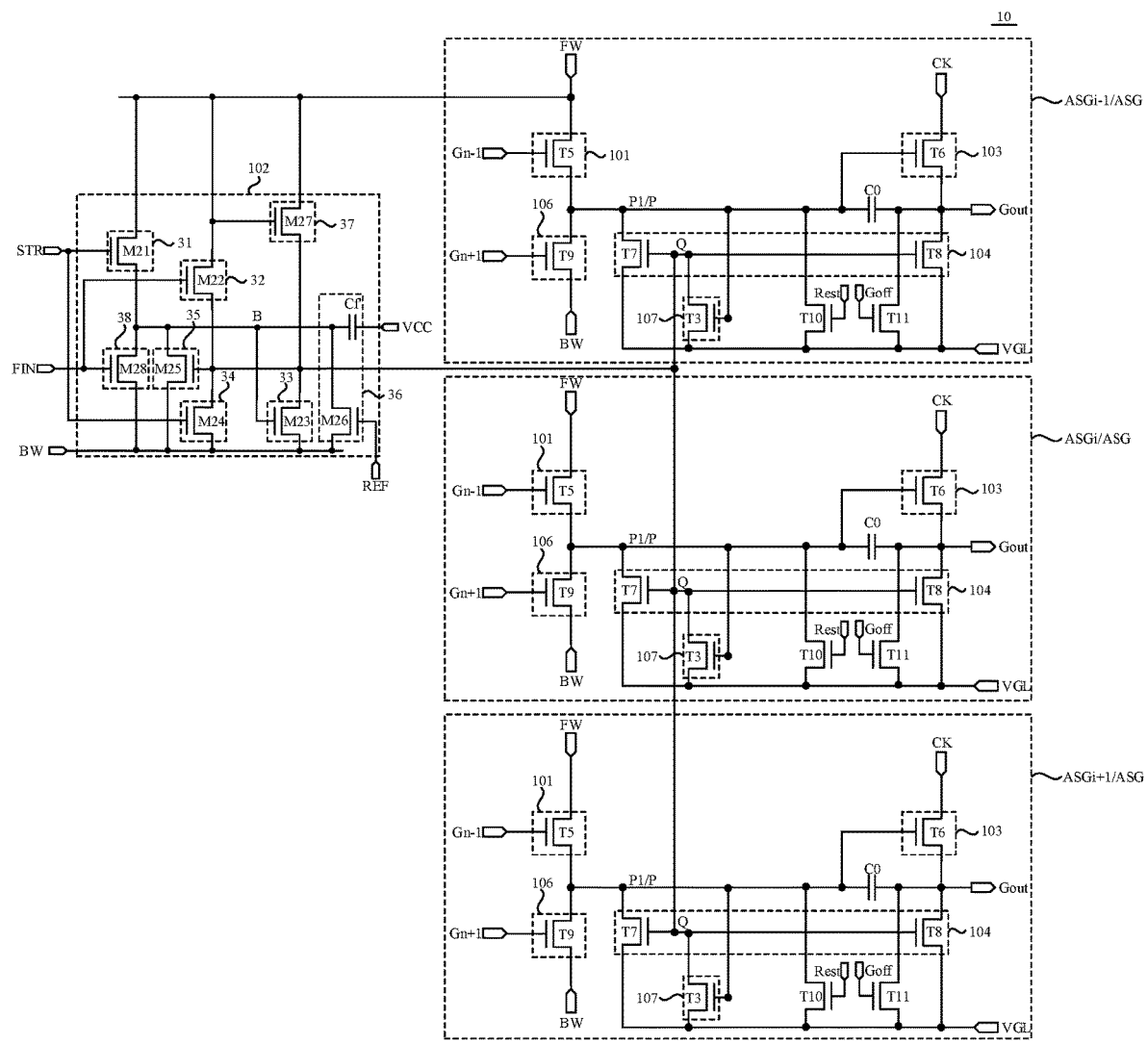
FIG. 41 is a structural schematic diagram of a circuit of another shift register unit group according to an embodiment of the present disclosure.

In an embodiment, FIG. 41 is a structural schematic diagram of a circuit of another shift register unit group according to an embodiment of the present disclosure. As shown in FIG. 41, the second termination unit 38 may include a second termination transistor M28. The gate of the second termination transistor M28 is electrically connected with the termination control terminal FIN, the first pole of the second termination transistor M28 is electrically connected with the reset signal terminal BW, and the second pole of the second termination transistor M28 is electrically connected with the fourth node B.

In this manner, the termination control signal Vfin from the termination control terminal FIN is capable of controlling the second start transistor M28 to be turned on or off. In the start stage, the termination control signal Vfin from the termination control terminal FIN controls the second termination transistor M28 to be turned on, and the second termination transistor M28 is capable of transmitting the rest signal Bw from the reset signal terminal BW to the fourth node B, so that the potential of the fourth node B is incapable of controlling the pull-down unit 33 to be turned on. When the termination control signal Vfin from the termination control terminal FIN controls the second termination transistor M28 to be turned off, the second termination transistor M28 no longer transmits the input signal Fw from the signal input terminal FW to the fourth node B, and when no other signal is transmitted to the fourth node B, the fourth node B remains at a potential written in the previous stage.

Based on the same inventive concept, the embodiments of the present disclosure further provide a display panel. The display panel includes the shift register circuit provided by the embodiments of the present disclosure. Therefore, the display panel has the technical features of the shift register circuit provided by the embodiments of the present disclosure and can achieve the beneficial effects of the shift register circuit provided by the embodiments of the present disclosure, and for similarities, reference may be made to the description of the shift register circuit provided by the embodiments of the present disclosure, which will not be repeated herein.

Figure 42:
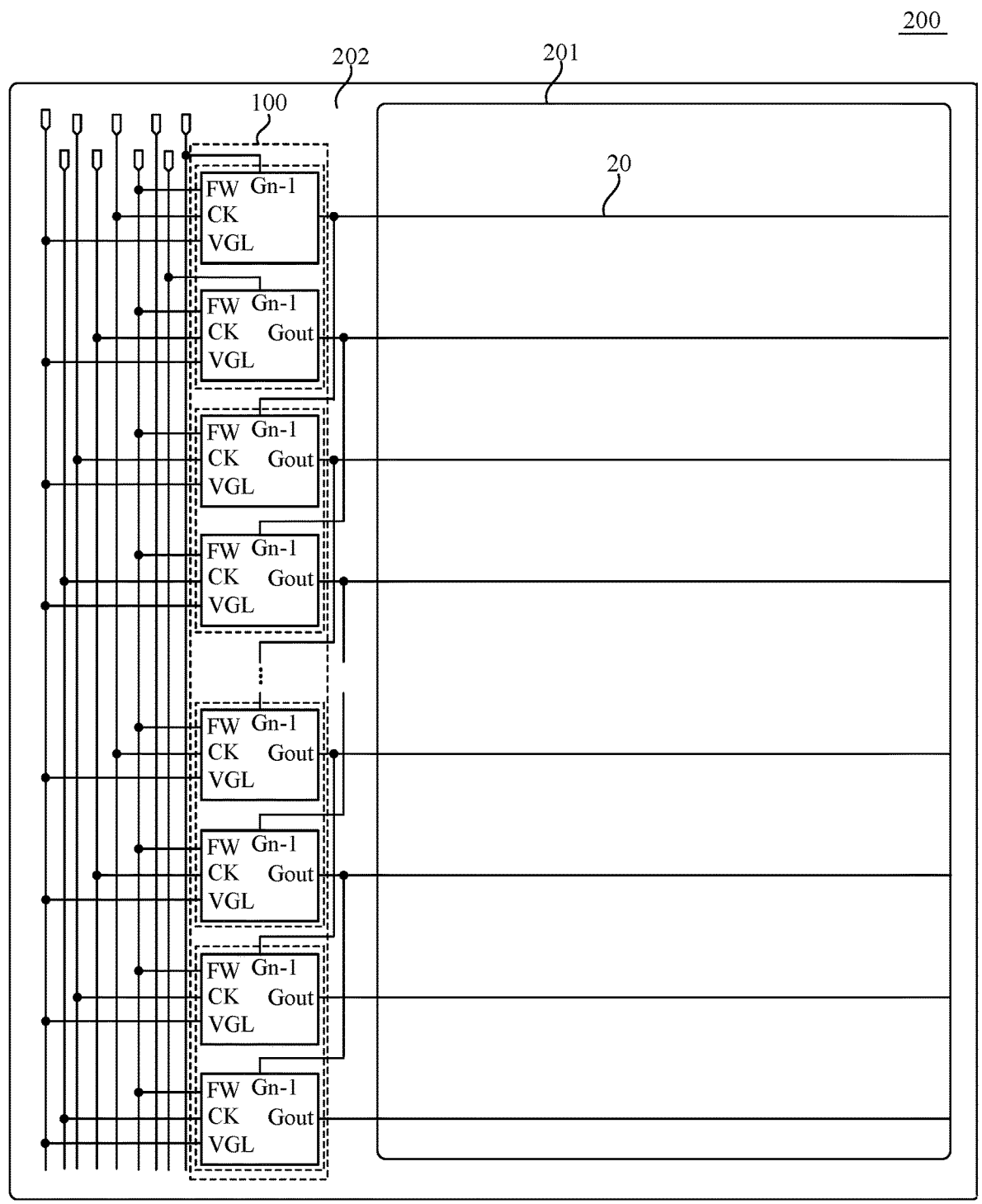
FIG. 42 is a structural schematic diagram of a display panel according to an embodiment of the present disclosure.

In an embodiment, FIG. 42 is a structural schematic diagram of a display panel according to an embodiment of the present disclosure. As shown in FIG. 42, the display panel 200 includes a display area 201 and a non-display area 202. The shift register circuit 100 is provided in the non-display area 202, and the signal output terminals Gout of the shift register units of the shift register circuit 100 are electrically connected with scan signal lines 20 of the display area 201 in one-to-one correspondence to provide the scan signal to each scan signal line 20. In this manner, since the shift register circuit 100 provided by the embodiments of the present disclosure has a small size, the area occupied by the shift register circuit 100 in the non-display area 202 of the display panel 200 is small, which is beneficial to the improvement of the screen-to-body ratio of the display panel 200 and the implementation of the narrow bezel of the display panel 200.

Figure 43:
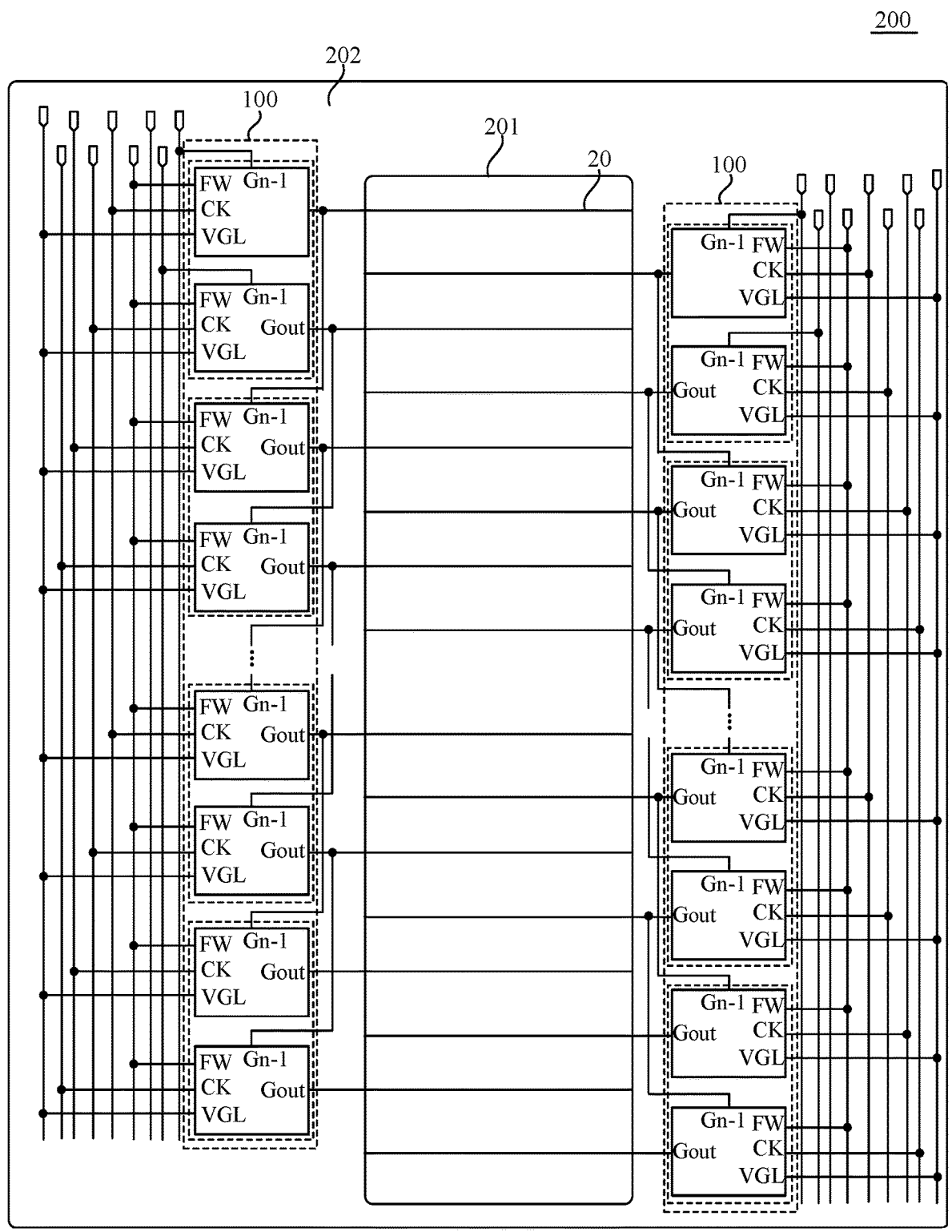
FIG. 43 is a structural schematic diagram of another display panel according to an embodiment of the present disclosure.

It is to be noted that FIG. 42 illustratively shows that the shift register circuit is located on one side of the display area 201, and in the embodiments of the present disclosure, the shift register circuit may be arranged in other manners. For example, as shown in FIG. 43, shift register circuits are provided on two sides of the display area 201, which is beneficial to the improvement of the aesthetics of the display panel.

Based on the above inventive concept, the embodiments of the present disclosure further provide a display device. The display device includes the display panel provided by the embodiments of the present disclosure. Therefore, the display device has the technical features of the display panel provided by the embodiments of the present disclosure and can achieve the beneficial effects of the display panel provided by the embodiments of the present disclosure, and for similarities, reference may be made to the description of the display panel provided by the embodiments of the present disclosure, which will not be repeated herein.

Figure 44:
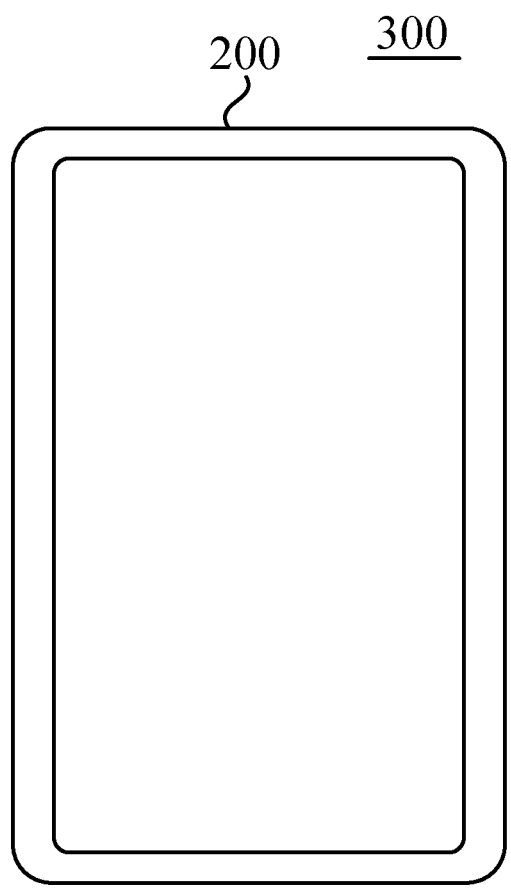
FIG. 44 is a structural schematic diagram of a display device according to an embodiment of the present disclosure.

In an embodiment, FIG. 44 is a structural schematic diagram of a display device according to an embodiment of the present disclosure, and as shown in FIG. 44, the display device 300 includes a display panel 200. The display device 300 provided by the embodiments of the present disclosure may be any electronic product with a display function, including but not limited to: televisions, laptops, desktop displays, tablet computers, digital cameras, smart bracelets, smart glasses, vehicle-mounted displays, medical equipment, industrial control equipment, touch interactive terminals and the like, which is not specially limited to the embodiments of the present disclosure.

It is to be noted that the preceding are preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A shift register circuit, comprising: a plurality of cascaded shift register unit groups;
    wherein each of the plurality of shift register unit groups comprises at least two shift register units, and each of the at least two shift register units comprises a signal input terminal, a scan control terminal, a first level terminal, a clock signal terminal, a signal output terminal, an input module, an output module, a pull-down module and a pull-down control module;
    in a same shift register unit, the input module is electrically connected with the signal input terminal, the scan control terminal and the output module respectively, and the input module and the output module are electrically connected with a first node; the output module is further electrically connected with the signal output terminal and the clock signal terminal respectively; the pull-down module is electrically connected with the first node, the first level terminal, the signal output terminal and the pull-down control module respectively, and the pull-down module and the pull-down control module are electrically connected with a second node; the pull-down control module is used for controlling a potential of the second node according to an input signal from the signal input terminal; the pull-down module is used for controlling a first level signal from the first level terminal to be transmitted to the first node and the signal output terminal according to the potential of the second node; the input module is used for controlling the input signal from the signal input terminal to be transmitted to the first node according to a scan control signal from the scan control terminal; and the output module is used for controlling a clock signal from the clock signal terminal to be transmitted to the signal output terminal according to a potential of the first node;
    in each of the plurality of shift register unit groups, a signal output terminal of each of the at least two shift register units in a shift register unit group of a previous stage is electrically connected with a scan control terminal of each of the at least two shift register units in a shift register unit group of a next stage, and an enable level of a scan signal outputted from each of the at least two shift register units in the shift register unit group of the next stage is located after an enable level of a scan signal outputted from each of the at least two shift register units in the shift register unit group of the previous stage; and
    in a same shift register unit group, a pull-down control module of one of the at least two shift register units also serves as a pull-down control module of each of other shift register units, and a signal output terminal of each of the at least two shift register units sequentially outputs an enable level of a scan signal;
    wherein in each of the plurality of shift register unit groups, at least one of the at least two shift register units further comprises a pull-up control module;
    in the at least one of the at least two shift register units, the pull-up control module is electrically connected with the first node, the first level terminal and the pull-down control module respectively, the pull-up control module and the pull-down control module are electrically connected with a third node, and the pull-up control module is used for controlling the first level signal from the first level terminal to be transmitted to the third node according to the potential of the first node;

the pull-down control module is further used for controlling a scan control signal from the signal input terminal to be transmitted to the second node according to a potential of the third node; and wherein the pull-up control module comprises a fourth transistor; and in the at least one of the at least two shift register units, a gate of the fourth transistor is electrically connected with the first node, a first pole of the fourth transistor is electrically connected with the first level terminal, and a second pole of the fourth transistor is electrically connected with the third node.

2. The shift register circuit according to claim 1, wherein in a clock period, in a same shift register unit group, an enable level of a clock signal from a clock signal terminal of each of the at least two shift register units is sequentially shifted.

3. The shift register circuit according to claim 1, wherein each of the at least two shift register units in each of the plurality of shift register unit groups comprises the pull-up control module.

4. A shift register circuit, comprising: a plurality of cascaded shift register unit groups;

wherein each of the plurality of shift register unit groups comprises at least two shift register units, and each of the at least two shift register units comprises a signal input terminal, a scan control terminal, a first level terminal, a clock signal terminal, a signal output terminal, an input module, an output module, a pull-down module and a pull-down control module;

in a same shift register unit, the input module is electrically connected with the signal input terminal, the scan control terminal and the output module respectively, and the input module and the output module are electrically connected with a first node; the output module is further electrically connected with the signal output terminal and the clock signal terminal respectively; the pull-down module is electrically connected with the first node, the first level terminal, the signal output terminal and the pull-down control module respectively, and the pull-down module and the pull-down control module are electrically connected with a second node; the pull-down control module is used for controlling a potential of the second node according to an input signal from the signal input terminal; the pull-down module is used for controlling a first level signal from the first level terminal to be transmitted to the first node and the signal output terminal according to the potential of the second node; the input module is used for controlling the input signal from the signal input terminal to be transmitted to the first node according to a scan control signal from the scan control terminal; and the output module is used for controlling a clock signal from the clock signal terminal to be transmitted to the signal output terminal according to a potential of the first node;

in each of the plurality of shift register unit groups, a signal output terminal of each of the at least two shift register units in a shift register unit group of a previous stage is electrically connected with a scan control terminal of each of the at least two shift register units in a shift register unit group of a next stage, and an enable level of a scan signal outputted from each of the at least two shift register units in the shift register unit group of the next stage is located after an enable level of a scan signal outputted from each of the at least two shift register units in the shift register unit group of the previous stage; and in a same shift register unit group, a pull-down control module of one of the at least two shift register units also serves as a pull-down control module of each of other shift register units, and a signal output terminal of each of the at least two shift register units sequentially outputs an enable level of a scan signal;

wherein the pull-down control module comprises a first transistor and a second transistor;

in a same shift register unit, a gate and a first pole of the first transistor are electrically connected with the signal input terminal, and a second pole of the first transistor and a gate of the second transistor are electrically connected with a third node; a first pole of the second transistor is electrically connected with the signal input terminal, and a second pole of the second transistor is electrically connected to the second node; and wherein each of the at least two shift register units further comprises a reset signal terminal;

the pull-down control module further comprises a start unit, a termination unit, a pull-down unit and a pull-up control unit;

in a same shift register unit group:

the start unit is electrically connected with the signal input terminal and the termination unit respectively, and the start unit and the termination unit are electrically connected with a fourth node; the start unit is used for controlling the input signal from the signal input terminal to be transmitted to the fourth node in a start stage; and the start stage is located before an enable level of a scan signal outputted from each of the at least two shift register units in the shift register unit group;

the termination unit is further electrically connected with the reset signal terminal; the termination unit is used for controlling a reset signal from the reset signal terminal to be transmitted to the fourth node in a termination stage; and the termination stage is located after the enable level of the scan signal outputted from each of the at least two shift register units in the same shift register unit group;

the pull-up control unit is electrically connected with the third node, the fourth node and the reset signal terminal respectively, and the pull-up control unit is used for controlling the reset signal from the reset signal terminal to be transmitted to the third node according to a potential of the fourth node; and the pull-down unit is electrically connected with the second node, the reset signal terminal and the fourth node respectively, and the pull-down unit is used for controlling the reset signal from the reset signal terminal to be transmitted to the second node according to the potential of the fourth node.

5. The shift register circuit according to claim 4, comprising: a plurality of cascaded shift register unit groups;

wherein each of the plurality of shift register unit groups comprises at least two shift register units, and each of the at least two shift register units comprises a signal input terminal, a scan control terminal, a first level terminal, a clock signal terminal, a signal output terminal, an input module, an output module, a pull-down module and a pull-down control module;

in a same shift register unit, the input module is electrically connected with the signal input terminal, the scan control terminal and the output module respectively, and the input module and the output module are electrically connected with a first node; the output module is further electrically connected with the signal output terminal and the clock signal terminal respectively; the pull-down module is electrically connected with the first node, the first level terminal, the signal output terminal and the pull-down control module respectively, and the pull-down module and the pull-down control module are electrically connected with a second node; the pull-down control module is used for controlling a potential of the second node according to an input signal from the signal input terminal; the pull-down module is used for controlling a first level signal from the first level terminal to be transmitted to the first node and the signal output terminal according to the potential of the second node; the input module is used for controlling the input signal from the signal input terminal to be transmitted to the first node according to a scan control signal from the scan control terminal; and the output module is used for controlling a clock signal from the clock signal terminal to be transmitted to the signal output terminal according to a potential of the first node;

in each of the plurality of shift register unit groups, a signal output terminal of each of the at least two shift register units in a shift register unit group of a previous stage is electrically connected with a scan control terminal of each of the at least two shift register units in a shift register unit group of a next stage, and an enable level of a scan signal outputted from each of the at least two shift register units in the shift register unit group of the next stage is located after an enable level of a scan signal outputted from each of the at least two shift register units in the shift register unit group of the previous stage; and in a same shift register unit group, a pull-down control module of one of the at least two shift register units also serves as a pull-down control module of each of other shift register units, and a signal output terminal of each of the at least two shift register units sequentially outputs an enable level of a scan signal;

wherein each of the plurality of shift register unit groups further comprises a start control terminal;

the start unit comprises a start transistor; a gate of the start transistor is electrically connected with the start control terminal, a first pole of the start transistor is electrically connected with the signal input terminal, and a second pole of the start transistor is electrically connected with the fourth node;

wherein each of the plurality of shift register unit groups further comprises a termination control terminal; and the termination unit comprises a termination transistor; a gate of the termination transistor is electrically connected with the termination control terminal, a first pole of the termination transistor is electrically connected with the reset signal terminal, and a second pole of the termination transistor is electrically connected with the fourth node; and wherein the pull-up control unit comprises a pull-up control transistor; and a gate of the pull-up control transistor is electrically connected with the fourth node, a first pole of the pull-up control transistor is electrically connected with the reset signal terminal, and a second pole of the pull-up control transistor is electrically connected with the third node.

6. The shift register circuit according to claim 1, wherein each of the at least two shift register units further comprises a reset signal terminal;

the pull-down control module further comprises a first start unit, a first termination unit and a pull-down unit;

in a same shift register unit group:

the first start unit is electrically connected with the signal input terminal and the pull-down unit respectively, and the first start unit and the pull-down unit are electrically connected with a fourth node; the first start unit is used for controlling the input signal from the signal input terminal to be transmitted to a fourth node in the start stage; and the start stage is located before an enable level of a scan signal outputted from each of the at least two shift register units in the same shift register unit group;

the first termination unit is further electrically connected with the signal input terminal and the second node respectively; the first termination unit is used for controlling the input signal from the signal input terminal to be transmitted to the second node in the termination stage; and the termination stage is located after the enable level of the scan signal outputted from each of the at least two shift register units in the same shift register unit group; and the pull-down unit is further electrically connected with the reset signal terminal and the second node respectively, and the pull-down unit is used for controlling the reset signal from the reset signal terminal to be transmitted to the second node according to a potential of the fourth node.

7. The shift register circuit according to claim 6, wherein each of the plurality of shift register unit groups further comprises a start control terminal; and the first start unit comprises a first start transistor; a gate of the first start transistor is electrically connected with the start control terminal, a first pole of the first start transistor is electrically connected with the signal input terminal, and a second pole of the first start transistor is electrically connected with the fourth node; or wherein each of the plurality of shift register unit groups further comprises a termination control terminal; and the first termination unit comprises a first termination transistor; a gate of the first termination transistor is electrically connected with the termination control terminal, a first pole of the first termination transistor is electrically connected with the signal input terminal, and a second pole of the first termination transistor is electrically connected with the second node.

8. The shift register circuit according to claim 6, wherein the pull-down control module further comprises a second start unit;

in a same shift register unit group, the second start unit is electrically connected with the reset signal terminal and the second node respectively, and the second start unit is used for transmitting the reset signal from the reset signal terminal to the second node in the start stage; and each of the plurality of shift register unit groups further comprises a start control terminal; and the second start unit comprises a second start transistor; a gate of the second start transistor is electrically connected with the start control terminal, a first pole of the second start transistor is electrically connected with the reset signal terminal, and a second pole of the second start transistor is electrically connected with the second node.

9. The shift register circuit according to claim 6, wherein the pull-down control module further comprises a second termination unit;

in a same shift register unit group, the second termination unit is electrically connected with the reset signal terminal and the fourth node respectively, and the second termination unit is used for transmitting the reset signal from the reset signal terminal to the fourth node in the termination stage; and wherein each of the plurality of shift register unit groups further comprises a termination control terminal; and the second termination unit comprises a second termination transistor; a gate of the second termination transistor is electrically connected with the termination control terminal, a first pole of the second termination transistor is electrically connected with the reset signal terminal, and a second pole of the second termination transistor is electrically connected with the fourth node.

10. The shift register circuit according to claim 6, wherein the pull-down control module further comprises a pull-up unit;

the pull-up unit is electrically connected with the signal input terminal and the second node respectively, and the pull-up unit is used for controlling the input signal from the input signal terminal to be transmitted to the second node; and wherein the pull-up unit comprises a pull-up transistor; and a gate and a first pole of the pull-up transistor are electrically connected with the signal input terminal, and a second pole of the pull-up transistor is electrically connected to the second node.

11. The shift register circuit according to claim 4, wherein each of the plurality of shift register unit groups further comprises a fixed voltage terminal and an initialization control terminal;

the pull-down control unit further comprises an initialization module; and in a same shift register unit group, the initialization unit is electrically connected with the fixed voltage terminal, the reset signal terminal and the fourth node respectively, and the initialization unit is used for transmitting the reset signal from the reset signal terminal to the fourth node in an initialization stage and transmitting a fixed voltage signal from the fixed voltage terminal to the fourth node in a potential holding stage;

wherein the initialization stage is located before the potential holding stage, and the potential holding stage is located between the start stage and the termination stage; and wherein wherein the initialization unit comprises an initialization transistor and an initialization capacitor;

a gate pole of the initialization transistor is electrically connected with the initialization control terminal, a first pole of the initialization transistor is electrically connected with the reset signal terminal, and a second pole of the initialization transistor is electrically connected with the fourth node; and a first plate of the initialization capacitor is electrically connected with the fixed voltage terminal, and a second plate of the initialization capacitor is electrically connected with the fourth node.

12. The shift register circuit according to claim 4, wherein the pull-down control module further comprises a node mutual control unit and the node mutual control unit comprises a node mutual control transistor; and in a same shift register unit group, the node mutual control unit is electrically connected with the second node, the fourth node and the reset signal terminal respectively, and the node mutual control unit is used for controlling the reset signal from the reset signal terminal to be transmitted to the fourth node according to the potential of the second node; and wherein a gate of the node mutual control transistor is electrically connected with the second node, a first pole of the node mutual control transistor is electrically connected with the reset signal terminal, and a second pole of the node mutual control transistor is electrically connected with the fourth node.

13. A shift register circuit, comprising: a plurality of cascaded shift register unit groups;

wherein each of the plurality of shift register unit groups comprises at least two shift register units, and each of the at least two shift register units comprises a signal input terminal, a scan control terminal, a first level terminal, a clock signal terminal, a signal output terminal, an input module, an output module, a pull-down module and a pull-down control module;

in a same shift register unit, the input module is electrically connected with the signal input terminal, the scan control terminal and the output module respectively, and the input module and the output module are electrically connected with a first node; the output module is further electrically connected with the signal output terminal and the clock signal terminal respectively; the pull-down module is electrically connected with the first node, the first level terminal, the signal output terminal and the pull-down control module respectively, and the pull-down module and the pull-down control module are electrically connected with a second node; the pull-down control module is used for controlling a potential of the second node according to an input signal from the signal input terminal; the pull-down module is used for controlling a first level signal from the first level terminal to be transmitted to the first node and the signal output terminal according to the potential of the second node; the input module is used for controlling the input signal from the signal input terminal to be transmitted to the first node according to a scan control signal from the scan control terminal; and the output module is used for controlling a clock signal from the clock signal terminal to be transmitted to the signal output terminal according to a potential of the first node;

in each of the plurality of shift register unit groups, a signal output terminal of each of the at least two shift register units in a shift register unit group of a previous stage is electrically connected with a scan control terminal of each of the at least two shift register units in a shift register unit group of a next stage, and an enable level of a scan signal outputted from each of the at least two shift register units in the shift register unit group of the next stage is located after an enable level of a scan signal outputted from each of the at least two shift register units in the shift register unit group of the previous stage; and in a same shift register unit group, a pull-down control module of one of the at least two shift register units also serves as a pull-down control module of each of other shift register units, and a signal output terminal of each of the at least two shift register units sequentially outputs an enable level of a scan signal;

wherein at least one of the at least two shift register units in a same shift register unit group further comprises a pull-up module;

in the at least one of the at least two shift register units, the pull-up module is electrically connected with the first level terminal, the first node and the second node respectively, and the pull-up module is used for controlling the first level signal from the first level terminal to be transmitted to the second node according to the potential of the first node; and wherein each of the at least two shift register units further comprises a reset module, a rest signal terminal and a reset control terminal; and in a same shift register unit, the reset module is electrically connected with the reset signal terminal, the reset control terminal and the first node respectively, and the reset module is used for transmitting the reset signal from the reset signal terminal to the first node under a control of the reset control signal from the reset control terminal;

wherein in each of the plurality of shift register unit groups, a reset control terminal of each of at least two shift register units in a shift register unit group of a previous stage is electrically connected with a signal output terminal of each of the at least two shift register units in a shift register unit group of a next stage.

14. The shift register circuit according to claim 13, wherein in a same shift register unit group, a reset control terminal of one of the at least two shift register units also serves as a reset control terminal of each of other shift register units of the at least two shift register units;

wherein each of the at least two shift register units in each of the plurality of shift register unit groups comprises a first shift register unit; and a reset control terminal of each of at least two shift register units in a shift register unit group of a previous stage is electrically connected with a signal output terminal of a first shift register unit in a shift register unit group of a next stage; and wherein in a same shift register group, an enable level of a scan signal outputted from the first shift register unit is located before an enable level of a scan signal outputted from each of other shift register units.

15. The shift register circuit according to claim 13, wherein in a same shift register unit group, a pull-up module of one of the at least two shift register units also serves as a pull-up module of each of other shift register units; and wherein in a same shift register unit group, a scan control terminal of one of the at least two shift register units also serves as a scan control terminal of each of other shift register units.

16. The shift register circuit according to claim 15, wherein each of the at least two shift register units in each of the plurality of shift register unit groups comprises a second shift register unit;

a scan control terminal of each of at least two shift register units in a shift register unit group of a next stage is electrically connected with a signal output terminal of a second shift register unit in a shift register unit group of a previous stage;

in a same shift register group, an enable level of a scan signal outputted from the second shift register unit is located after an enable level of a scan signal outputted from each of other shift register units; and wherein in a same shift register unit group, the pull-up module and the pull-down module are located in different shift register units of the same shift register unit group respectively.

17. The shift register circuit according to claim 1, wherein in a same shift register unit group, the pull-down control module is located in the first shift register units;

in a same shift register unit group, each of other shift register units other than the first shift register unit comprises a compensation module; and in a same shift register unit group, the compensation module is electrically connected to at least one of the first node or the second node; and wherein the compensation module comprises at least one compensation capacitor; and in a same shift register unit, a first plate of each of the at least one compensation capacitor is electrically connected with the first node, and a second plate of each of the at least one compensation capacitor is electrically connected with the first level terminal and/or the second node.

18. The shift register circuit according to claim 17, wherein the compensation module comprises at least one compensation transistor; and in a same shift register unit, a gate of each of the at least one compensation transistor is electrically connected with the first node, and a first plate and a second plate of each of the at least one compensation transistor are electrically connected with the first level terminal and/or the second node.

19. The shift register circuit according to claim 18, further comprising: a semiconductor layer, and a first metal layer and a second metal layer that are located on two sides of the semiconductor layer;

wherein the semiconductor layer comprises an active layer of each of the at least one compensation transistor, the first metal layer comprises the gate of each of the at least one compensation transistor, and the second metal layer comprises the first pole and the second pole of each of the at least one compensation transistor.

20. A display panel, comprising the shift register circuit according to claim 1.

21. A display device, comprising a display panel, wherein the display panel comprises the shift register circuit according to claim 1.

22. The shift register circuit according to claim 13, wherein in a clock period, in a same shift register unit group, an enable level of a clock signal from a clock signal terminal of each of the at least two shift register units is sequentially shifted.

* * * * *